United States Patent
Gupta et al.

(10) Patent No.: US 12,550,702 B2
(45) Date of Patent: Feb. 10, 2026

(54) III-NITRIDE DEVICES WITH THROUGH-VIA STRUCTURES

(71) Applicant: Transphorm Technology, Inc., Goleta, CA (US)

(72) Inventors: Geetak Gupta, Goleta, CA (US); Umesh Mishra, Montecito, CA (US); Davide Bisi, Goleta, CA (US); David Michael Rhodes, Santa Barbara, CA (US); Rakesh K. Lal, Isla Vista, CA (US); Carl Joseph Neufeld, Goleta, CA (US)

(73) Assignee: Transphorm Technology, Inc., Goleta, CA (US)

( * ) Notice: Subject to any disclaimer, the term of this patent is extended or adjusted under 35 U.S.C. 154(b) by 248 days.

(21) Appl. No.: 18/027,432

(22) PCT Filed: Sep. 17, 2021

(86) PCT No.: PCT/US2021/050981
§ 371 (c)(1),
(2) Date: Mar. 21, 2023

(87) PCT Pub. No.: WO2022/061181
PCT Pub. Date: Mar. 24, 2022

(65) Prior Publication Data
US 2023/0335464 A1  Oct. 19, 2023

Related U.S. Application Data

(60) Provisional application No. 63/081,268, filed on Sep. 21, 2020.

(51) Int. Cl.
*H01L 23/48* (2006.01)
*H10D 30/01* (2025.01)
(Continued)

(52) U.S. Cl.
CPC .......... *H10W 20/20* (2026.01); *H10D 30/015* (2025.01); *H10D 30/475* (2025.01);
(Continued)

(58) Field of Classification Search
CPC ............. H01L 23/481; H01L 21/76898; H01L 23/5286; H10D 62/8503; H10D 64/01;
(Continued)

(56) References Cited

U.S. PATENT DOCUMENTS 7,795,642 B2  9/2010  Suh et al.
7,851,825 B2  12/2010  Suh et al.
(Continued)

FOREIGN PATENT DOCUMENTS

JP  2009-016780 A  1/2009
JP  2011-108813 A  6/2011
(Continued)

OTHER PUBLICATIONS

Barr et al., "High Voltage GaN Switch Reliability," WIPDA Conference, Atlanta, GA, Nov. 2018, 7 pages.
(Continued)

*Primary Examiner* — Victor A Mandala
*Assistant Examiner* — Colleen E Snow
(74) *Attorney, Agent, or Firm* — Fish & Richardson P.C.

(57) ABSTRACT

A semiconductor device comprises a III-N device including an insulating substrate. The insulating substrate includes a first side and a second side. The device further includes a III-N material structure on a first side of the insulating substrate, and a gate electrode, a source electrode, and a drain electrode on a side of the III-N material structure opposite the substrate. A backmetal layer on the second side of the insulating substrate, and a via hole is formed through the III-N material structure and the insulating substrate. A metal formed in the via-hole is electrically connected to the
(Continued)

drain electrode on the first side of the substrate and electrically connected to the backmetal layer on the second side of the substrate.

27 Claims, 51 Drawing Sheets

(51) Int. Cl.
  *H10D 30/47* (2025.01)
  *H10D 62/85* (2025.01)
  *H10D 64/01* (2025.01)
  *H10D 64/23* (2025.01)
  *H10D 84/05* (2025.01)
  *H10D 84/86* (2025.01)
  *H10W 20/00* (2026.01)
  *H10W 20/20* (2026.01)
  *H10W 20/41* (2026.01)

(52) U.S. Cl.
  CPC ......... *H10D 62/8503* (2025.01); *H10D 64/01* (2025.01); *H10D 64/254* (2025.01); *H10D 84/05* (2025.01); *H10D 84/86* (2025.01); *H10W 20/023* (2026.01); *H10W 20/427* (2026.01)

(58) Field of Classification Search
  CPC .... H10D 30/015; H10D 84/86; H10D 64/254; H10D 84/05; H10D 30/475
  See application file for complete search history.

(56) References Cited

U.S. PATENT DOCUMENTS

| | | | |
|---|---|---|---|
| 7,875,907 B2 | 1/2011 | Honea et al. |
| 7,884,394 B2 | 2/2011 | Wu et al. |
| 7,898,004 B2 | 3/2011 | Wu et al. |
| 7,915,643 B2 | 3/2011 | Suh et al. |
| 7,939,391 B2 | 5/2011 | Suh et al. |
| 7,965,126 B2 | 6/2011 | Honea et al. |
| 8,138,529 B2 | 3/2012 | Wu |
| 8,193,562 B2 | 6/2012 | Suh et al. |
| 8,237,198 B2 | 8/2012 | Wu et al. |
| 8,289,065 B2 | 10/2012 | Honea et al. |
| 8,344,424 B2 | 1/2013 | Suh et al. |
| 8,389,977 B2 | 3/2013 | Chu et al. |
| 8,390,000 B2 | 3/2013 | Chu et al. |
| 8,431,965 B2 | 4/2013 | Takemae |
| 8,455,931 B2 | 6/2013 | Wu |
| 8,493,129 B2 | 7/2013 | Honea et al. |
| 8,508,281 B2 | 8/2013 | Honea et al. |
| 8,519,438 B2 | 8/2013 | Mishra et al. |
| 8,530,996 B2 | 9/2013 | Shono |
| 8,531,232 B2 | 9/2013 | Honea et al. |
| 8,536,622 B2 | 9/2013 | Takemae et al. |
| 8,541,815 B2 | 9/2013 | Takemae et al. |
| 8,541,818 B2 | 9/2013 | Wu et al. |
| 8,569,124 B2 | 10/2013 | Akiyama et al. |
| 8,581,300 B2 | 11/2013 | Yamada |
| 8,592,974 B2 | 11/2013 | Wu |
| 8,598,937 B2 | 12/2013 | Lal et al. |
| 8,603,880 B2 | 12/2013 | Yamada |
| 8,624,662 B2 | 1/2014 | Parikh et al. |
| 8,633,517 B2 | 1/2014 | Kamada |
| 8,633,518 B2 | 1/2014 | Suh et al. |
| 8,643,062 B2 | 2/2014 | Parikh et al. |
| 8,648,643 B2 | 2/2014 | Wu |
| 8,664,927 B2 | 3/2014 | Shono |
| 8,675,326 B2 | 3/2014 | Shono |
| 8,692,294 B2 | 4/2014 | Chu et al. |
| 8,716,141 B2 | 5/2014 | Dora et al. |
| 8,742,459 B2 | 6/2014 | Mishra et al. |
| 8,742,460 B2 | 6/2014 | Mishra et al. |
| 8,766,711 B2 | 7/2014 | Takemae |
| 8,772,842 B2 | 7/2014 | Dora |
| 8,773,176 B2 | 7/2014 | Miyazaki et al. |
| 8,786,327 B2 | 7/2014 | Honea et al. |
| 8,803,246 B2 | 8/2014 | Wu et al. |
| 8,816,497 B2 | 8/2014 | Wu |
| 8,816,751 B2 | 8/2014 | Honea et al. |
| 8,836,301 B2 | 9/2014 | Shono |
| 8,836,308 B2 | 9/2014 | Shono |
| 8,836,380 B2 | 9/2014 | Takemae |
| 8,841,702 B2 | 9/2014 | Mishra et al. |
| 8,847,283 B2 | 9/2014 | Kamada et al. |
| 8,860,495 B2 | 10/2014 | Lal et al. |
| 8,878,248 B2 | 11/2014 | Ishiguro et al. |
| 8,878,571 B2 | 11/2014 | Takemae |
| 8,883,581 B2 | 11/2014 | Ohki |
| 8,890,206 B2 | 11/2014 | Yamada |
| 8,890,314 B2 | 11/2014 | Wu |
| 8,895,421 B2 | 11/2014 | Parikh et al. |
| 8,895,423 B2 | 11/2014 | Dora |
| 8,901,604 B2 | 12/2014 | Mishra et al. |
| 8,912,839 B2 | 12/2014 | Honea et al. |
| 8,933,489 B2 | 1/2015 | Kikkawa |
| 8,952,750 B2 | 2/2015 | Wu |
| 8,957,453 B2 | 2/2015 | Yamada et al. |
| 8,962,409 B2 | 2/2015 | Tomabechi |
| 9,006,787 B2 | 4/2015 | Yamada |
| 9,035,356 B2 | 5/2015 | Yamada |
| 9,041,435 B2 | 5/2015 | Honea et al. |
| 9,041,465 B2 | 5/2015 | Bouisse |
| 9,059,076 B2 | 6/2015 | Wu et al. |
| 9,059,136 B2 | 6/2015 | Kamada et al. |
| 9,087,718 B2 | 7/2015 | Lal |
| 9,093,366 B2 | 7/2015 | Mishra et al. |
| 9,099,351 B2 | 8/2015 | Nishimori et al. |
| 9,099,545 B2 | 8/2015 | Akiyama et al. |
| 9,111,961 B2 | 8/2015 | Chu et al. |
| 9,136,107 B2 | 9/2015 | Katani et al. |
| 9,142,638 B2 | 9/2015 | Yamada |
| 9,142,658 B2 | 9/2015 | Kikkawa et al. |
| 9,147,760 B2 | 9/2015 | Mishra et al. |
| 9,165,766 B2 | 10/2015 | Keller et al. |
| 9,171,730 B2 | 10/2015 | Chowdhury et al. |
| 9,171,836 B2 | 10/2015 | Lal et al. |
| 9,171,910 B2 | 10/2015 | Wu et al. |
| 9,184,275 B2 | 11/2015 | Mishra et al. |
| 9,190,295 B2 | 11/2015 | Wu |
| 9,196,716 B2 | 11/2015 | Mishra et al. |
| 9,209,176 B2 | 12/2015 | Wu et al. |
| 9,224,671 B2 | 12/2015 | Parikh et al. |
| 9,224,721 B2 | 12/2015 | Wu |
| 9,224,805 B2 | 12/2015 | Mishra et al. |
| 9,231,075 B2 | 1/2016 | Yamada |
| 9,244,848 B2 | 1/2016 | Boyd et al. |
| 9,245,992 B2 | 1/2016 | Keller et al. |
| 9,245,993 B2 | 1/2016 | Keller et al. |
| 9,257,547 B2 | 2/2016 | Fichtenbaum et al. |
| 9,293,458 B2 | 3/2016 | Parikh et al. |
| 9,293,561 B2 | 3/2016 | Mishra et al. |
| 9,299,822 B2 | 3/2016 | Kikkawa |
| 9,318,593 B2 | 4/2016 | Wu et al. |
| 9,343,560 B2 | 5/2016 | Suh et al. |
| 9,349,805 B2 | 5/2016 | Ito et al. |
| 9,362,903 B2 | 6/2016 | Wu et al. |
| 9,373,699 B2 | 6/2016 | Chu et al. |
| 9,401,341 B2 | 7/2016 | Wu |
| 9,425,268 B2 | 8/2016 | Minoura et al. |
| 9,437,707 B2 | 9/2016 | Mishra et al. |
| 9,437,708 B2 | 9/2016 | Mishra et al. |
| 9,443,849 B2 | 9/2016 | Wu et al. |
| 9,443,938 B2 | 9/2016 | Mishra et al. |
| 9,490,324 B2 | 11/2016 | Mishra et al. |
| 9,496,137 B2 | 11/2016 | Chu et al. |
| 9,520,491 B2 | 12/2016 | Chowdhury et al. |
| 9,536,966 B2 | 1/2017 | Ogino |
| 9,536,967 B2 | 1/2017 | Kikkawa et al. |
| 9,537,425 B2 | 1/2017 | Honea |
| 9,543,940 B2 | 1/2017 | Wang et al. |
| 9,590,060 B2 | 3/2017 | Lal |
| 9,590,494 B1 | 3/2017 | Zhou et al. |

(56) References Cited

U.S. PATENT DOCUMENTS

| | | |
|---|---|---|
| 9,620,616 B2 | 4/2017 | Yamada et al. |
| 9,634,100 B2 | 4/2017 | Mishra et al. |
| 9,640,648 B2 | 5/2017 | Kikkawa |
| 9,660,640 B2 | 5/2017 | Wang et al. |
| 9,685,323 B2 | 6/2017 | Keller et al. |
| 9,685,338 B2 | 6/2017 | Minoura et al. |
| 9,690,314 B2 | 6/2017 | Honea et al. |
| 9,741,702 B2 | 8/2017 | Wu |
| 9,818,686 B2 | 11/2017 | Wu et al. |
| 9,818,840 B2 | 11/2017 | Kikkawa |
| 9,831,315 B2 | 11/2017 | Chu et al. |
| 9,842,922 B2 | 12/2017 | Mishra et al. |
| 9,865,719 B2 | 1/2018 | Keller et al. |
| 9,899,998 B2 | 2/2018 | Honea et al. |
| 9,935,190 B2 | 4/2018 | Wu et al. |
| 9,941,399 B2 | 4/2018 | Mishra et al. |
| 9,991,884 B2 | 6/2018 | Wang et al. |
| 10,043,896 B2 | 8/2018 | Mishra et al. |
| 10,043,898 B2 | 8/2018 | Lal |
| 10,063,138 B1 | 8/2018 | Zhou et al. |
| 2008/0303162 A1 | 12/2008 | Ishida et al. |
| 2011/0115025 A1 | 5/2011 | Okamoto |
| 2012/0256188 A1 | 10/2012 | McDonald et al. |
| 2013/0146946 A1 | 6/2013 | Tsurumi et al. |
| 2014/0103398 A1 | 4/2014 | Curatola et al. |
| 2014/0203299 A1 | 7/2014 | Aketa et al. |
| 2017/0287811 A1 | 10/2017 | Pei et al. |
| 2019/0296112 A1 | 9/2019 | Yoshimochi |
| 2020/0119179 A1 | 4/2020 | Mishra et al. |

FOREIGN PATENT DOCUMENTS

| | | |
|---|---|---|
| JP | 2012-222360 A | 11/2012 |
| JP | 2015-019002 A | 1/2015 |
| JP | 2015-056564 A | 3/2015 |
| JP | 2015-509665 A | 3/2015 |
| WO | WO 2020/191357 | 9/2020 |
| WO | WO 2022/061181 | 3/2022 |

OTHER PUBLICATIONS

Chu et al., "1200-V Normally Off GaN-on-Si Field-effect Transistors with Low Dynamic On-Resistance," IEEE Electron Device Letters, 2011, 32(5):632-634.

Coffie et al., "Unpassivated p-GaN/AlGaN/GaN HEMTs with 7.1 W/mm at 10 GhZ," Electronic Letters, 2003, 39(19):1419-1420.

Coffie, "Characterizing and Suppressing DC-to-RF Dispersion in AlGaN/GaN High Electron Mobility Transistors," 2003, PHD Thesis, University of California, Santa Barbara, 169 pages.

Dora et al., "High Breakdown Voltage Achieved on AlGaN/GaN HEMTs with Integrated Slant Field Plates," IEEE Electron Device Letters, 2006, 27(9):713-715.

Dora et al., "ZrO2 Gate Dielectrics Produced by Ultraviolet Ozone Oxidation for GaN and AlGaN/GaN Transistors," J. Vac. Sci. Technol. B, 2006, 24(2)575-581.

Dora, "Understanding Material and Process Limits for High Breakdown Voltage AlGaN/GaN HEMTs," PhD Thesis, University of California, Santa Barbara, Mar. 2006, 157 pages.

Huang and Cuadra, "Preventing GaN Device VHF Oscillation," APEC 2017 Industry Session, Mar. 2017, 25 pages.

International Preliminary Report on Patentability in International Appln. No. PCT/US2021/050981, mailed on Mar. 30, 2023, 11 pages.

International Search Report and Written Opinion in International Appln. No. PCT/US2021/050981, mailed on Jan. 26, 2022, 14 pages.

Invitation to Pay Additional Fees and, Where Applicable, Protest Fees in International Appln. No. PCT/US2021/050981, mailed on Nov. 12, 2021, 3 pages.

Keller et al., "GaN-GaN Junctions with Ultrathin AlN Interlayers: Expanding Heterojunction Design," Applied Physics Letters, 2002, 80(23):4387-4389.

Mishra et al., "AlGaN/GaN HEMTs—An Overview of Device Operation and Applications," Proceedings of the IEEE, 2002, 90(6): 1022-1031.

Parikh et al., "650 Volt GaN Commercialization Reaches Automotive Standards," ECS Transactions, 2017, 80(7): 17-28.

Parikh et al., "Commercialization of High 600V GaN-on-Silicon Power HEMTs and Diodes," 2013 IEEE, 5 pages.

Parikh, "Driving the Adoption of High-voltage Gallium Nitride Filed-effect Transistors," IEEE Power Electronics Magazine, Sep. 2017, 3 pages.

Shen, "Advanced Polarization-based Design of AlGaN/GaN HEMTs," Jun. 2004, PhD Thesis, University of California, Santa Barbara, 192 pages.

Smith and Barr, "Reliability Lifecycle of GaN Power Devices," Transphorm Inc., Mar. 2017, 8 pages.

Suh et al. "High-Breakdown Enhancement-mode AlGaN/GaN HEMTs with Integrated Slant Field-Plate," Electron Devices Meeting, 2006, IEDM '06 International, 3 pages.

Wang et al., "Investigation of Driver Circuits for GaN HEMTs in Leaded Packages," Workshop on Wide Bandgap Power Devices and Applications (WiPDA), 2014 IEEE, pp. 81-87.

Wang et al., "Paralleling GaN HEMTs for Diode-free Bridge Power Converters," 2015 IEEE Applied Power Electronics Conference and Exposition (APEC), Charlotte, NC, 2015, pp. 752-758.

Wang, et al., "Design and Implementation of a High-efficiency Three-level Inverter Using GaN HEMTs," PCIM Europe 2015, May 19-21, 2015, Nuremberg, Germany, 7 pages.

Wu et al., "A 97.8% Efficient GaN HEMT Boost Converter with 300-W Output Power at 1 MHZ," Electronic Device Letters, 2008, IEEE, 29(8):824-826.

Wu et al., "Advances in Reliability and Operation Space of High-voltage GaN Power Devices on Si Substrates," (2014) IEEE, 3 pages.

Wu et al., "High-frequency, GaN Diode-free Motor Drive Inverter with Pure Sine Wave Output," PCIM Europe 2012, Conference Digest, pp. 40-43.

Wu et al., "kV-Class GaN-on-Si HEMTs Enabling 99% Efficiency Converter at 800 V and 100 kHz," IEEE Transactions on Power Electronics. 2014 29(6):2634-2637.

Wu et al., "Total GaN Solution to Electrical Power Conversion," the 69th IEEE Device Research Conference, Conference Digest, Jun. 20-22, 2011, pp. 217-218.

Wu, "AlGaN/GaN Microwave Power High-Mobility Transistors," PhD Thesis, University of California, Santa Barbara, Jul. 1997, 134 pages.

Wu, "Paralleling High-speed GaN Power HEMTs for Quadrupled Power Output," Applied Power Electronics Conference and Exposition (APEC), 2013, pp. 211-214.

Xu et al., "Investigation of 600 V GaN HEMTs for High Efficiency and High Temperature Applications," Applied Power Electronics Conference and Exposition (APEC), Apr. 2014, pp. 131-136.

Zhang et al., "Common-mode Circulating Current Control of Paralleled Interleaved Three phase Two-level Voltage-source Converters with Discontinuous Space-vector Modulation," IEEE Transactions on Power Electronics, Dec. 2011, 26(12):3925-3935.

Zhang et al., "Evaluation of 600 V Cascode GaN HEMT in Device Characterization and All-GaN-based LLC Resonant Converter," In Proc. Energy Conversion Congress and Exposition (ECCE), Sep. 2013 IEEE, pp. 3571-3578.

Zhang et al., "Gate Drive Design Considerations for High Voltage Cascode GaN HEMT," Applied Power Electronics Conference and Exposition (APEC), Mar. 2014, pp. 1484 1489.

Zhang et al., "Impact of Interleaving on AC Passive Components of Paralleled Three phase Voltage-source Converters," IEEE Transactions on Industry Applications, May/Jun. 2010, 46(3):1042-1054.

Zhang, "High Voltage GaN HEMTs with Low On-resistance for Switching Applications," PhD Thesis, University of California, Santa Barbara, Sep. 2002, 166 pages.

Zhou and Wu, "99% Efficiency True-bridgeless Totem-pole PFC Based on GaN HEMTs," PCIM Europe May 14-16, 2013, pp. 1017-1022.

(56) References Cited

OTHER PUBLICATIONS

Zhou et al., "High-efficiency True Bridgeless Totem Pole PFC Based on GaN HEMTs: Design Challenges and Cost-effective Solution," PCIM Europe 2015, pp. 1482-1489.
Zuk and Campeau, "How to Design with GaN in 1 Hour!," APEC 2017 Exhibitor Session, Mar. 2017, 24 pages.
Office Action in Japanese Appln. No. 2023-516680, mailed on May 27, 2025, 11 pages (with English translation).
Office Action in Japanese Appln. No. 2023-516680, mailed on Sep. 24, 2025, 4 pages (with English summary).

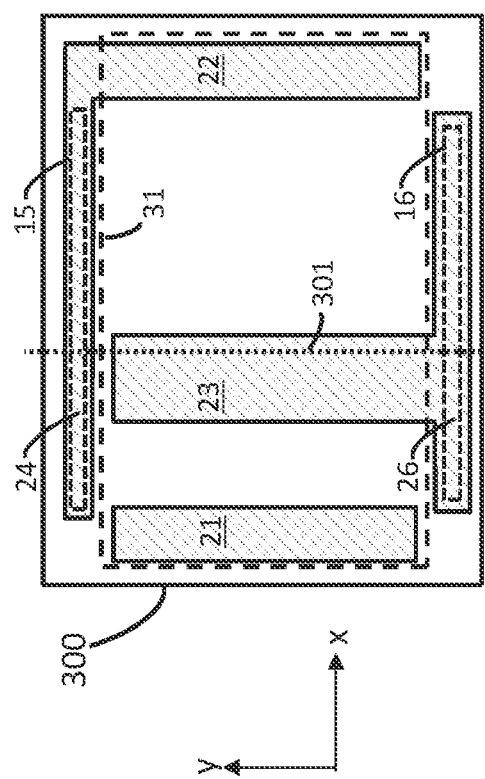
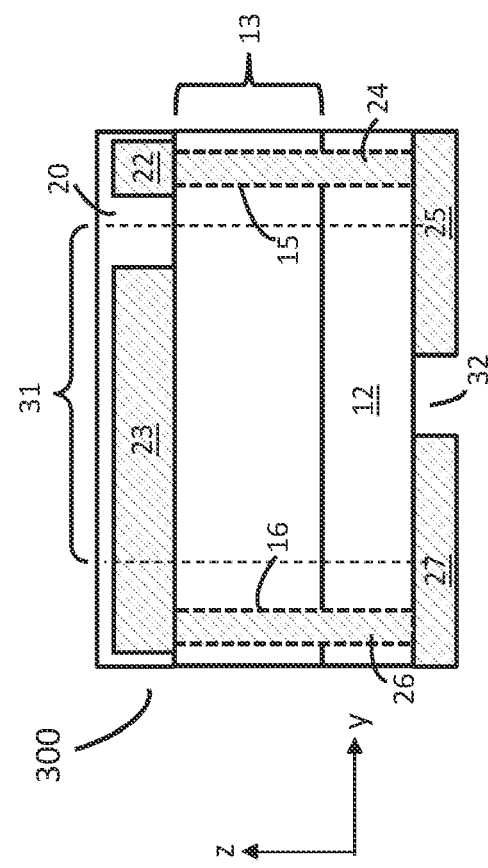
Figure 3A
Figure 3B

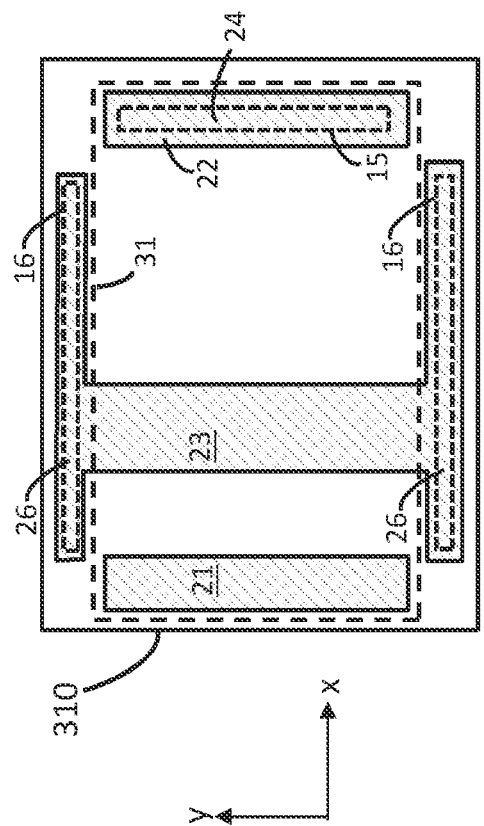

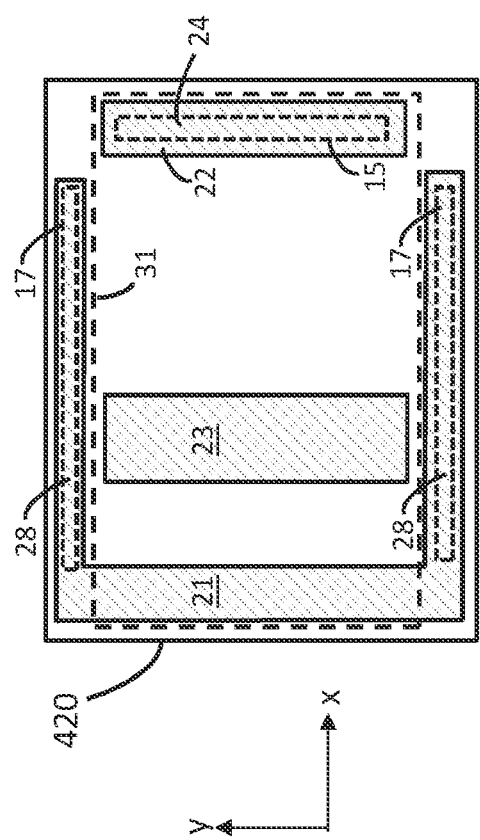

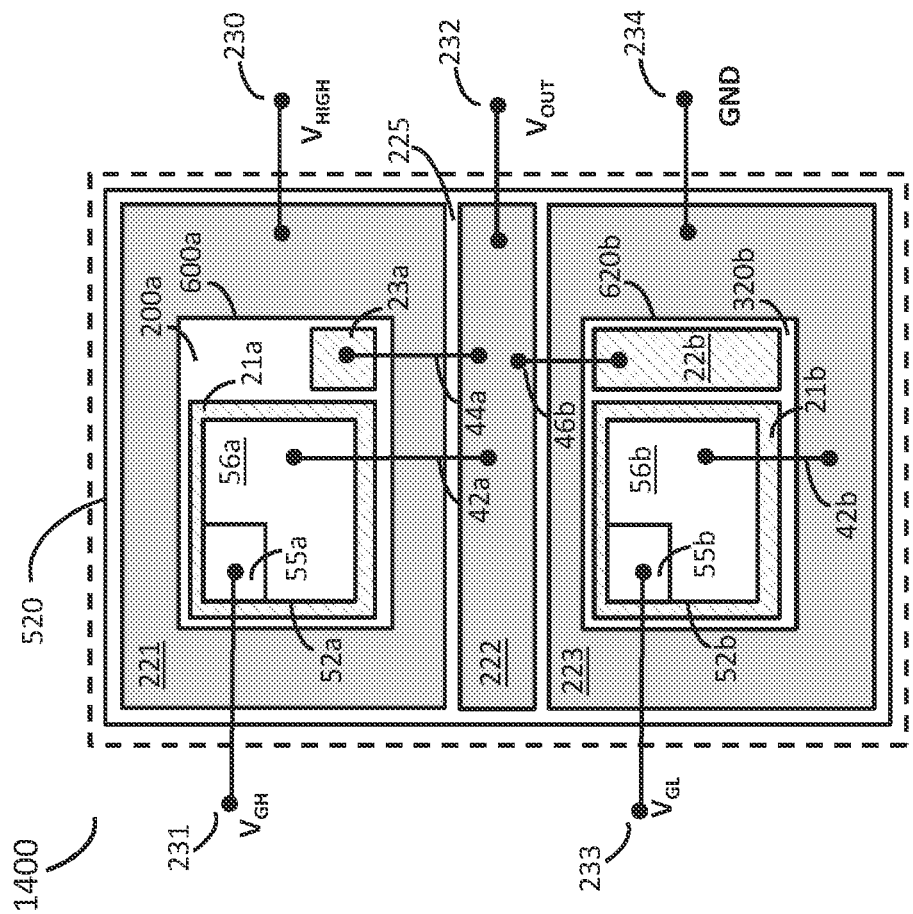

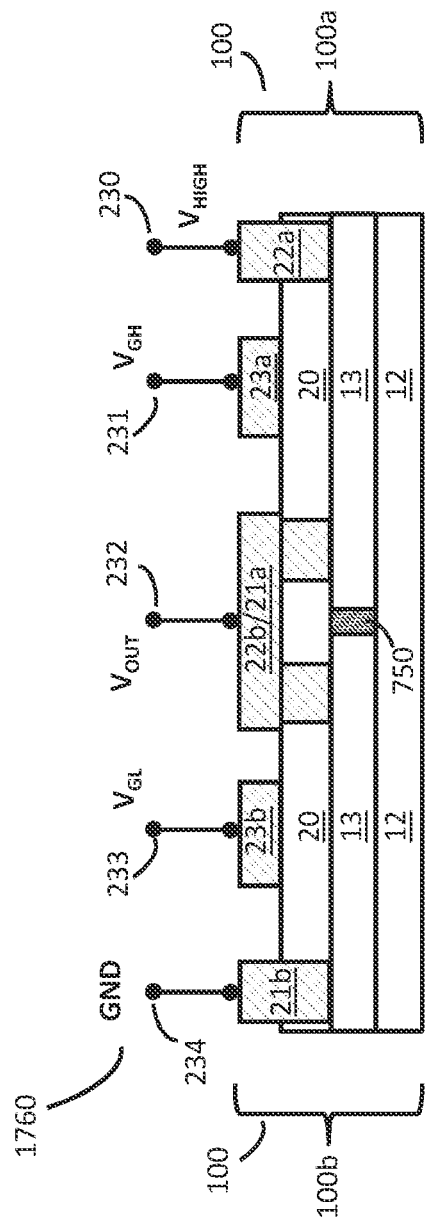

III-NITRIDE DEVICES WITH THROUGH-VIA STRUCTURES

CROSS-REFERENCE TO RELATED APPLICATIONS

This application is a National Stage Application under 35 U.S.C. § 371 and claims the benefit of International Application No. PCT/US2021/050981, filed Sep. 17, 2021, which claims the benefit under 35 U.S.C. § 119 (e) of priority to Provisional Application No. 63/081,268, filed on Sep. 21, 2020. The entire contents of each are incorporated herein by reference in their entirety.

TECHNICAL FIELD

The disclosed technologies relate to semiconductor electronic devices.

BACKGROUND

Currently, typical power semiconductor devices, including devices such as transistors, diodes, power MOSFETs and insulated gate bipolar transistors (IGBTs), are fabricated with silicon (Si) semiconductor material. More recently, wide-bandgap materials (SiC, III-O, diamond) have been considered for power devices due to their superior properties. III-Nitride or III-N semiconductor devices, such as gallium nitride (GaN) devices, are now emerging as attractive candidates to carry large currents, support high voltages, and provide very low on-resistance with fast switching times. In order to reduce the cost of GaN power devices and compete with incumbent silicon power devices, GaN power devices are typically fabricated on silicon substrates (i.e., GaN-on-Silicon), which are easily compatible with existing silicon fabrication facilities. The term device will be used in general for any transistor, or switch, or diode when there is no need to distinguish between them.

A plan view of a lateral III-N device 100 of the prior art is illustrated in FIG. 1A. Device 100 includes a source contact 21, a drain contact 22, and a gate contact 23 between the source contact 21 and the drain contact 22 (i.e., devices electrodes), formed in a device active region 31. A cross-section 101 of the device 100 in the "x" direction is shown in FIG. 1B. As seen in FIG. 1B, the device 100 also includes a III-N material structure 11 formed over a conducting or semi-conducting substrate 10 (e.g., silicon or silicon carbide). The III-N material structure 11 can include a III-N buffer layer, a III-N channel layer (e.g., GaN), and a III-N barrier layer (e.g., AlGaN). The bandgap of the III-N barrier layer is greater than the bandgap of the III-N channel layer, such that a lateral two-dimensional electron gas (2DEG) channel 19, indicated by the dashed line in FIG. 1B, is formed in the III-N material structure 11 and serves as the device channel within the active region 31. The source contact 21 and the drain contact 22 are electrically connected to the 2DEG channel 19. The source contact 21, the drain contact 22, and the gate contact 23 are all formed over a side of the III-N material structure 11 opposite the substrate 10.

SUMMARY

Described herein are integrated designs for lateral III-N devices (e.g., GaN HEMT power transistors), for which a through-via (also referred to as TV) is used to integrate the III-N device into the component packaging, or electronic module. Specifically, the III-N device can be formed on an first side of a substrate, and the through-via can extend through the III-N material structure and the substrate, allowing for the formation of device terminals on a side of the substrate opposite the III-N material structure.

In a first aspect, a semiconductor device is described. The semiconductor device comprises a III-N device including an insulating substrate. The insulating substrate includes a first side and a second side. The device further includes a III-N material structure on a first side of the insulating substrate, and a gate electrode, a source electrode, and a drain electrode on a side of the III-N material structure opposite the substrate. A backmetal layer on the second side of the insulating substrate, and a via hole is formed through the III-N material structure and the insulating substrate. A metal formed in the via-hole is electrically connected to the drain electrode on the first side of the substrate and electrically connected to the backmetal layer on the second side of the substrate.

In a second aspect, and electronic component is described. The electronic component includes an enhancement-mode transistor, a depletion-mode transistor comprising an insulating substrate and a backmetal layer, and a package comprising a conductive structural package base. The package encloses both the enhancement-mode transistor and the depletion-mode transistor. A gate electrode of the enhancement-mode transistor is electrically connected to a gate terminal of the package, a source electrode of the enhancement-mode transistor is electrically connected to a source terminal of the package, and the gate electrode of the depletion-mode transistor is electrically connected to the source terminal of the package. A drain electrode of the depletion-mode transistor directly contacts and is electrically connected to the backmetal layer, the backmetal layer is directly contacting and electrically connected to the conductive structural package base, and the conductive structural package base is electrically connected to a drain terminal of the package.

In a third aspect, a semiconductor device is described. The semiconductor devices comprises a III-N device including an insulating substrate, the insulating substrate comprising a first side and a second side. The device further includes a III-N material structure on a first side of the insulating substrate, and a gate electrode, a source electrode, and a drain electrode on a side of the III-N material structure opposite the substrate, and a dielectric layer over the III-N material structure, a backmetal layer on the second side of the insulating substrate, a via-hole formed through the III-N material structure and the insulating substrate. A metal formed in the via-hole is electrically connected to the source electrode on the first side of the substrate and electrically connected to the backmetal layer on the second side of the substrate and the source electrode is fully encapsulated in the dielectric layer on the first side of the substrate.

In a fourth aspect, an electronic module is described. The electronic module includes a base substrate comprising an insulating layer between a first metal layer and a second metal layer. The first metal layer including a first portion, a second portion, and a third portion, wherein a trench formed through the first metal layer electrically isolates the first, second and third portions of the first metal layer from one another. The module further includes a high-side switch comprising an enhancement-mode transistor and a depletion-mode transistor, wherein the depletion-mode transistor comprises a III-N material structure on a first side of an insulating substrate and a backmetal layer on a second side opposite the first side, and a via-hole is formed through the III-N material structure and the insulating substrate. The module further includes a low-side switch. A source electrode of the enhancement-mode transistor is electrically connected to the second portion of the first metal layer, a drain electrode of the enhancement-mode transistor is electrically connected to a source electrode of the depletion-mode transistor, a gate electrode of the depletion-mode transistor is electrically connected to second portion of the first metal layer, and a metal formed in the via-hole is electrically connected to the drain electrode of the depletion-mode transistor and electrically connected to the backmetal layer, and the backmetal layer is electrically connected and physically mounted to the first portion of the first metal layer.

Each of the devices, transistor, and modules described herein can include one or more of the following features. The substrate can be a sapphire substrate. The III-N material structure can include a III-N barrier layer, a III-N channel layer, a III-N buffer layer, and a lateral 2DEG channel within an active region of the device. The drain and/or the source electrode is electrically connected to the 2DEG channel. The via-hole can be formed outside the active region or inside the active region. The device can be a high-voltage device with a breakdown voltage greater than 600V and an on-resistance of less than 15 mohm. The backmetal layer can be electrically configured to be coupled to a circuit high-voltage node, an output node, or a ground node. A separation between a first backmetal layer and a second backmetal layer can be greater than 10 µm. A drain electrode, a source electrode, a gate electrode, or any combination therein can be connected to the backmetal layer with multiple through-substrate vias. The drain electrode of the transistor can be connected to the drain terminal of the package without the use of an external wire connector. The high-side and low-side switches of the electronic module can form a half-bridge circuit. The high-side switch and the low-side switch can be encased in a single electronic package.

As used herein, a "hybrid enhancement-mode electronic device or component", or simply a "hybrid device or component", is an electronic device or component formed of a depletion-mode transistor and an enhancement-mode transistor, where the depletion-mode transistor is capable of a higher operating and/or breakdown voltage as compared to the enhancement-mode transistor, and the hybrid device or component is configured to operate similarly to a single enhancement-mode transistor with a breakdown and/or operating voltage about as high as that of the depletion-mode transistor. That is, a hybrid enhancement-mode device or component includes at least 3 nodes having the following properties. When the first node (source node) and second node (gate node) are held at the same voltage, the hybrid enhancement-mode device or component can block a positive high voltage (i.e., a voltage larger than the maximum voltage that the enhancement-mode transistor is capable of blocking) applied to the third node (drain node) relative to the source node. When the gate node is held at a sufficiently positive voltage (i.e., greater than the threshold voltage of the enhancement-mode transistor) relative to the source node, current passes from the source node to the drain node or from the drain node to the source node when a sufficiently positive voltage is applied to the drain node relative to the source node. When the enhancement-mode transistor is a low-voltage device and the depletion-mode transistor is a high-voltage device, the hybrid component can operate similarly to a single high-voltage enhancement-mode transistor. The depletion-mode transistor can have a breakdown and/or maximum operating voltage that is at least two times, at least three times, at least five times, at least ten times, or at least twenty times that of the enhancement-mode transistor.

As used herein, the terms III-Nitride or III-N materials, layers, devices, etc., refer to a material or device comprised of a compound semiconductor material according to the stoichiometric formula $B_wAl_xIn_yGa_zN$, where w+x+y+z is about 1 with $0 \leq w \leq 1$, $0 \leq x \leq 1$, $0 \leq y \leq 1$, and $0 \leq z \leq 1$. III-N materials, layers, or devices, can be formed or prepared by either directly growing on a suitable substrate (e.g., by metal organic chemical vapor deposition), or growing on a suitable substrate, detaching from the original substrate, and bonding to other substrates.

As used herein, two or more contacts or other items such as conductive channels or components are said to be "electrically connected" if they are connected by a material which is sufficiently conducting to ensure that the electric potential at each of the contacts or other items is intended to be the same, e.g., is about the same, at all times under any bias conditions.

As used herein, "blocking a voltage" refers to the ability of a transistor, device, or component to prevent significant current, such as current that is greater than 0.001 times the operating current during regular conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the operating current during regular conduction. Devices with off-state currents which are larger than this value exhibit high loss and low efficiency, and are typically not suitable for many applications, especially power switching applications.

As used herein, a "high-voltage device", e.g., a high-voltage switching transistor, HEMT, bidirectional switch, or four-quadrant switch (FQS), is an electronic device which is optimized for high-voltage applications. That is, when the device is off, it is capable of blocking high voltages, such as about 300V or higher, about 600V or higher, or about 1200V or higher, and when the device is on, it has a sufficiently low on-resistance (Rory) for the application in which it is used, e.g., it experiences sufficiently low conduction loss when a substantial current passes through the device. A high-voltage device can at least be capable of blocking a voltage equal to the high-voltage supply or the maximum voltage in the circuit for which it is used. A high-voltage device may be capable of blocking 300V, 600V, 1200V, 1700V, 2500V, or other suitable blocking voltage required by the application. In other words, a high-voltage device can block all voltages between 0V and at least $V_{max}$, where $V_{max}$ is the maximum voltage that can be supplied by the circuit or power supply, and $V_{max}$ can for example be 300V, 600V, 1200V, 1700V, 2500V, or other suitable blocking voltage required by the application. For a bidirectional or four quadrant switch, the blocked voltage could be of any polarity less a certain maximum when the switch is OFF ($\pm V_{max}$ such as ±300V or ±600V, ±1200V and so on), and the current can be in either direction when the switch is ON.

As used herein, a "III-N device" is a device based on III-N heterostructures. The III-N device can be designed to operate as a transistor or switch in which the state of the device is controlled by a gate terminal or as a two terminal device that blocks current flow in one direction and conducts in another direction without a gate terminal. The III-N device can be a high-voltage device suitable for high voltage applications. In such a high-voltage device, when the device is biased off (e.g., the voltage on the gate relative to the source is less than the device threshold voltage), it is at least capable of supporting all source-drain voltages less than or equal to the high-voltage in the application in which the device is used, which for example may be 100V, 300V, 600V, 1200V, 1700V, 2500V, or higher. When the high voltage device is biased on (e.g., the voltage on the gate relative to the source or associated power terminal is greater than the device threshold voltage), it is able to conduct substantial current with a low on-voltage (i.e., a low voltage between the source and drain terminals or between opposite power terminals). The maximum allowable on-voltage is the maximum on-state voltage that can be sustained in the application in which the device is used.

The terms "over," "under," "between," and "on" as used herein refer to a relative position of one layer with respect to other layers. As such, for example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in contact with that second layer. Additionally, the relative position of one layer with respect to other layers is provided assuming operations are performed relative to a substrate without consideration of the absolute orientation of the substrate.

In typical power switching applications in which high-voltage switching transistors are used, the transistor is during the majority of time in one of two states. In the first state, which is commonly referred to as the "ON state", the voltage at the gate electrode relative to the source electrode is higher than the transistor threshold voltage, and substantial current flows through the transistor. In this state, the voltage difference between the source and drain is typically low, usually no more than a few volts, such as about 0.1-5 volts. In the second state, which is commonly referred to as the "OFF state", the voltage at the gate electrode relative to the source electrode is lower than the transistor threshold voltage, and no substantial current, apart from off-state leakage current, flows through the transistor. In this second state, the voltage between the source and drain can range anywhere from about 0V to the value of the circuit high voltage supply, which in some cases can be as high as 100V, 300V, 600V, 1200V, 1700V, or higher, but can be less than the breakdown voltage of the transistor. In some applications, inductive elements in the circuit cause the voltage between the source and drain to be even higher than the circuit high voltage supply. Additionally, there are short times immediately after the gate has been switched on or off during which the transistor is in a transition mode between the two states described above. When the transistor is in the off state, it is said to be "blocking a voltage" between the source and drain. As used herein, "blocking a voltage" refers to the ability of a transistor, device, or component to prevent significant current, such as current that is greater than 0.001 times the average operating current during regular on-state conduction, from flowing through the transistor, device, or component when a voltage is applied across the transistor, device, or component. In other words, while a transistor, device, or component is blocking a voltage that is applied across it, the total current passing through the transistor, device, or component will not be greater than 0.001 times the average operating current during regular on-state conduction.

When a hybrid enhancement-mode device is used in place of a conventional high-voltage E-mode transistor, the hybrid device operates as follows. When the hybrid device is in the on state, current flows through both the channel of the E-mode transistor and the channel of the D-mode transistor, and the voltage across each of the two transistors can be small, typically a few volts or less. When the hybrid device is in the off state, the voltage blocked by the hybrid device is divided between the E-mode transistor and the D-mode transistor. The E-mode transistor blocks a voltage approximately between $|V_{th,D}|$ and $V_{br,E}$, where $|V_{th,D}|$ is the absolute value of the threshold voltage of the D-mode transistor, and $V_{br,E}$ is the breakdown voltage of the E-mode transistor. The remainder of the voltage across the hybrid device is blocked by the high-voltage D-mode transistor.

The details of one or more disclosed implementations of the subject matter described in this specification are set forth in the accompanying drawings and the description below. Additional features and variations may be included in the implementations as well. Other features, aspects, and advantages will become apparent from the description, the drawings and the claims.

DESCRIPTION OF DRAWINGS

FIGS. 3A-3D are plan views and cross-sectional views of embodiments of III-N devices with gate connected through substrate vias.

FIGS. 4A-4G are plan views and cross-sectional views of embodiments of III-N devices with source connected through substrate vias.

FIGS. 14A and 14B are plan views of electronic modules featuring a half bridge.

FIGS. 17A-17G are cross-sectional views of integrated III-N devices on a common substrate.

Like reference symbols in the various drawings indicate like elements.

DETAILED DESCRIPTION

Figure 1A:
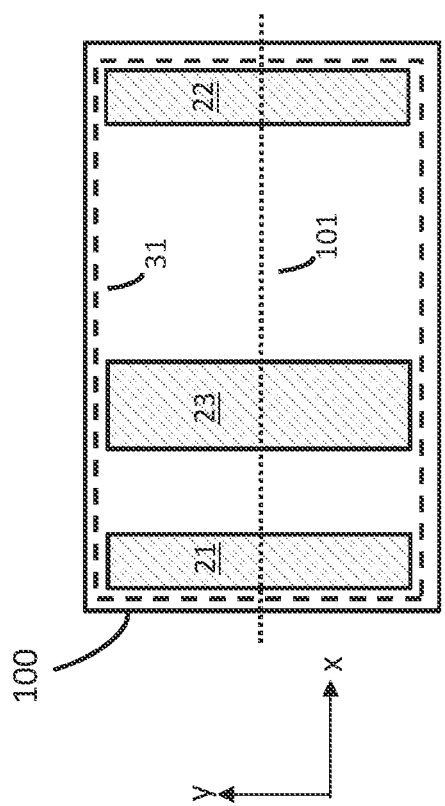
FIGS. 1A and 1B is a plan view and cross-sectional view, respectively, of a III-N device of the prior art.
Figure 1B:
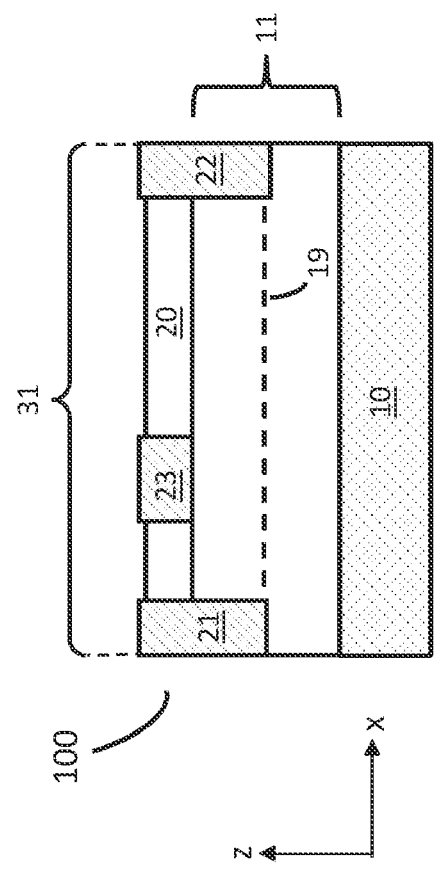

Due to the low cost of silicon substrates and the widely available processing equipment which is compatible with silicon, current industry commercialization efforts are largely focused on forming III-N devices on silicon substrates. The use of through-vias for III-N devices on silicon can enable significant improvements in device performance while simultaneously reducing packaging complexity. Also, due to the recent success of the LED lighting market, the price of insulating substrates, such as sapphire substrates, has recently reduced. Forming III-N devices on insulating substrates allows for additional design and layout considerations that are not possible on silicon, due to the inherent semi-conducting properties of silicon. This provides opportunities to further improve device performance while simultaneously reducing packaging complexity of III-Nitride devices and transistors.

Described herein are integrated designs for lateral III-N devices, for which through-vias (referred to herein as TVs) are used to integrate III-N devices into the electronic component packaging. The use of TVs allows for improvements in device performance while simultaneously reducing packaging complexity of III-Nitride devices and transistors. In the case of a III-N device formed on a conductive substrate, such as silicon, the though-via can be a though-epi-via (referred to as TEV) where the via extends through the III-N material structure and terminates at the substrate. In the case of a III-N device formed on an insulating substrate, such as sapphire, the through-via can be a though-substrate via (referred to as TSV) where the via extends through the III-N material structure and also through the substrate. These TVs allow for the formation of device electrodes on a side of the substrate opposite the III-N material structure. Due to the recent success of the LED lighting market, the price of insulating substrates, such as sapphire, has reduced. Forming lateral III-N devices on insulating substrates allows for additional design and layout considerations that are not possible on silicon, due to the inherent semi-conducting properties of silicon. This provides opportunities to further improve device performance and packaging complexity of III-Nitride devices and transistors. As used herein, a "through-via" or "via-hole" can refer to a TEV or a TSV, where the TEV forms a recess (or trench) which extends through the III-N material structure but does not extend through the substrate, and the TSV forms a recess (or trench) which extends through the III-N material structure and also extends through the substrate. A via-hole can be used to form a drain-via, a source-via, or a gate-via.

III-N devices fabricated on conductive substrates (e.g., silicon) or semi-conducting substrates (e.g., silicon carbide), can be formed with a backside metallization layer, which can be used to physically attach (e.g., with solder or epoxy) and electrically connect the III-N device to the component packaging. The backside metallization can be electrically connected to the source electrode or the gate electrode (which are low-voltage electrodes), through the implementation of a through-epi-via, or TEV. The TEV can be formed through the III-N material structure and connect to the conductive substrate such that the metal of the desired device electrode is formed in the via-hole and electrically connected to the backside metallization through the conductive substrate.

For an enhancement-mode GaN-on-Silicon III-N device, the TEV can be used to connect the conductive substrate to the source electrode, which is typically held at 0V. For a depletion-mode GaN-on-Silicon III-N device in a cascode die-on-die configuration, the TEV can be used to connect the conductive substrate to the gate electrode (which is typically held at 0V and connected to the cascode source, as described in more detail with regards to FIG. 5A). In the case of a depletion-mode device, the current carrying terminals of the III-N device (i.e., source and drain terminals) are both on the front side of the chip (opposite the gate terminal). The metal routing architectures required to enable such terminals suffer from high metal resistance and restrict the design of devices with very low on-resistance. For an enhancement-mode GaN-on-Silicon device, such restrictions can be overcome by using the source connected TEV that connects the source electrode to the conductive substrate thus allowing the source electrode to be on an opposite side of the device from the drain electrode. Such architecture can reduce metal resistance and enable design of devices with very low on-resistance. This integrated enhancement-mode architecture can improve device robustness due to its natural short-circuit handling capability. Further, integrated designs for lateral III-N devices with conductive substrates in component packaging, such as discrete devices, ICs, and half-bridge and full bridge modules will be described in further detail below.

III-N devices fabricated on insulating substrates (e.g., sapphire), can be formed with a backside metallization, which can be used to physically attach (e.g., with solder or epoxy) and electrically connect the III-N device to the component packaging. The backside metallization can be electrically connected to the source electrode, the drain electrode, the gate electrode, or any combination thereof through the implementation of a through-substrate via (referred to herein as TSV) integrated with an insulating substrate. The TSV can be formed through the III-N material structure and formed through the insulating substrate such that a metal layer can be deposited into the TSV to electrically connect the desired device electrode (which is formed on a side of the III-N material structure opposite the substrate) to the backside metallization.

Insulating substrates allows for new component packaging solutions which would otherwise not be possible on semi-conducting or conducting substrates, such as silicon or silicon carbide. Typically, for GaN-on-Silicon devices, since the substrate is conductive, it can be connected to the source or gate electrode (which is a low-voltage electrode ~0V).

However, connecting the drain terminal to a conductive substrate such as silicon is not possible due to back-gating effects that can harm device performance, stability, and long-term reliability. Insulating substrates, such as sapphire, allow for a drain terminal connection on the backside of the device without negative effects on performance or reliability. Also, when a semi-conducting or conducting substrate is used, such as silicon or SiC, only one terminal can be connected to the substrate. However, an insulating substrate, such as sapphire, can support multiple device terminals formed on the backside of the substrate. This eliminates the restriction of GaN-on-Silicon cascode devices related to scaling of chip size and increases the operating voltage, as will be described below. Further, integrated designs for lateral III-N devices with insulating substrates in component packaging, such as discrete devices, ICs, half-bridge modules, and 3-phase full bridge modules will be described in further detail below.

Devices and Transistors

Figure 2A:
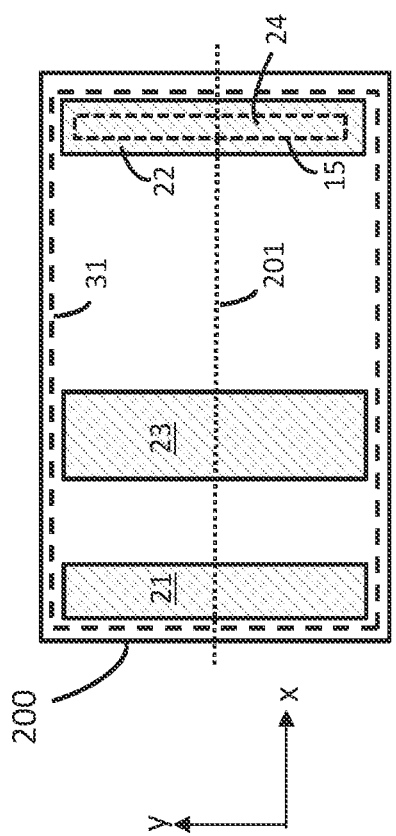
FIGS. 2A-2D are plan views and cross-sectional views of embodiments of III-N devices with drain connected through substrate vias.
Figure 2B:
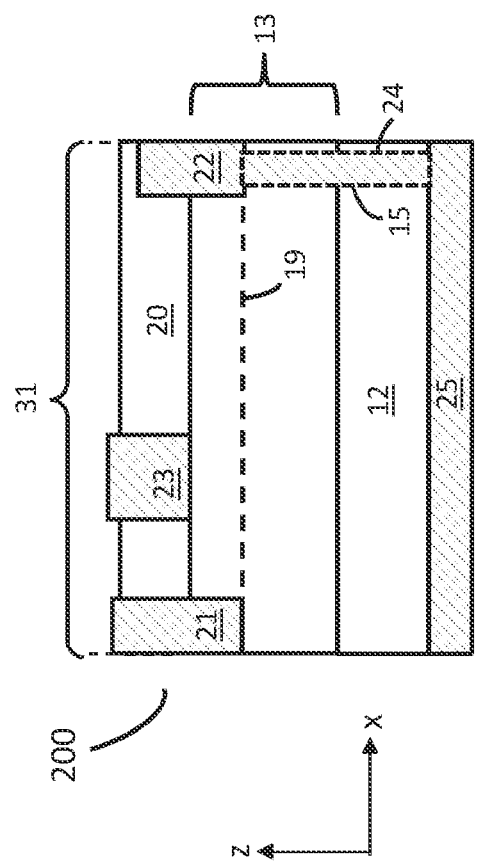

A plan view of a lateral III-N device 200 is illustrated in FIG. 2A. The device 200 includes a source contact 21, a drain contact 22, and a gate contact 23 between the source contact 21 and the drain contact 22 (i.e., devices electrodes), formed in a device active region 31. A cross-section 201 of device 200 is shown in FIG. 2B, which is taken in the "x" direction of device 200. As seen in FIG. 2B, device 200 also includes a III-N material structure 13 formed over a first side of an insulating substrate 12 (e.g. a sapphire substrate). The sapphire substrate can be a mis-cut sapphire substrate. The III-N material structure 13 can include a III-N buffer layer, a III-N channel layer, and a III-N barrier layer. The III-N buffer layer can be formed directly on a top surface of the insulating substrate 12. The bandgap of the III-N barrier layer is greater than the bandgap of the III-N channel layer, such that a lateral two-dimensional electron gas (2DEG) channel 19, indicated by the dashed line in FIG. 2B, is formed in the III-N material structure 13 and serves as the device channel within the active region 31. The III-N material structure can be formed in a Ga-Polar orientation or the III-N material structure can be formed in a N-Polar orientation, or the III-N material structure can be A-plane GaN which grows on r-plane sapphire. The III-N material structure can be epitaxial film (i.e., epi) grown in an MOCVD chamber. The source contact 21, the drain contact 22, and the gate contact 23 are all formed over a side of the III-N material structure 13 opposite the insulating substrate 12. A drain backmetal 25 is formed on a second side of the insulating substrate 12 which is opposite III-N material structure 15. An insulator layer 20 (i.e., a dielectric layer such as SiN) can be formed over a top surface of the III-N material structure 13. As seen in FIG. 2B, the drain contact can be fully encapsulated by the dielectric layer on the top surface of the device, and the source and gate contacts can have an exposed area on the top surface of the device to allow for external wire connectors. FIGS. 2A and 2B can be representative of a unit cell of device 200, where many unit cells can be combined to form device 200. The unit cells can be combined and electrically connected with metal wiring architecture which is formed outside the active region 31, or above the insulator layer 20.

Device 200 includes a drain via-hole 15 (i.e., through-substrate via) which is formed through the III-N material structure 13 and the insulating substrate 12. A metal layer 24 is at least partially formed in the drain via 15 which electrically connects the drain contact 22 to the drain backmetal 25. As seen in FIG. 2B, the drain via 15 can be formed within the active region of the device 31. Each unit cell can have a TSV, such that multiple TSVs across device 200 can connect the drain 22 to the drain backmetal 25.

Figure 2C:
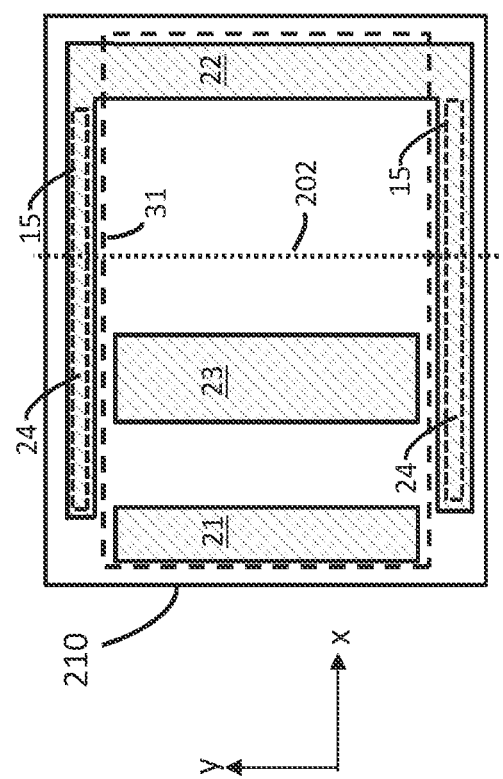
Figure 2D:
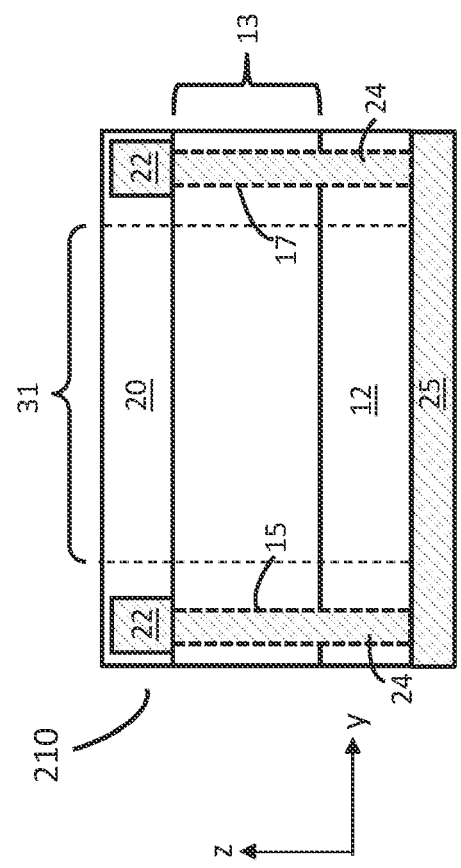

Alternatively, the drain via 15 can be formed in a region outside the device active area 31. FIG. 2C and FIG. 2D show a plan view and cross-sectional view, respectively, of device 210 which is similar to device 200 except the drain via 15 is formed outside the active region 31. FIG. 2D shows cross-section 202, which is taken in the "y" direction across device 210. Here, drain via 15 is not formed through the 2DEG channel 19 in the active region. Metal layer 24 can be formed outside the active region 31 and electrically connect the drain 22 to the drain backmetal 25 by being at least partially formed in the drain via 15.

As previously described, connecting the drain electrode to a semi-conductive or conducting substrate such as Si or SiC is not possible due to back-gating effects that can harm device performance, stability, and long-term reliability. Insulating substrates, such as sapphire, allow for a drain electrode connection on the backside of the device substrate without negative effects on performance or reliability. This can provide several benefits, for example, if device 200/210 is a depletion-mode device arranged in a cascode configuration, more area is available on the top-side of the device which can be used to form a larger source contact 21 pad. This allows for an increase in size, e.g., surface area, of a low-voltage enhancement-mode transistor that is directly mounted and electrically connected to the source contact pad, which will reduce on-resistance (described in further detail in FIG. 6A-6C).

In addition, for the implementation of very high voltage devices (e.g., greater than 1200V), when all three device electrodes are on the same side of the device (such as device 100), very large electrode spacing is required to prevent arching between the high-voltage electrode (i.e. drain) and the low-voltage electrodes (i.e., source and/or gate) which can increase the device size beyond what would otherwise be necessary to support such voltages. Therefore, it is advantageous to have the high-voltage electrode (i.e., drain contact) on one side of the substrate and the low-voltage electrodes (i.e., source and gate contacts) on an opposite side of the substrate from the high-voltage electrode. Connecting the drain contact 22 to the backmetal 25 enables high-voltage operation in a reduced chip size, while simultaneously eliminating the need for an external drain wire-bonds which can be prone to reliability issues due to high current carrying requirements.

Additionally, for implementation of very low resistance devices (e.g. lower than 15 mOhm), when both current carrying terminals are on the same side of the device (i.e., source and drain terminals), the resulting metal routing architecture adds significant metal resistance that can dominate the total on-resistance of the device and result in inefficient designs. An architecture where the current carrying terminals are on opposite sides of the device (e.g., backside drain) can enable very low metal routing resistance and thus enable scaling of the device to very low on-resistances.

Integrating III-N devices with insulating substrates also allows for multiple device electrodes to be formed on the backside of the substrate. A plan view of a lateral III-N device 300 is illustrated in FIG. 3A. FIG. 3B shows a cross-section 301, which is taken in the "y" direction across device 300. Device 300 is similar to device 200 except that device 300 includes a first via-hole, which is drain via 15 and a second via-hole, which is gate via 16. The first and second via-holes are through-substrate vias, which are formed through the III-N material structure 13 and through the insulating substrate 12. Metal layer 24 is at least partially formed in drain via 15 and electrically connects drain contact 22 to the drain backmetal 25. Metal layer 26 is at least partially formed in gate via 16 and electrically connects the gate contact 23 to a gate backmetal 27. The drain side metal 25 and the gate backmetal 27 are electrically isolated from each other by a trench 32. A single backside metallization can be formed on the substrate and then subsequently patterned and etched to remove a portion of the backside metal to form the trench 32 to separate the drain backmetal 25 and the gate backmetal 27. The separation between the drain backmetal 25 and the gate backmetal 27 can be greater than 10 µm. As seen in FIGS. 3A and 3B, drain via 15 and gate via 16 are formed in a region outside the active region 31 of the device.

Alternatively, the drain via 15 can be formed within the active region 31 of the device (such as device 200) and the gate via 16 can be formed outside active region 31, as shown in the plan view of device 310 of FIG. 3C. Forming the drain via 15 inside the active region and the gate via 16 outside the active region can allow for alternative component packaging layouts, which is later described in more detail (in FIG. 7A-7C). Multiple through-substrate vias can be used.

Figure 3D:
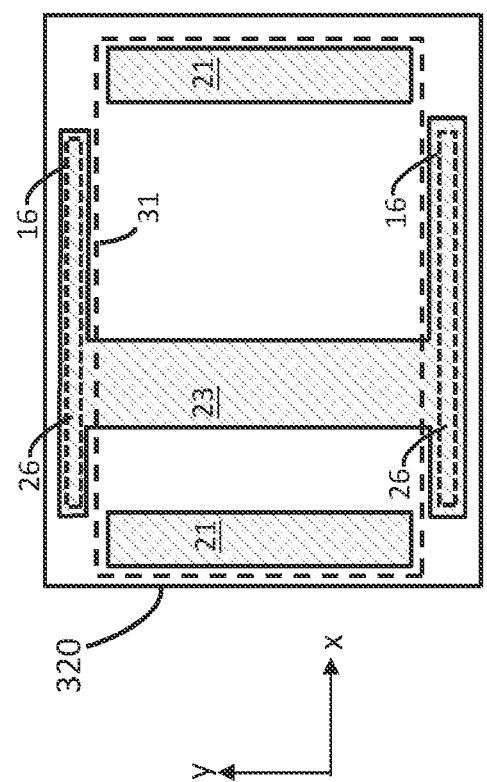

Alternatively, the drain via 15 can be omitted and the gate via 16 can be formed outside active region 31, as shown in the plan view of device 320 of FIG. 3D. Here, the gate backmetal 27 can be formed across the entire backside of the substrate 12 of device 320. Forming a gate via 16 such that the backmetal 27 is connected to the gate 23 can allow for alternative component packaging layouts which can be beneficial when used in cascode switches, which is later described in more detail, with respect to FIG. 5.

Figure 4A:
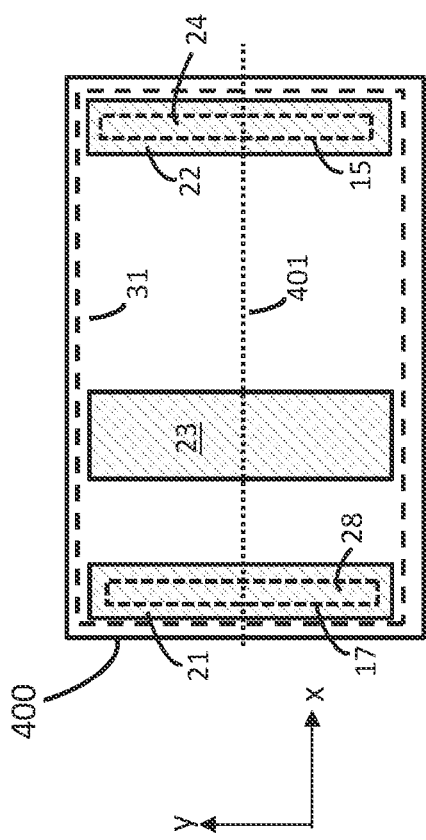
Figure 4B:
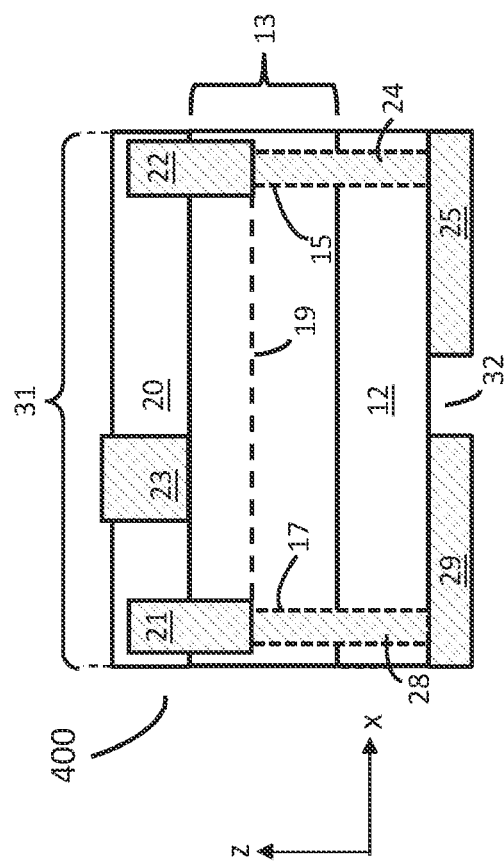

A plan view of a lateral III-N device 400 is illustrated in FIG. 4A. FIG. 4B shows a cross-section 401, which is taken in the "x" direction across device 400. Device 400 is similar to device 200 except that device 400 includes a first via-hole, which is drain via 15, and a third via-hole, which is source via 17. The first and third via-holes are through-substrate vias, which are formed through the III-N material structure 13 and through the insulating substrate 12. Metal layer 24 is at least partially formed in drain via 15 and electrically connects the drain contact 22 to a drain backmetal 25. Metal layer 28 is at least partially formed in source via 17 and electrically connects the source contact 21 to a source backmetal 29. The drain backmetal 25 and the source backmetal 29 are electrically isolated from each other by a trench 32. A single backside metallization can be formed on the substrate and then subsequently patterned and etched to remove a portion of the backside metal to form trench 32 to separate drain backmetal 25 and source backmetal 29. As seen in FIGS. 4A and 4B, drain via 15 and source via 17 are formed in a region inside the active region 31 of the device. The drain contact and the source contact can be fully encapsulated in the insulator layer 20 on a top surface of the III-N device.

Figure 4C:
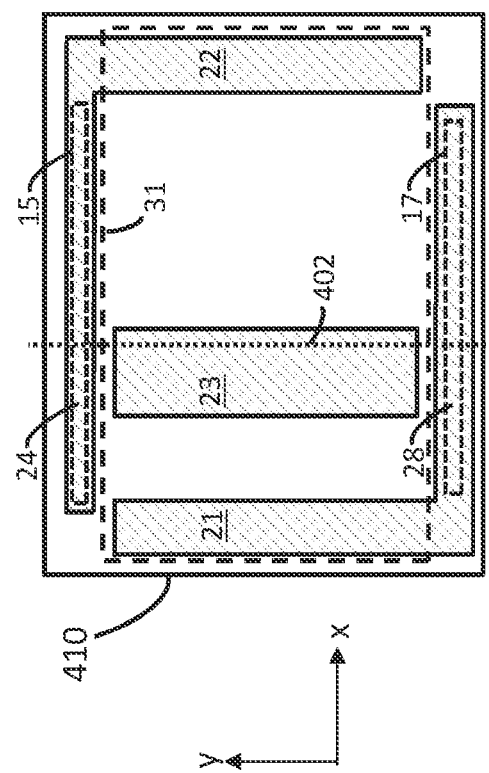
Figure 4D:
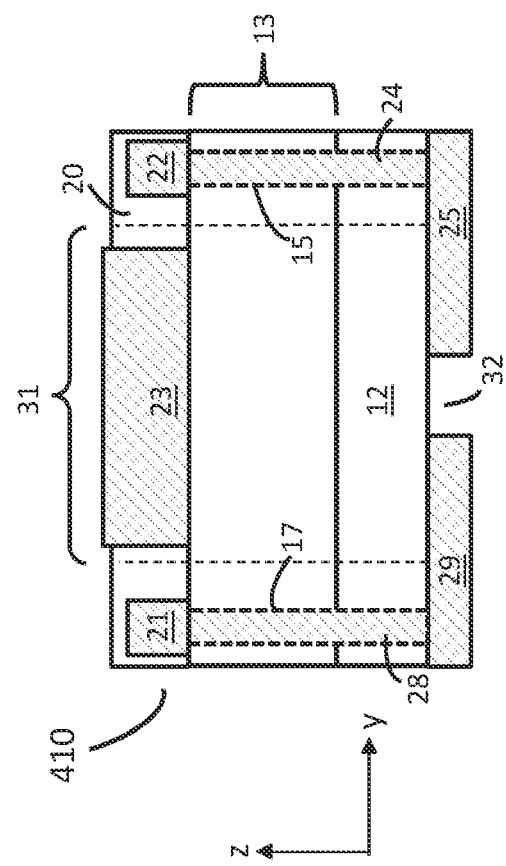

A plan view of a lateral III-N device 410 is illustrated in FIG. 4C. FIG. 4D shows a cross-section 402, which is taken in the "y" direction across device 410. Device 410 is similar to device 400 except that in device 410, the drain via 15 and the source via 17 are formed outside the device active region 31.

Alternatively, the drain via 15 can be formed within the active region 31 of the device (such as device 200) and the source via 17 can be formed outside active region 31, as shown in the plan view of device 420 of FIG. 4E. Forming the drain via 15 inside the active region and the source via 17 outside the active region can allow for alternative component packaging layouts, which is later described in more detail (in FIG. 8C).

Figure 4F:
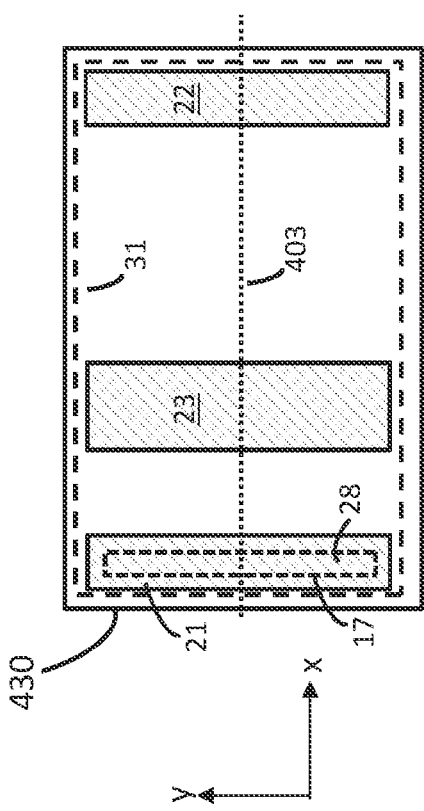
Figure 4G:
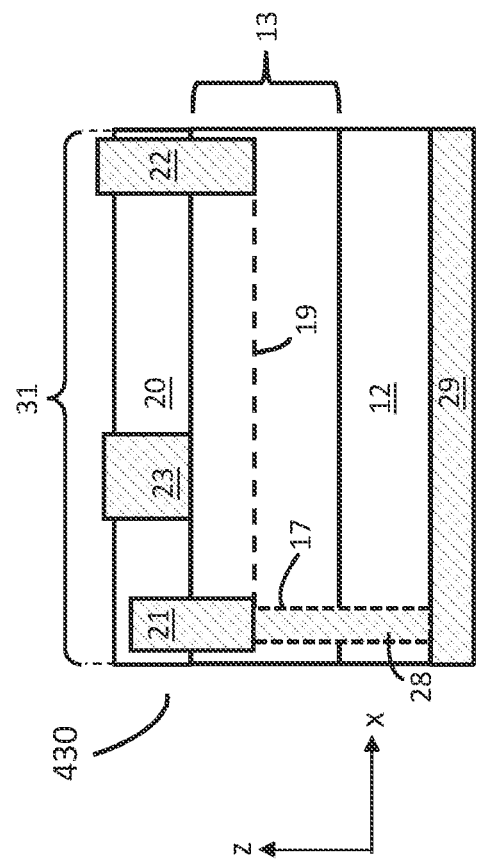

A plan view of a lateral III-N device 430 is illustrated in FIG. 4F. FIG. 4G shows a cross-section 403, which is taken in the "x" direction across device 430. Device 430 is similar to device 400 except that in device 430, only the source via 17 is formed and the drain via 15 omitted such that the entire backside of the substrate is connected to the source backmetal 29 and the drain contact 22 is accessible from the top side of device 430. Although device 430 shows the source via 17 formed within the active region 31, the source via 17 can also be formed outside the active region, as shown in device 420 of FIG. 4D.

Figure 4H:
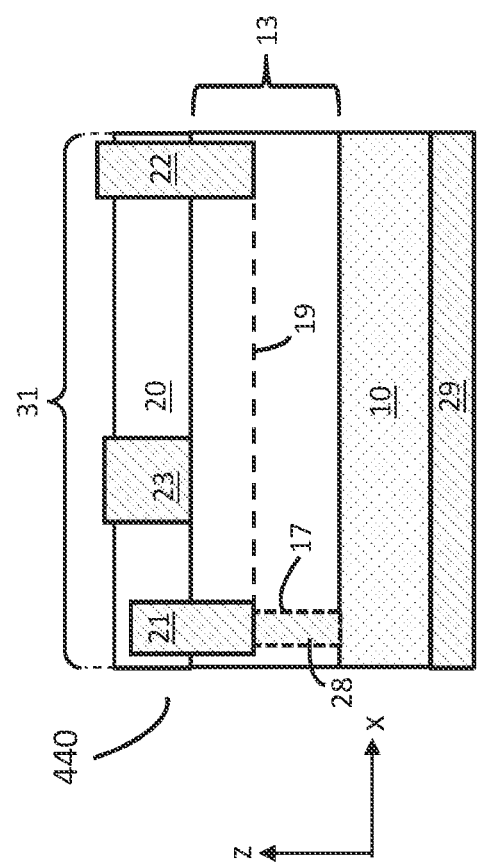
FIG. 4H is a cross-sectional view of a III-N device with a source connected through-epi via.

Alternatively, in the example of a backside connected source electrode, the substrate can be a conductive substrate such as Silicon. A cross-sectional view of device 440 is shown in FIG. 4H. Here, the source via 17 is a through-epi via (or TEV) formed through the III-N material structure 13 and terminates at the conductive substrate 10. Metal 28 is formed into the source via 17 such that the source contact 21 is electrically connected to the source backmetal 29 through the conductive substrate 10. The source contact 21 can be fully encapsulated by the insulator layer 20 on a top surface of the III-N device.

Devices 200, 210, 300, 310, 320, 400, 410, 420, 430, and 440 can be depletion-mode devices or they can be enhancement-mode devices. Most conventional III-N high electron mobility transistors (HEMTs) and related transistor devices are normally on (i.e. have a negative threshold voltage), which means that they can conduct current at zero gate voltage. These devices with negative threshold voltages are known as depletion-mode (D-mode) devices. It is preferable in power electronics to have normally off devices (i.e. devices with positive threshold voltages), that do not conduct substantial current at zero gate voltage, in order to avoid damage to the device or to other circuit components by preventing accidental turn on of the device. Normally off devices are commonly referred to as enhancement-mode (E-mode) devices. The thickness and composition of the III-N material structure can impact the threshold voltage of the device. In one example, the insulator layer 20 can be formed between the gate contact 23 and the top surface of the III-N material structure 13 to achieve the negative threshold voltage of a depletion-mode device. Alternately, a recess in the III-N material structure can be formed below the gate contact 23 and the gate can be formed in the recess to achieve the positive threshold voltage of an enhancement-mode device.

Discrete Electronic Component Packages

Figure 5A:
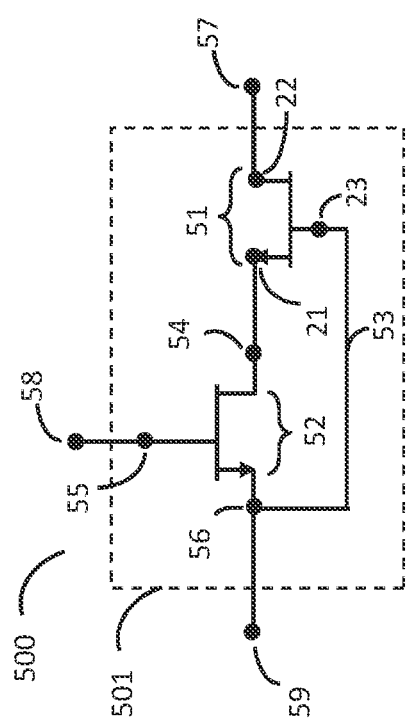
FIG. 5A is a schematic diagram of a hybrid normally-off device arranged in a cascode configuration.

One alternative to a single high-voltage E-mode transistor is to combine a high-voltage D-mode III-N transistor with a low-voltage E-mode transistor, for example a low-voltage silicon FET, in a cascode circuit configuration shown in the schematic diagram of FIG. 5A to form a single hybrid III-N device, herein referred to as cascode switch 500, which can be operated in the same way as a single high-voltage E-mode III-N transistor and in many cases achieves the same or similar output characteristics as a single high-voltage E-mode III-N transistor. The cascode switch 500 of FIG. 5A includes a high-voltage D-mode III-N transistor 51 and a low-voltage E-mode transistor 52 which can both be encased in a single electronic component package 501, the cascode switch includes a source terminal 59, a gate terminal 58, and a drain terminal 57, which can extend outside the component package and allow of external connection of the switch. The source contact 56 of the low-voltage E-mode transistor 52 and the gate contact 23 of the high-voltage D-mode III-N transistor 51 are electrically connected by connector 53 and to the source terminal 59. The gate contact 55 of the low-voltage E-mode transistor 52 is electrically connected to the gate terminal 58 of cascode switch 500. The drain contact 22 of the high-voltage D-mode III-N transistor 51 is electrically connected to the drain terminal 57 of cascode switch 500. The source contact 21 of the high-voltage D-mode III-N transistor 51 is electrically connected to the drain contact 54 of the low-voltage E-mode transistor 52.

Figure 5B:
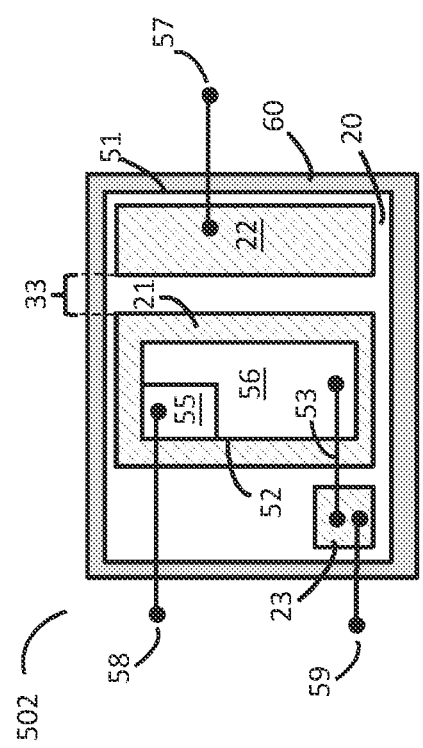
FIG. 5B is a plan view of a package configuration of the hybrid device of FIG. 5A.

Referring to FIG. 5B, a plan view of an exemplary package 502 is shown, in which the low-voltage E-mode transistor 52 is mounted directly to the source contact 21 of the high-voltage D-mode transistor 51, with the drain contact 54 of the E-mode transistor 52 directly bonded and electrically connected to the source contact 21 of the D-mode transistor 51. The E-mode transistor 52 can, for example, be a silicon FET, and the D-mode transistor can, for example, be a high-voltage III-N HEMT such as device 100 which is fabricated with an semi-conducting or conducting substrate, such as silicon. Here, all three device electrodes (i.e., source, gate, and drain contacts) are formed on the same side of the D-Mode III-N device 51. The D-mode transistor is mounted to a conductive package base 60. The source contact 56 of the E-mode transistor 52 is electrically connected to the gate contact 23 of the D-mode transistor 51 through connector 53. The cascode switch 500 can be operated in the same way as a single high-voltage E-mode III-N transistor and in many cases achieves the same or similar output characteristics as a single high-voltage E-mode transistor. The D-mode transistor 51 has a larger breakdown voltage than the E-mode transistor 52 (e.g. at least three times larger). The maximum voltage that can be blocked by the cascode switch 500 while it is biased in the OFF state is at least as large as the maximum blocking or breakdown voltage of the D-mode transistor 51.

As seen in FIG. 5B, the source contact 21 and the drain contact 22 are separated by a minimum distance 33, which is sufficiently large to prevent accidental arcing and short circuits between the source and drain contacts. As such, either cascode switch 500 is limited in high-voltage operation or the E-mode transistor 52 must be kept sufficiently small to increase the separation 33 sufficiently to allow for high-voltage operation. However, with the integration of insulating substrates and the use of through-substrate vias, the drain electrode connection can be removed from the top surface of the device and formed on the backside of the D-mode device 51. This eliminates the limitations of separation 33 and allows for larger source contact area. The corresponding E-mode transistor 52 can be increased in size e.g., increased in surface area, with a reduced on-resistance. In addition, an architecture where the current carrying terminals are on opposite sides of the chip (e.g. backside drain) can enable very low metal routing resistance and thus enable scaling of the device to very low on-resistances.

Figure 6A:
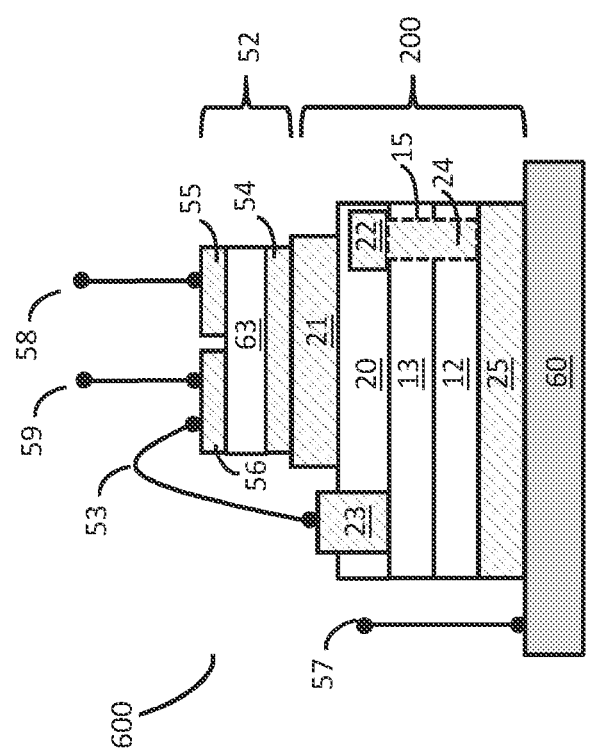
FIGS. 6A, 6B and 6C are a cross-sectional view and plan views, respectively, of a package configuration for a hybrid III-N device with a drain connected through substrate via.

FIG. 6A shows a cross-sectional view of a cascode switch 600 which is similar to the cascode switch 500 expect that the III-N depletion-mode transistor 51 is implemented using device 200 (or device 210) of FIGS. 2A-2D. As seen in FIG. 6A, the D-mode transistor 200 includes a drain via 15 which extends through the substrate 12, and metal 24 is formed in the drain via 15 to electrically connect the drain 22 to drain backmetal 25. The drain backmetal layer 25 is electrically connected and physical mounted to the package base 60 through solder, epoxy, or another suitable material. The package base 60 is connected to the drain terminal 57 of cascode switch 600. The E-mode transistor 52 includes a semiconductor body layer 63. Transistor 52 further includes a source contact 56 and a gate contact 55 on a first side of a semiconductor body layer 63, and a drain contact 54 on a second side of the semiconductor body layer 63 opposite the source contact 59. The source contact 56 is connected to the source terminal 59 of cascode switch 600, and the gate contact 55 is connected to the gate terminal 58 of cascode switch 600. The drain contact 54 of E-mode transistor 52 is electrically connected and physical mounted to the source contact 21 of D-mode transistor 200 through solder, epoxy, or another suitable material. The gate contact 23 of the D-mode transistor is connected to the source terminal 59 (or optionally the source contact 56) by connector 53.

Figure 6B:
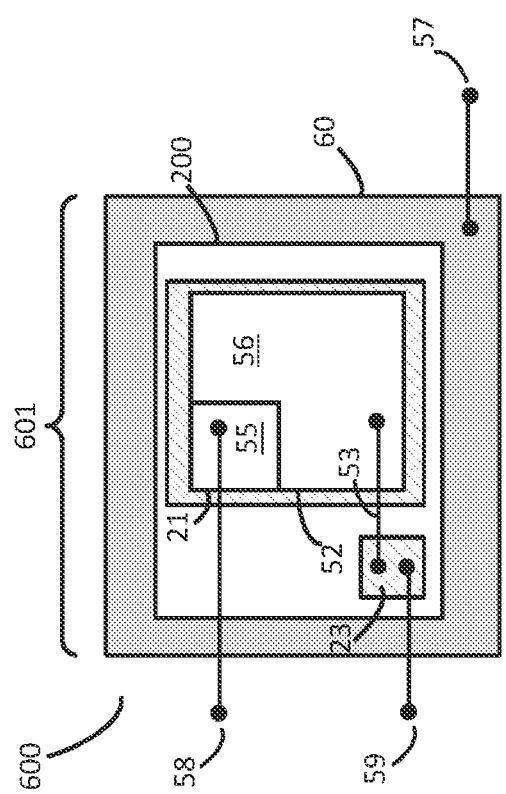
Figure 6C:
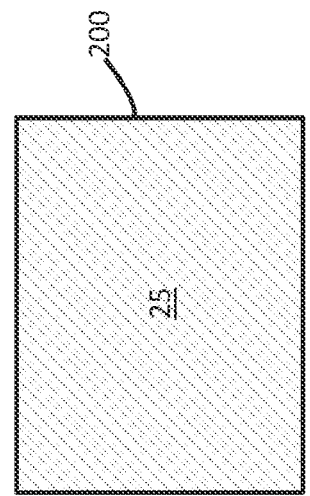

FIG. 6B is a front side plan view of cascode switch 600 which is implemented into a single discrete electronic component package 601. FIG. 6C is a backside plan view of D-mode device 200 of switch 600 which shows the backside metallization which is the drain connected backmetal layer 25. As seen in FIG. 6A-6C, the drain contact 22 is electrically connected to the conductive package base 60 without the use of an external wire-bond connector, which can be prone to long-term reliability issues due to high current carrying requirements.

Figure 6D:
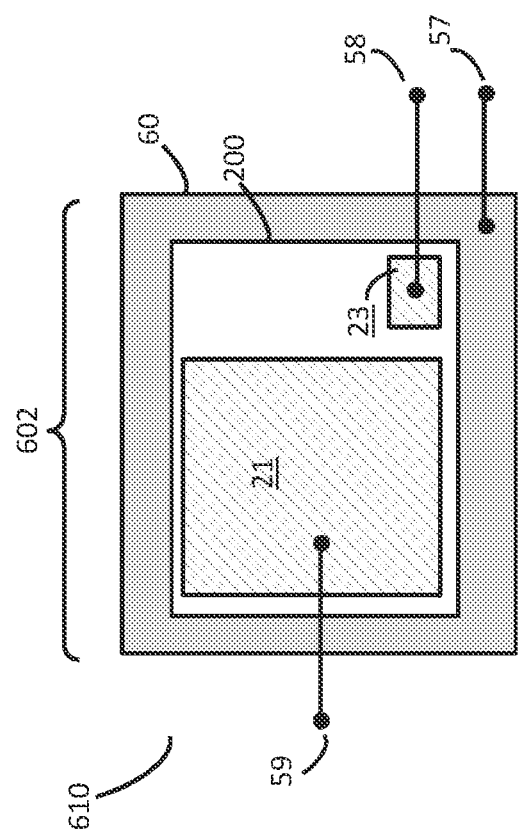
FIG. 6D is a plan view of a package configuration of an enhancement-mode III-N device with a drain connected through substrate via.

FIG. 6D is a frontside plan view of switch 610 and package 602, which is similar to cascode switch 600 except that package 602 is implemented when the III-N transistor 200 is an enhancement mode transistor instead of a depletion mode transistor. Here, the low-voltage E-mode transistor 52 is eliminated, and the source contact 21 of transistor 200 is connected directly to the source terminal 59, gate contact 23 is connected directly to gate terminal 58 and the conductive package base 60 is connected directly to the drain terminal 57 of switch 610. The drain contact 22 of transistor 310 is connected to the conductive package base 60 through drain via 15 without the use of an external wire-bond connector, which can be prone to long-term reliability issues due to high current carrying requirements. Furthermore, without the need for cascode configuration, the large area source contact pad 21 can enable the use of larger diameter source wire-bonds or metal clips which can further reduce the on-resistance of the device and improve reliability.

Figure 6E:
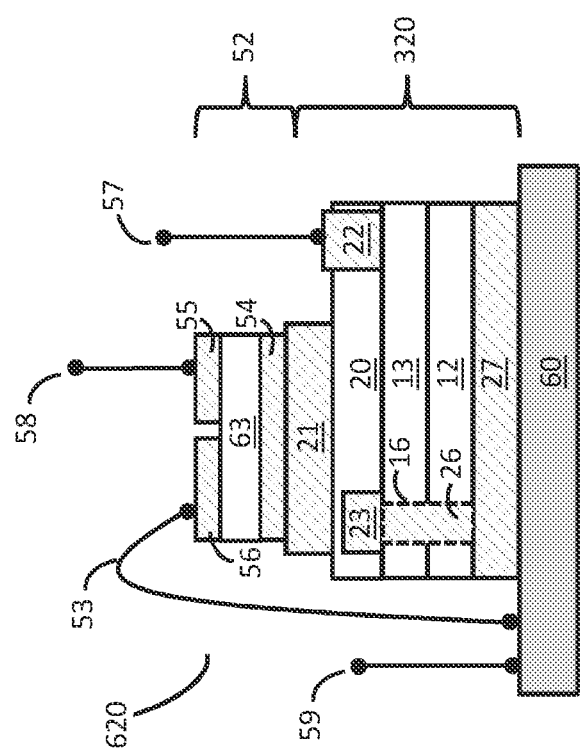
FIGS. 6E, 6F and 6G are a cross-sectional view and plan views, respectively, of a package configuration for a hybrid III-N device with a gate connected through substrate via.

FIG. 6E shows a cross-sectional view of a cascode switch 620 which is similar to the cascode switch 600 expect that the III-N depletion-mode transistor is implemented using device 320 of FIG. 3D. As seen in FIG. 6E, the D-mode transistor 320 includes a gate via 16 which extends through the substrate 12, and metal 26 is formed in the gate via 16 to electrically connect the gate 23 to a gate backmetal layer 27. The gate backmetal layer 27 is electrically connected and physical mounted to the package base 60 through solder, epoxy, or another suitable material. The package base 60 is connected to the source terminal 59 of cascode switch 620. A source contact 56 is connected to the package base 60 with a connector 53. A gate contact 55 of the E-mode transistor 52 is connected to the gate terminal 58 of cascode switch 620. The drain contact 22 of the D-mode transistor 320 is connected to the drain terminal 57 of the cascode switch 620.

Figure 6F:
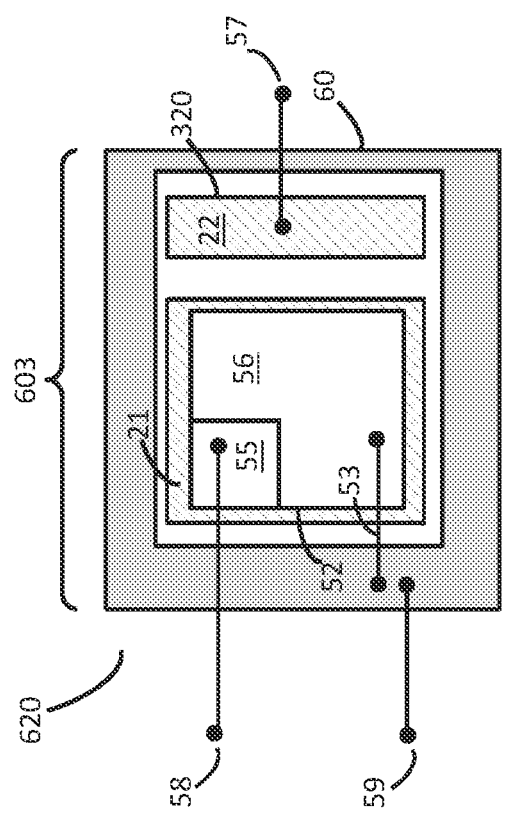
Figure 6G:
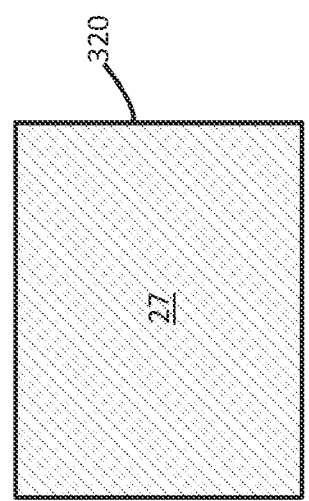

FIG. 6F is a front side plan view of cascode switch 620 which is implemented into a single discrete electronic component package 603. FIG. 6G is a backside plan view of D-mode device 320 of switch 620 which shows the backside metallization which is the gate connected backmetal 27. As seen in FIG. 6E-6G, the gate contact 23 is electrically connected to the conductive package base 60 without the use of an external wire-bond connector, which can reduce switching inductance and reduce package complexity.

Figure 7A:
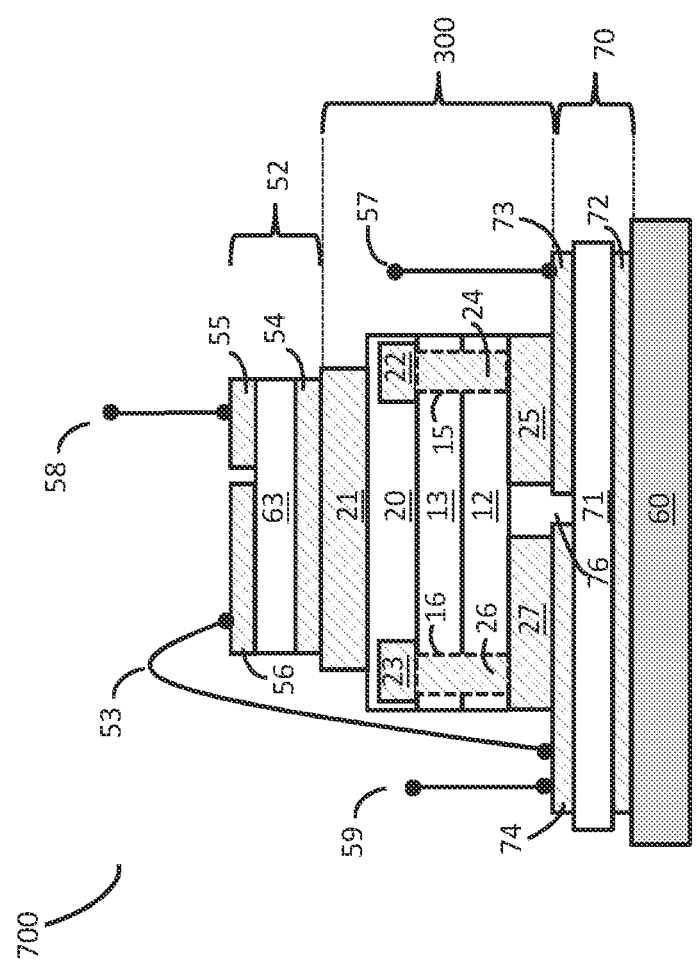
FIGS. 7A-7E are cross-sectional and plan views of package configurations for a hybrid III-N device with a multiple connected through substrate vias.
Figure 7B:
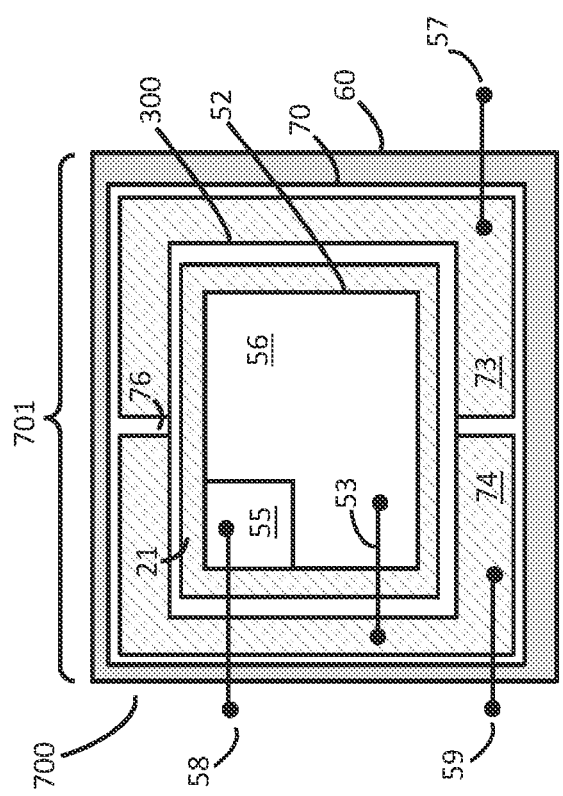

FIG. 7A shows a cross-sectional view of a cascode switch 700 which is similar to the cascode switch 500 of FIG. 5A expect that the III-N depletion-mode transistor is implemented using device 300 (or device 310) of FIGS. 3A and 3B. Cascode switch 700 is implemented into a discrete electronic component package 701, as shown in FIG. 7B. As seen in FIG. 7A, the D-mode transistor 300 of cascode switch 700 includes a drain via 15 which extends through the substrate 12, and a metal 24 is formed in the drain via 15 to electrically connect the drain 22 to the drain backmetal 25. Cascode switch 700 further includes a gate via 16 which extends through the substrate 12, and a metal 26 is formed in the gate via 16 to electrically connect the gate 23 to the gate backmetal 27. Cascode switch 700 can include a patterned shim, such as a direct bonded copper substrate 70 (i.e., DBC substrate) which includes a first metal layer formed on a top side of insulating substrate 71, for example an AlN shim, and a second metal layer 72 on a backside of the insulating substrate 71. The first metal layer has at least a first portion 73 which is electrically connected to drain backmetal 25 and a second portion 74 which is electrically connected to gate backmetal 27. The first metal layer can be a continuous metal layer which is patterned and removed in the desired area to form trench 76 between the first portion 73 and the second portion 74 of the first metal layer. The second metal layer 72 can be directly mounted to the conductive package base 60. The drain and gate backmetal layers 25 and 27 are electrically connected and physical mounted to the first portion 73 and the second portion 74 of DBC 70, respectively, through solder, epoxy, or another suitable material.

Figure 7C:
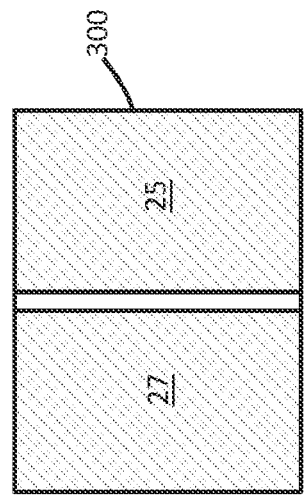

FIG. 7B is a front side plan view of cascode switch 700 which is implemented into a discrete electronic package 701. Drain terminal 57 of cascode switch 700 is connected to the first portion 73 of DBC 70. Source terminal 59 of cascode switch 700 is connected to the second portion 74 of DBC 70. Gate terminal 58 of cascode switch 700 is connected to the gate contact 55 of the low-voltage E-mode transistor 52. FIG. 7C is a backside plan view of D-mode device 300 used in package 701 which shows the backside metallization which is the drain backmetal 25 and the gate backmetal layer 27. As seen in FIGS. 7A-7C, the drain contact 22 is electrically connected to the first portion 73 of DBC 70 and the gate contact 23 of the D-mode device 51 is electrically connected to the second portion 74 of DBC 70 without the use of external wire connectors.

Figure 7D:
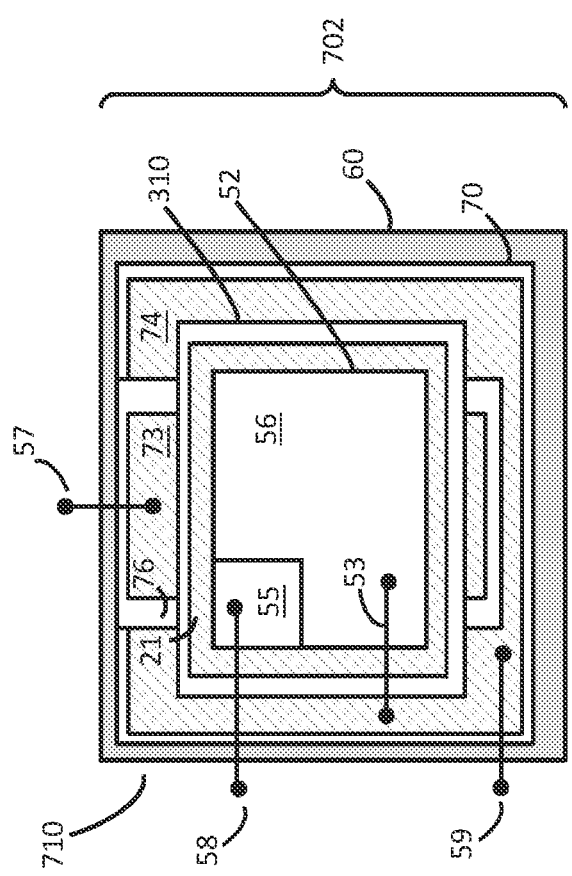
Figure 7E:
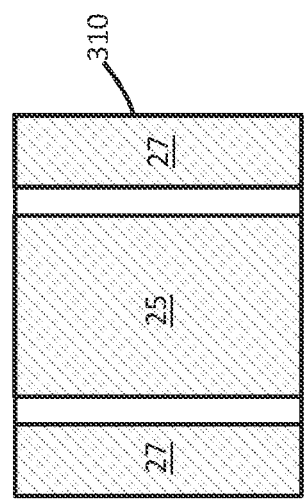

FIG. 7D is a front side plan view of cascode switch 710 which is similar to cascode switch 700 except that the III-N depletion-mode transistor is implemented into discrete component package 702 using device 310 of FIG. 3C. As discussed in device 310 of FIG. 3C, the drain via 15 is formed in an area of the device which is inside the active area 31 and the gate via 16 is formed in an area of the device which is outside the active area 31. This configuration allows for the drain backmetal 25 to be formed in the middle of the device 310 and the gate backmetal 27 to be formed at the edges of device 310, as shown in FIG. 7E. As seen in FIG. 7D, the trench 76 of DBC 70 is configured to allow the first portion 73 of DBC 70 to be connected to the drain backmetal layer 25 in the middle of device 310, and the gate backmetal 27 can contact the second portion 74 of DBC 70 near the edges of device 310.

Although by utilizing the DBC substrate 70 the devices 700 and 710 have added complexity compared to the device 600 of FIGS. 6A-6C (which is directly mounted to the conductive package base 60), there are other advantages which are present. For example, by forming the gate terminal connection and the drain terminal connection for both the gate contact 23 and the drain contact 22 on a side of the substrate 12 opposite the III-N material structure 12, the entire top surface of the D-mode III-N transistor 300/310 can be utilized to maximize the size of the source contact 21 without having to allocate any area for the gate and/or drain wire-bonds. Having a larger area source contact 21 allows increase of the size of the low-voltage E-mode transistor 52, and in turn reduction the total on-resistance of the cascode switch 700 and 710 compared to cascode switch 600.

Figure 8A:
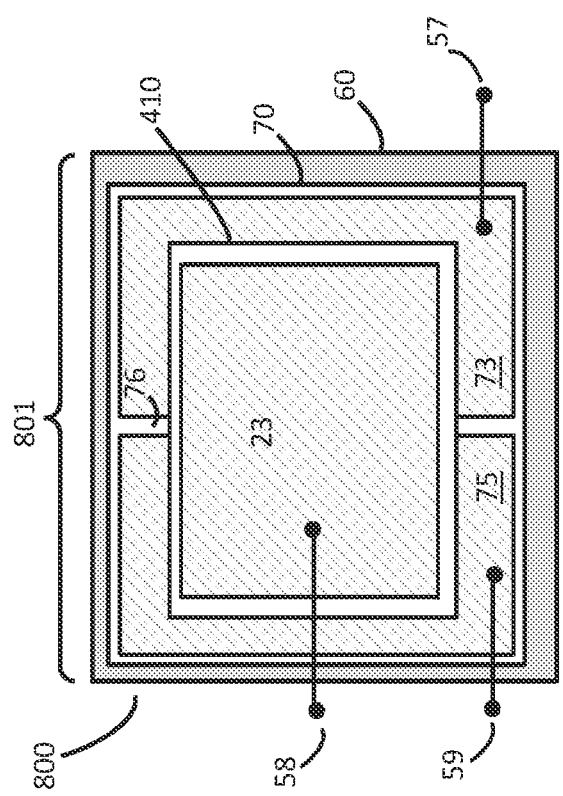
FIGS. 8A-8D are plan views of package configurations for an enhancement-mode III-N device with a multiple connected through substrate vias.
Figure 8B:
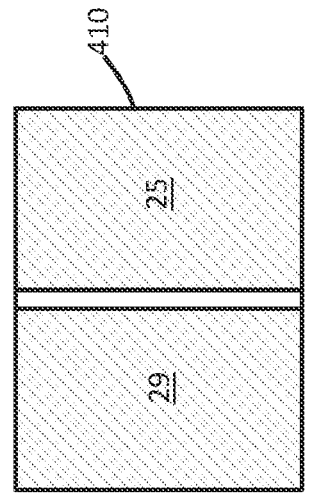

FIG. 8A is a frontside plan view of switch 800 and package 801, which is similar to cascode switch 700 except that package 801 is implemented with III-N device 400 (or 410) of FIG. 4A-4D. Here, the device 400 (or 410) is an enhancement mode transistor instead of a depletion mode transistor. When an enhancement mode transistor is implanted into package 801, the source via 17 is used to connect the source contact 21 of device 400 to the source backmetal 29, as seen in FIG. 8B. Source backmetal 29 is connected to portion 75 of DBC 70, in FIG. 8A. Source terminal 59 is connected to portion 75 of DBC 70. Drain terminal 57 is connected to portion 73 of DBC 70. Gate terminal 58 is connected to gate contact 23 of device 410.

Figure 8C:
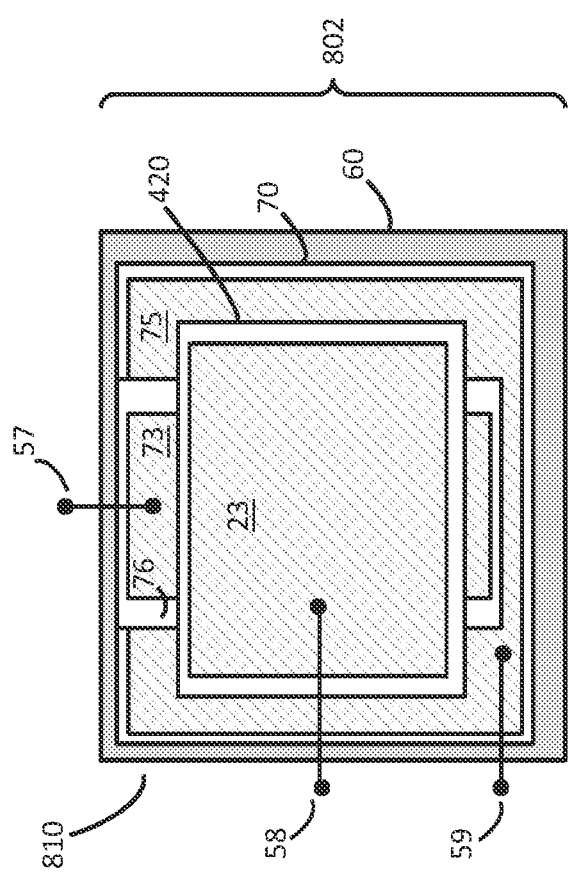

FIG. 8C is a front side plan view of cascode switch 810 which is similar to switch 800 expect that the enhancement-mode III-N transistor is implemented into discrete component package 802 using device 420 of FIG. 4D. As discussed in device 420 of FIG. 4D, the drain via 15 is formed in an area of the device which is within the active area 31, and the source via 17 is formed in an area of the device which is outside the active area 31. This configuration allows for the drain backmetal 25 to be formed in the middle of the device 420 and the source backmetal 29 to be formed at the edge of device 420, as shown in the backside plan view of FIG. 8D. As seen in FIG. 8C, the trench 76 of DBC 70 if configured to allow the first portion 73 of DBC 70 to be connected to the drain backmetal layer 25 in the middle of device 420 and the source backmetal 29 can contact portion 75 of DBC 70 near the edges of device 420.

Figure 9A:
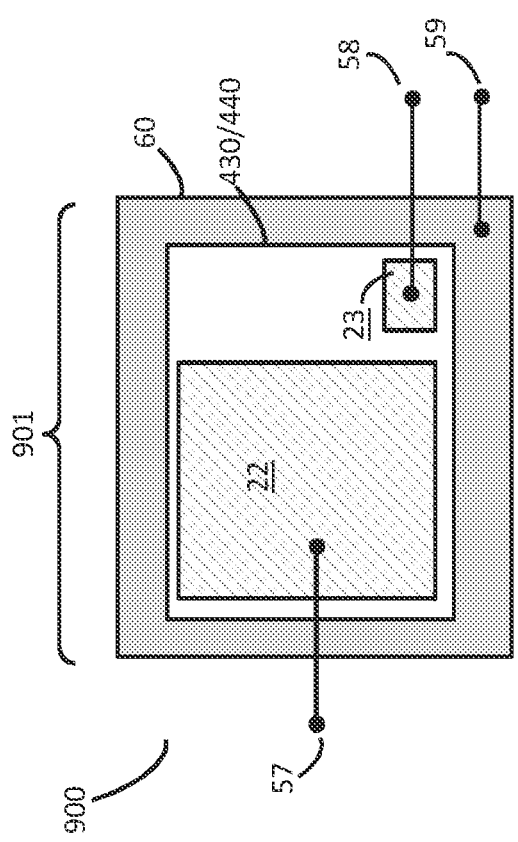
FIGS. 9A and 9B are plan views of package configurations for an enhancement-mode III-N device with a source connected through-epi via.
Figure 9B:
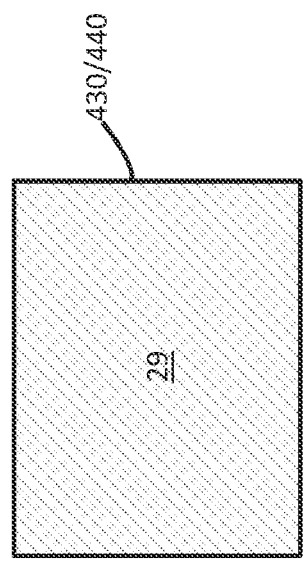

FIG. 9A is a front side plan view of switch 900 implemented into discrete component package 901 using the enhancement-mode III-N device 430 (or device 440) of FIG. 4E or 4G. As discussed in device 430 of FIG. 4E, the source via 17 is used to connect the source contact 21 to the source backmetal layer 29, as shown in the backside plan view of device 430/440 in FIG. 9B. When device 440 is used, the conductive substrate is used to connect the source contact 21 to the backmetal layer 29. The source contact 21 of transistor 430/440 is electrically connected to the conductive package base 60 through source via 17 without the use of an external wire-bond. The source terminal 59 of the discrete package is connected to the conductive package base 60. The drain contact 22 of device 430/440 is connected to the drain terminal 57, and the gate contact 23 of device 430/440 is connected to the gate terminal 58. Furthermore, without the need for cascode configuration to achieve normally-off operation, the large area drain contact pad 22 can enable the use of large diameter drain wire-bonds or metal clips which can further reduce the on-resistance of the device and improve reliability.

The discrete electronic component packages 601, 602, 603, 701, 702, 801, 802, and 901 can be three-terminal packages such as a TO-220 or TO-247. However, alternative embodiments with leadless packages can be used such as a quad flat no-lead (QFN), surface mount device (SMD) or loss-free package (LFPAK). Additionally the components of the packages may be oriented or arranged in a manner which best suits the needs of the designer and package type.

Electronic Modules

Figure 10:
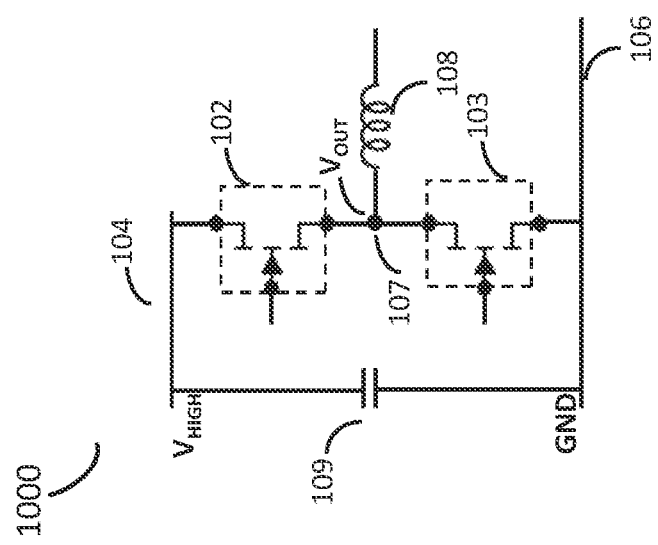
FIG. 10 is a circuit schematic of a half bridge circuit.

One type of circuit topology which is showing promising benefits with III-N high electron mobility transistors (HEMTs) is the half-bridge and full-bridge circuit topology. FIG. 10 shows a half-bridge circuit schematic 1000 which includes a high-side switching transistor 102 and a low-side switching transistor 103. The half-bridge circuit has a high-voltage node 104 ($V_{HIGH}$) and a low-voltage or ground node 106 (GND). An output node 107 ($V_{OUT}$) of the half bridge, which is between the source of the high-side transistor 102 and the drain of the low-side transistor 103, is configured to be connected to a load motor (inductive component 108). In order to ensure proper operation of the circuit in FIG. 10, the DC high voltage node 104 must be maintained as an AC ground. That is, node 104 can be capacitively coupled to DC ground 106 by connecting one terminal of a capacitor 109 to the high voltage node 104 and the other terminal of the capacitor to ground 106. The half-bridge circuit 1000 of FIG. 10 can be formed using the previously described III-N transistors 200, 210, 300, 310, 400, 410, 420, 430, and 440 as the high-side transistor 102 and/or the low-side transistor 103.

Described herein are integrated electronic modules that are suitable for maintaining low levels of EMI, thereby allowing for higher circuit stability and improved performance. The design of the modules herein, coupled with the design of the switches used in the modules, can result in reduced inductances as well as other circuit parasitic reductions, thereby leading to the above stated improvements in performance and reliability. The electronic modules can also have a reduced size and can be easier to assemble than conventional modules, thereby allowing for lower production costs.

Figure 11A:
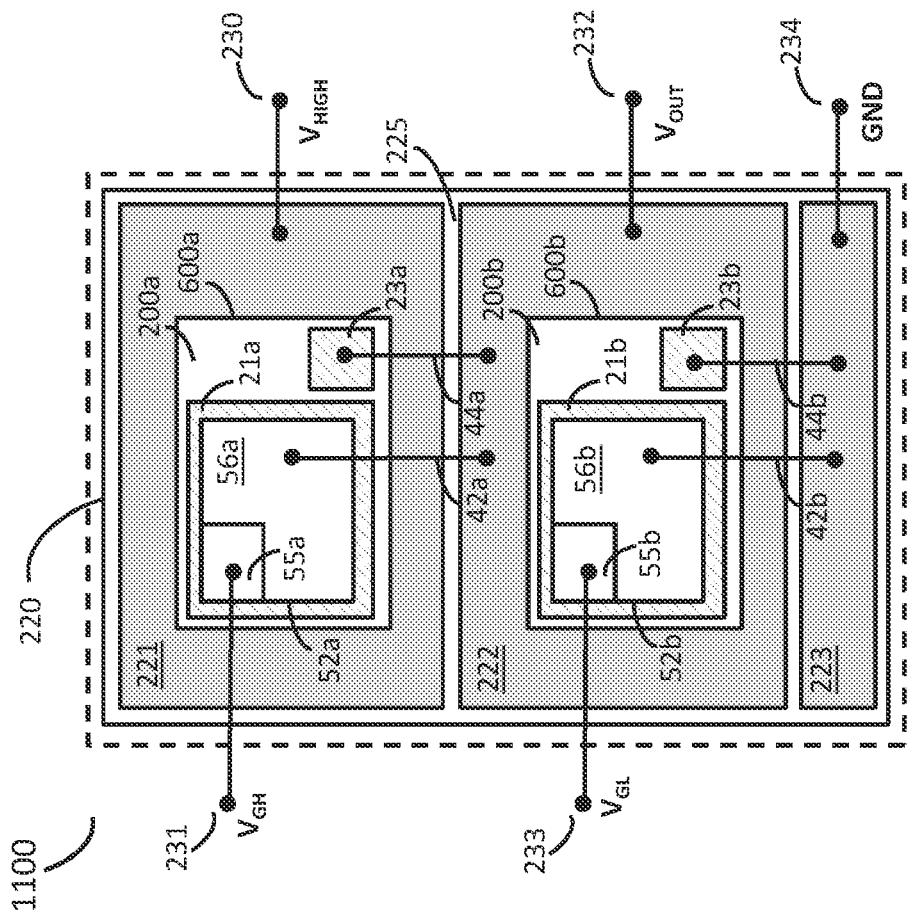
FIG. 11A is a plan view of an electronic module featuring a half bridge.
Figure 11B:
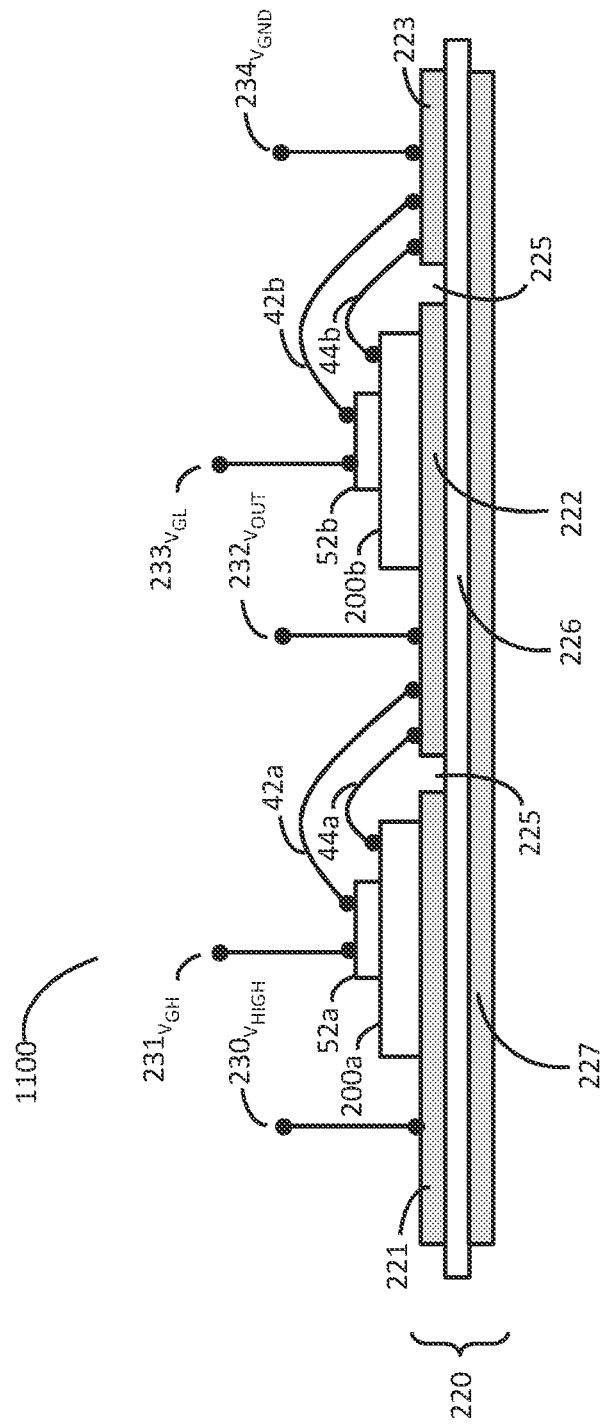
FIG. 11B is a cross sectional view along a portion of the electronic module of FIG. 11A.

FIGS. 11A and 11B show a plan view and a cross-sectional view, respectively, of an electronic module 1100. Module 1100 includes cascode switches 600a and 600b connected in the half bridge configuration shown in FIG. 10. The plan view and the cross-sectional view of the cascode switch 600 that can be used for each of switches 600a and 600b is previously described and shown in FIGS. 6A-6C (other cascode configurations could alternatively be used in place of cascode switch 600). The module 1100 includes a direct bonded copper (DBC) substrate 220 (best seen in FIG. 11B), which can be a base substrate for the module. A DBC substrate is formed by direct bonding of pure copper in a high temperature melting and diffusion process to a ceramic insulator such as AlN or $Al_2O_3$. The DBC substrate 220 includes an insulating (e.g., ceramic or AlN) substrate 226, on which a top metal layer (e.g., copper or nickel) is patterned into at least a first portion 221 that functions as a high-voltage plate, a second portion 222 that functions as an output plate, and a third portion 223 which functions as a ground plate. Portions 221, 222, and 223 are each electrically isolated from one another by a trench 225 formed through the top metal layer.

As seen in FIG. 11B, the DBC substrate can include a backmetal layer 227 (e.g., copper or nickel) on an opposite side of the insulating substrate 226 from the top metal layer (221/222/223). The ground plate 223 can optionally be electrically connected to the backmetal layer 227 by forming metal via-holes through the insulating substrate 226 (not shown). High side switch 600a is mounted directly on the high-voltage plate 221, and low side switch 600b is mounted directly on the output plate 222.

Referring back to FIG. 11A, on the high side switch 600a, the drain contact 22 of the D-mode transistor 200a is electrically connected to high-voltage plate 221 by the drain via 15 connected to the drain backmetal 25. The gate contact 23a of the D-mode transistor 200a and the source contact 56a of the E-mode transistor 52a are both electrically connected to the output plate 222 via wire connectors 44a and 42a, respectively. For the low-side cascode switch 600b, the drain contact 22 of the D-mode transistor 200b is electrically connected to output plate 222 by the drain via 15 connected to the drain backmetal 25. The gate contact 23b of the D-mode transistor 200b and the source contact 56b of the E-mode transistor 52b are both electrically connected to the ground plate 223 via wire connectors 44b and 42b, respectively.

The electronic module 1100 can optionally include a package in which the electronic component is encased, the package including a high-side gate input lead 231 ($V_{GH}$), a low-side gate input lead 233 ($V_{GL}$), a high-voltage lead 230, a ground lead 234, and an output lead 232. The high-side gate input lead 231 is connected to the gate contact 55a of the E-mode transistor 52a of high side switch 600a, the low-side gate input lead 233 is connected to the gate contact 55b of the E-mode transistor 52b of low side switch 600b, the high-voltage lead 230 is connected to the high-voltage plate 221, the ground lead 234 is connected to the ground plate 223, and the output lead 232 is connected to the output plate 222.

In order to ensure proper operation of the half bridge circuit formed by the electronic module 110 of FIGS. 11A and 11B, the high voltage node 230 should be maintained as an AC ground. Although not shown for simplicity in FIG. 11A, the node 230 can be capacitively coupled to the ground lead 234 by connecting a first terminal of a capacitor to the high-voltage plate 221 and a second terminal of the capacitor the ground plate 223 (shown in FIG. 15B as capacitor 75). The capacitor can extend laterally over the trench 225. The capacitor can be a hybrid capacitor which can include a resistive component and a capacitive component. The resistive component can be greater than 0.1 ohms and the capacitive component can be greater than 0.1 nF.

The design of the switch and associated module can be a critical factor for determining the performance of the high-side switch 102 and/or the low-side switch 103 during various modes of operation. By implementing cascode switch 600b into half bridge module 1000 as the low-side device 103, and thereby eliminating the need for an external drain wire connection between the D-mode transistor 200b of cascode switch 600b and the output plate 222 in module 1000 (since the D-mode transistor 200a drain is connected to the output plate 222 through drain via 15), the parasitic inductance in the half bridge module is reduced. This in turn reduces the ringing experienced at cascode switch 600b during switching operation.

In addition, the high-side switch 600a can be operated in reverse conduction mode during certain switching sequences. Here, the drain connection between the D-mode III-N transistor 200a of cascode switch 600a and the high-voltage plate 221 is connected through the via-hole 15, and parasitic inductance in the electronic module is further reduced. This further reduces the voltage spike and ringing experienced by the cascode switch 600a when switching into reverse conduction mode.

Figure 11C:
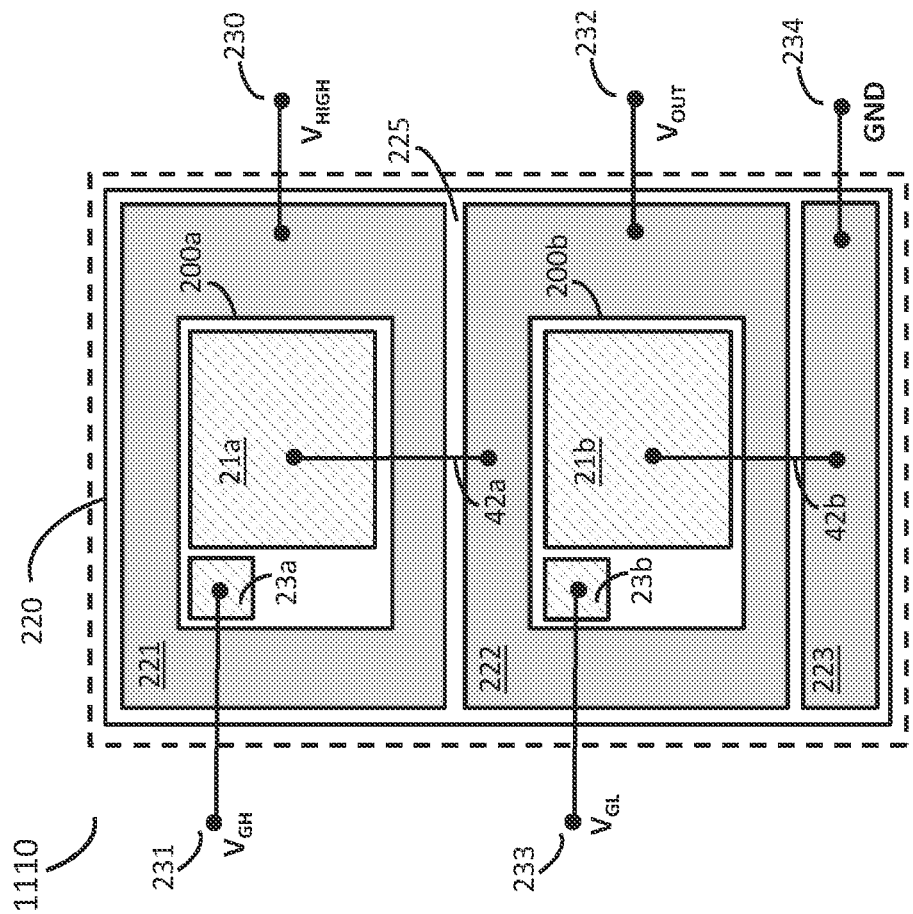
FIGS. 11C and 11D are plan views of electronic modules featuring a half bridge.

A top view of an integrated electronic module 1110 is shown in FIG. 11C, which is similar to electronic module 1100 of FIG. 11A. However, in module 1110 the high-side switch 200a and the low-side switch 200b are E-mode III-N transistors, such that a cascode switch (such as switch 600) is not required for normally-off operation. The plan view and the cross-sectional view of the 200 that can be used for each of switches 200a and 200b is previously described and shown in FIGS. 2A and 2B. When high-side switch 200a is an E-mode III-N transistor, the drain contact 22 of the E-mode transistor 200a is electrically connected to high-voltage plate 221 by the drain via 15 connected to the drain backmetal 25. The gate contact 23a of the E-mode transistor 200a is connected to the high-side gate input lead 231 and the source contact 21a of the E-mode transistor 200a is electrically connected to the output plate 222 via wire connector 42a. When low-side switch 200b is an enhancement-mode III-N transistor, the drain contact 22 of the transistor 200b is electrically connected to output plate 222 by the drain via 15 connected to the drain backmetal 25. The gate contact 23b of transistor 200b is connected to the low-side gate input lead 233 and the source contact 21b of transistor 200b is electrically connected to the ground plate 223 via wire connector 42b.

Figure 11D:
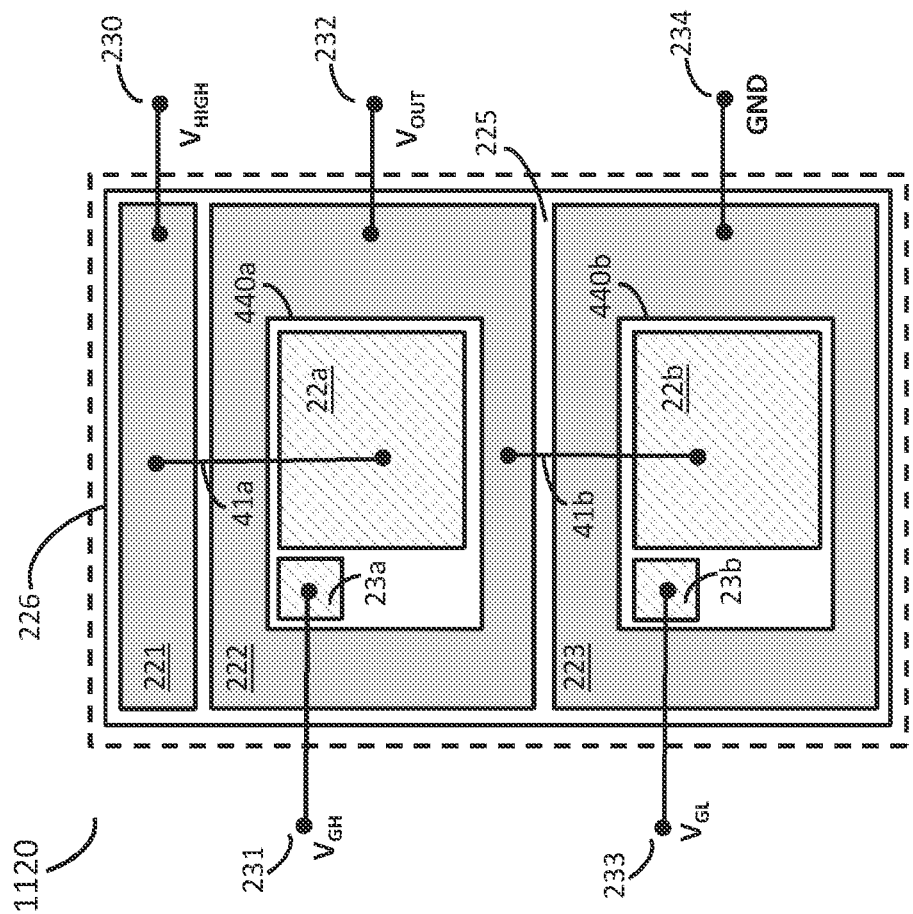

A top view of an integrated electronic module 1120 is shown in FIG. 11D, which is similar to electronic module 1100 of FIG. 11A. However, in module 1120 the enhancement-mode device 430 or 440 of FIG. 4F or 4G, respectively, is used as the high-side switch and the low-side switch. For simplicity, FIG. 11D is illustrated with high-side switch 440a and low-side switch 440b, which is similar to transistor 440 of FIG. 4G. DBC 226 includes a high voltage plate 221, an output plate 222 and a ground plate 223 each electrically isolated from another by trench 225 formed into the DBC. When the E-mode switch 440 is used as the high-side switch 440a, the drain contact 22a is connected to the high-voltage plate 221 by a connector 41a. The source contact of switch 440a is electrically connected to the output plate 222 by the source via 17 which is electrically connected to the source backmetal 29. The gate contact 23a is connected to the high-side gate input lead 231. When the E-mode switch 440 is used as the low side switch 440b, the drain contact 22b is connected to the output plate 222 by a connector 41b. The source contact of switch 440b is electrically connected to the ground plate 223 by the source via 17 which is electrically connected to the source backmetal 29. The gate contact 23b is connected to the low-side gate input lead 233.

Figure 12A:
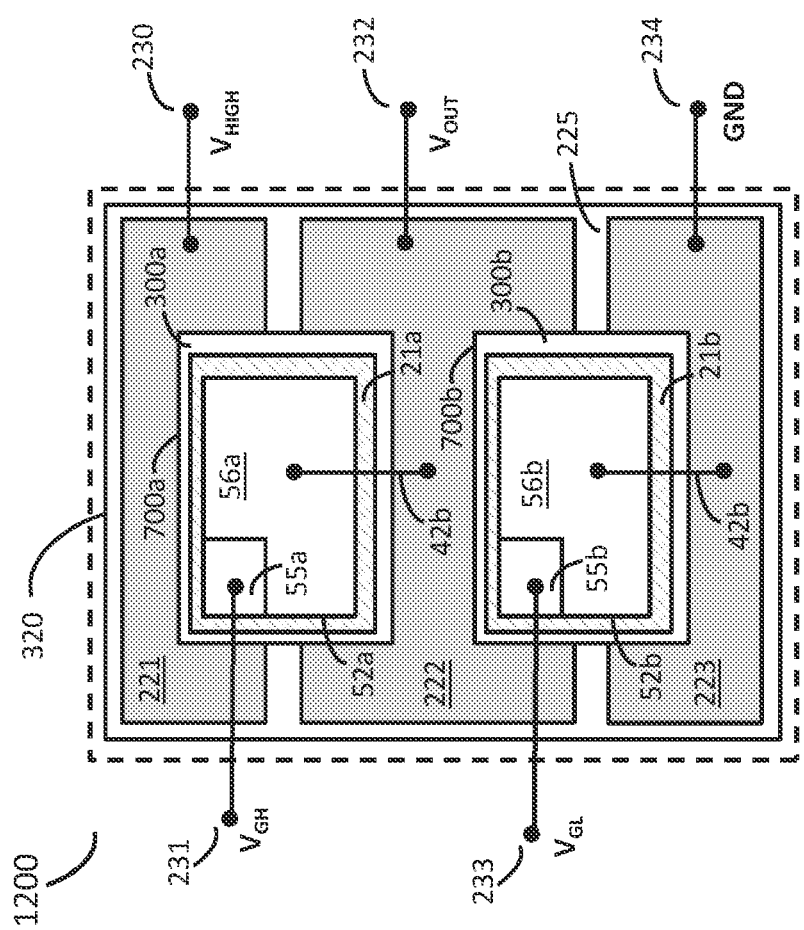
FIGS. 12A and 12B are plan views of electronic modules featuring a half bridge.

A top view of an integrated electronic module 1200 is shown in FIG. 12A, which is similar to electronic module 1100 of FIG. 11A. However, module 1200 includes cascode switches 700a and 700b connected in the half bridge configuration shown in FIG. 12A. The plan view and the cross-sectional view of the cascode switch 700 that can be used for each of switches 700a and 700b is previously described and shown in FIGS. 7A and 7B. The module 1200 includes a direct bonded copper (DBC) substrate 320, which can be a base substrate for the module. For the high side switch 700a, the drain contact 22 of the D-mode transistor 300a is electrically connected to high-voltage plate 221 by the drain via 15 connected to the drain backmetal 25. The gate contact 23 of the D-mode transistor 300a is electrically connected to output plate 222 by the gate via 16 connected to the gate backmetal 27. The source contact 56a of the E-mode transistor 52a is electrically connected to the output plate 222 via wire connector 42a. For the low-side cascode switch 700b, the drain contact 22 of the D-mode transistor 300b is electrically connected to output plate 222 by the drain via 15 connected to the drain backmetal 25. The gate contact 23 of the D-mode transistor 300b is electrically connected to ground plate 223 by the gate via 16 connected to the gate backmetal 27. The source contact 56b of the E-mode transistor 52b is electrically connected to the ground plate 223 via wire connectors 42b. The half-bridge module 1200 of FIG. 12A can be advantageous over the half-bridge module 1100 of FIG. 11A by eliminating the gate wire connector 44a and 44b from high-side switch 600a and low-side switch 600b, respectively, which further reduces circuit switching inductance and packaging complexity.

Figure 12B:
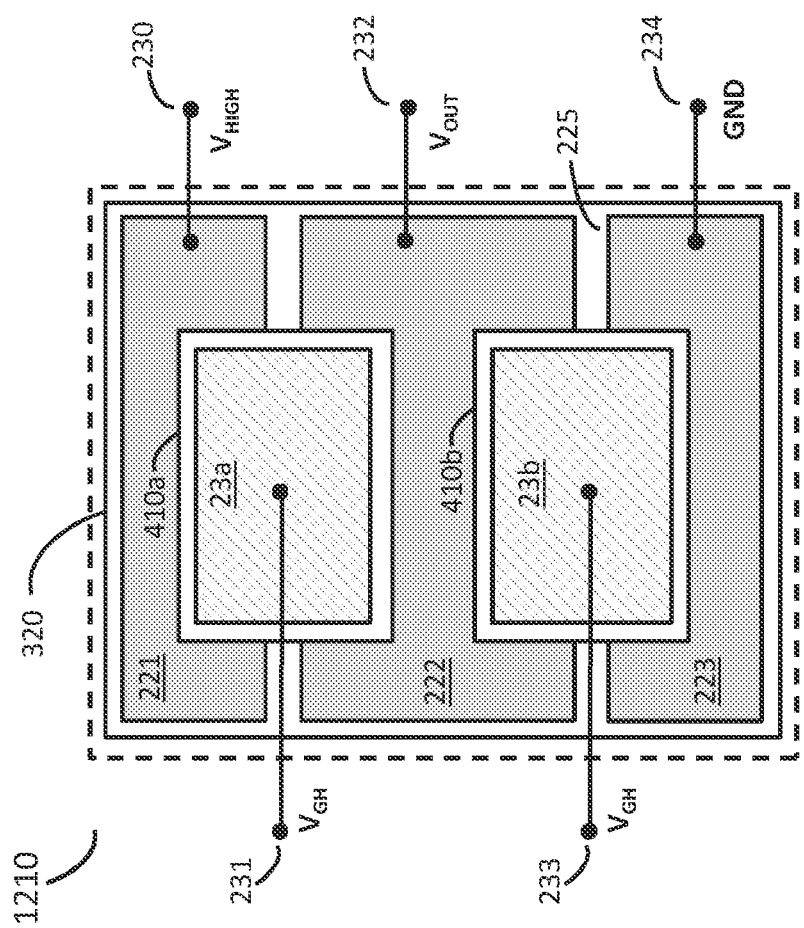
Figure 12C:
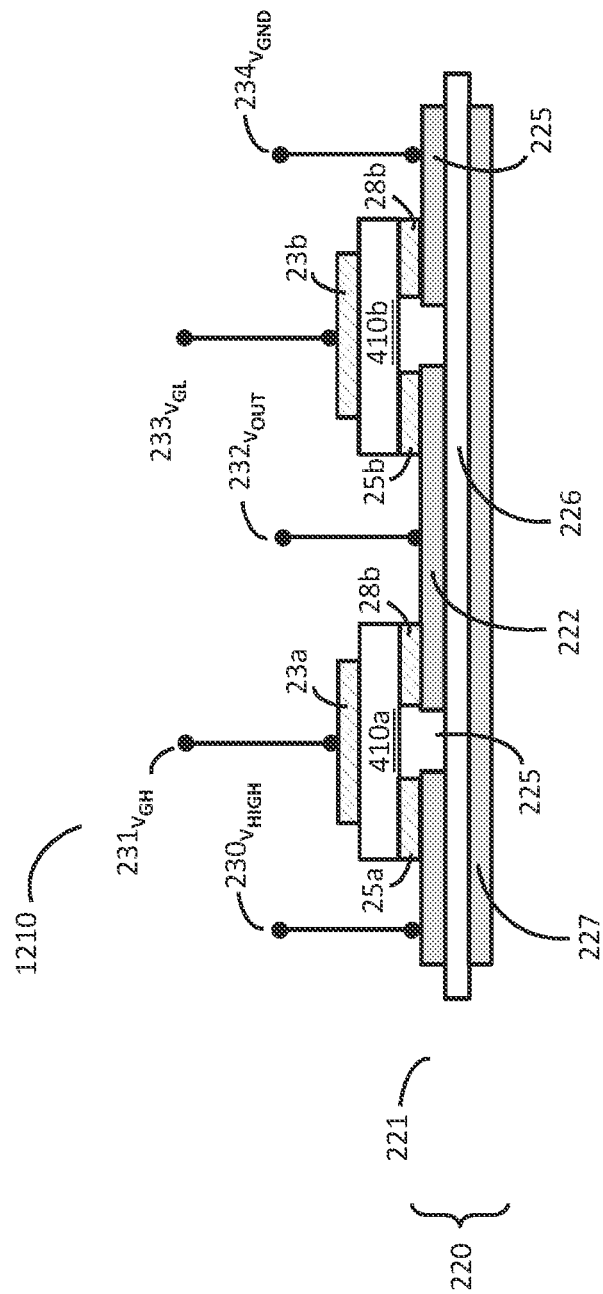
FIG. 12C is a cross-sectional view along a portion of the electronic module of FIG. 12B.

A top view and cross-sectional view of an integrated electronic module 1210 is shown in FIG. 12B and FIG. 12C, respectively, which is similar to electronic module 1200 of FIG. 12A. However, in module 1210 the high-side switch 410a and the low-side switch 410b are enhancement-mode III-N transistors, such that a cascode switch (such as switch 700) is not required for normally-off operation. The plan view and the cross-sectional view of the device 400 or 410 that can be used for each of switches 410a and/or 410b is previously described and shown in FIGS. 4A and 4D. When high-side switch 410a is an enhancement-mode III-N transistor, the drain contact 22 of the transistor 410a is electrically connected to high-voltage plate 221 by the drain via 15 connected to the drain backmetal 25a and the source contact 21 of the transistor 410a is electrically connected to output plate 222 by the source via 17 connected to the source backmetal 28a (best seen in FIG. 12C). The gate contact 23a of the transistor 410a is connected to the high-side gate input lead 231. When low-side switch 410b is an enhancement-mode III-N transistor, the drain contact 22 of the transistor 410b is electrically connected to output plate 222 by the drain via 15 connected to the drain backmetal 25b and the source contact 21 of the transistor 410b is electrically connected to ground plate 223 by the source via 17 connected to the source backmetal 28b. The gate contact 23b of transistor 410b is connected to the low-side gate input lead 233. As seen in FIGS. 12B and 12C, when high-side switch 410a and low-side switch 410b are enhancement-mode III-N transistors, module 1210 can be implemented without the use of any external wire connectors configured to high-voltage plate 221, the output plate 222 or the ground plate 223 from the high-side switch 410a or the low-side switch 410b. This can greatly reduce the module on-resistance, switching inductance and packaging complexity leading to improved performance with reduced packaging costs.

Figure 13A:
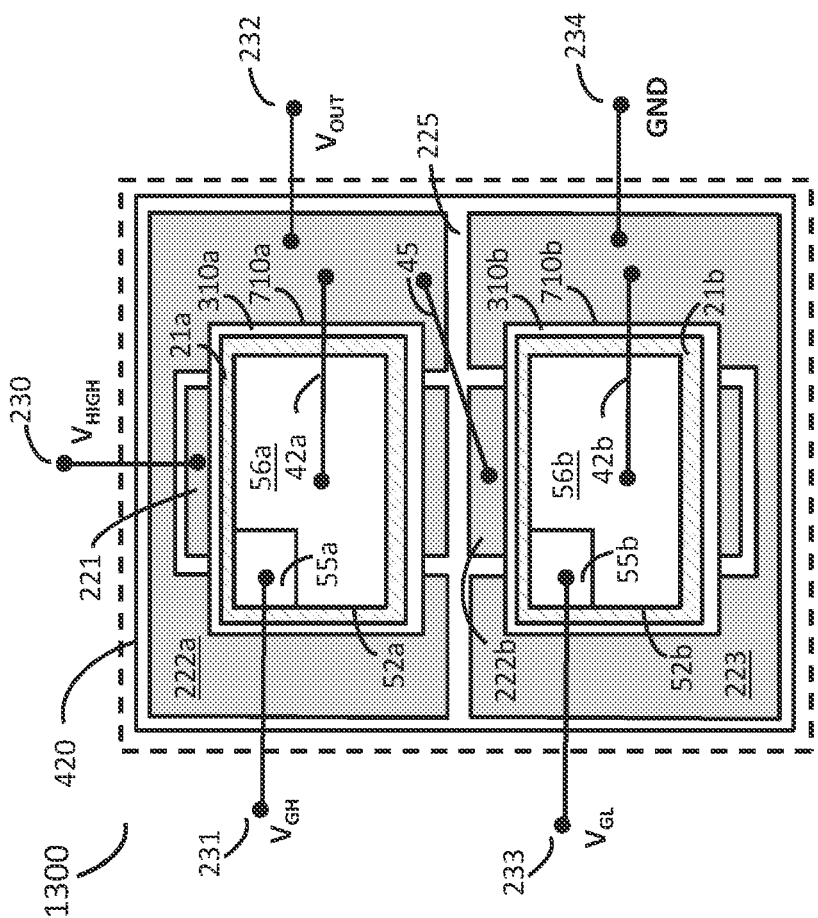
FIGS. 13A and 13B are plan views of electronic modules featuring a half bridge.

A top view of an integrated electronic module 1300 is shown in FIG. 13A, which is similar to electronic module 1100 of FIG. 11A. However, module 1300 includes cascode switches 710a and 710b connected in the half bridge configuration shown in FIG. 13A. The plan view of the cascode switch 710 that can be used for each of switches 710a and 710b is previously described and shown with respect to FIGS. 7D and 7E. The module 1300 includes a direct bonded copper (DBC) substrate 420, which can be a base substrate for the module 1300. The high-side cascode switch 710a, and the low-side cascode switch 710b are integrated into module 1300 with the DBC substrate 420. For the high side switch 710a, the drain contact 22 of the D-mode transistor 310a is electrically connected to high-voltage plate 221 by the drain via 15 connected to the drain backmetal 25. The gate contact 23 of the D-mode transistor 310a is electrically connected to output plate 222a by the gate via 16 connected to the gate backmetal 27, where the gate backmetal layer 27 is configured on the edge of transistor 310 and drain backmetal 25 is configured in the center of transistor 310 as shown in FIG. 7E. The source contact 56a of the E-mode transistor 52a of switch 710a is electrically connected to the output plate 222a via wire connector 42a. For the low-side cascode switch 700b, the drain contact 22 of the D-mode transistor 310*b* is electrically connected to output plate 222*b* by the drain via 15 connected to the drain backmetal 25. The gate contact 23 of the D-mode transistor 310*b* is electrically connected to ground plate 223 by the gate via 16 connected to the gate backmetal 27, where backmetal 25 and 27 are configured similar to transistor 310*a*. The source contact 56*b* of the E-mode transistor 52*b* of switch 710*b* is electrically connected to the ground plate 223 via wire connectors 42*b*. Output plate 222*a* and output plate 222*b* are electrically connected together with wire connector 45. Although not shown, DBC 420 can be configure such that output plate 222*a* and 22*b* are formed of the same portion of metal layer on DBC 420 such that wire connector 45 is not required.

Figure 8D:
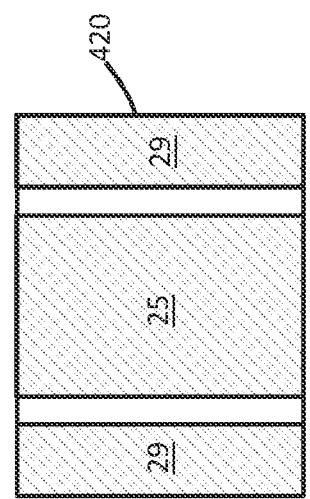
Figure 13B:
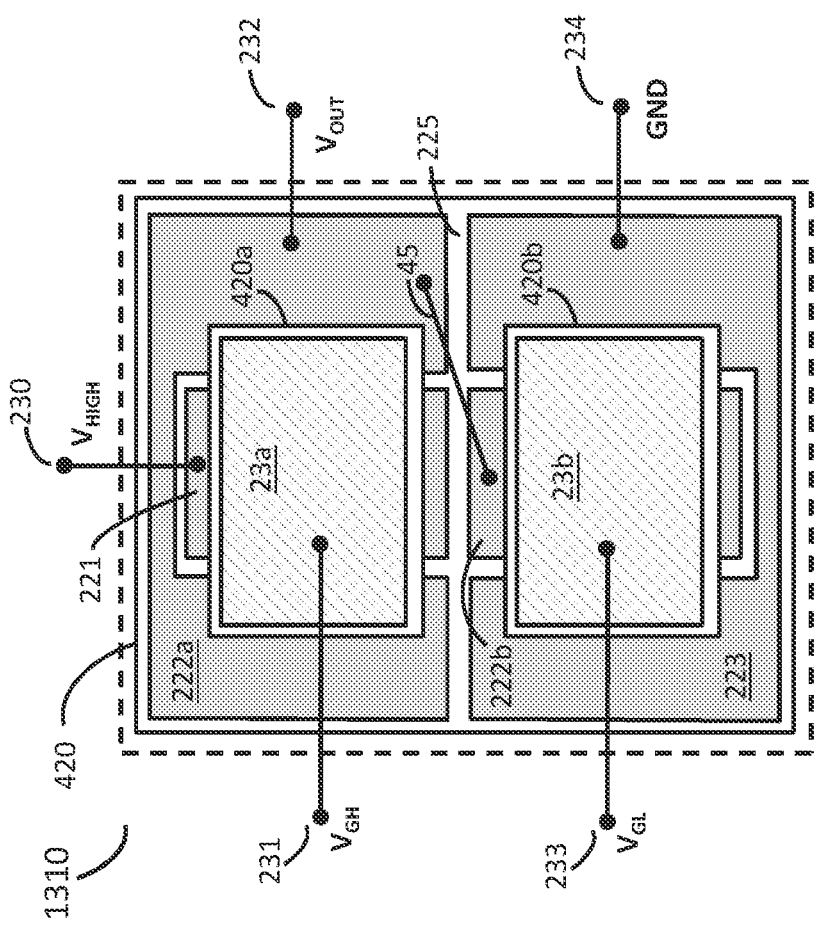

A top view of an integrated electronic module 1310 is shown in FIG. 13B, which is similar to electronic module 1300 of FIG. 13A. However, in module 1310 the high-side switch 420*a* and the low-side switch 420*b* are enhancement-mode III-N transistors, such that a cascode switch (such as switch 710) is not required for normally-off operation. The plan view the transistor 420 that can be used for each of switches 420*a* and/or 420*b* in module 1310 is previously described and shown in FIG. 4D. When high-side switch 420*a* is an E-mode III-N transistor, the drain contact 22 of the transistor 420*a* is electrically connected to high-voltage plate 221 by the drain via 15 connected to the drain backmetal 25. The source contact 21 of the transistor 420*a* is electrically connected to output plate 222*a* by the source via 17 connected to the source backmetal 28, where the source backmetal layer 28 is configured on the edge of transistor 420 and drain backmetal 25 is configured in the center of transistor 420 as shown in FIG. 8D. The gate contact 23*a* of the transistor 420*a* is connected to the high-side gate input lead 231. When low-side switch 420*b* is an E-mode III-N transistor, the drain contact 22 of the transistor 420*b* is electrically connected to output plate 222*b* by the drain via 15 connected to the drain backmetal 25. The source contact 21 of the transistor 420*b* is electrically connected to ground plate 223 by the source via 17 connected to the source backmetal 28, where backmetal 25 and 28 are configured similar to transistor 420*a*. The gate contact 23*b* of transistor 420*b* is connected to the low-side gate input lead 233. Output plate 222*a* and output plate 222*b* are electrically connected together with wire connector 45. Although not shown, DBC 420 can be configured such that output plate 222*a* and 22*b* are formed of the same portion of metal layer on DBC 420 such that wire connector 45 is not required. As seen in FIG. 13B, when high-side switch 420*a* and low-side switch 420*b* are enhancement-mode III-N transistors, module 1310 can be implemented without the use of any external wire connectors configured to high-voltage plate 221, the output plate 222 or the ground plate 223 from the high-side switch 410*a* or the low-side switch 410*b*. This can in-turn further reduce circuit switching inductance and packaging complexity.

A top view of an integrated electronic module 1400 is shown in FIG. 14A, which is similar to electronic module 1100 of FIG. 11A. However, module 1400 includes high-side cascode switch 600*a* and low-side cascode switch 620*b* connected in the half bridge configuration shown in FIG. 14A. The plan view and the cross-sectional view of the cascode switch 600 that can be used for high-side switch 600*a* is previously described and shown with respect to FIGS. 6A-6C. The plan view and cross-sectional view of the cascode switch 620 that can be used for the low-side switch 620*b* is previously described and shown with respect to FIGS. 6E-6G. The module 1400 includes a direct bonded copper (DBC) substrate 520, which can be a base substrate for the module. For the high side switch 600*a*, the drain contact 22 of the D-mode transistor 200*a* is electrically connected to high-voltage plate 221 by the drain via 15 connected to the drain backmetal 25. The gate contact 23 of the D-mode transistor 300*a* and the source contact 56*a* of the E-mode transistor 52*a* is electrically connected to output plate 222 by the connector 44*a* and 42*a*, respectively. For the low-side cascode switch 620*b*, the gate contact 23 of the D-mode transistor 320*b* is electrically connected to ground plate 223 by the gate via 16 connected to the gate backmetal 27. The source contact 56*b* of the E-mode transistor 52*b* is electrically connected to the ground plate 223 via wire connector 42*b*. The drain contact 22*b* of the D-mode transistor 320*b* is connected to the output plate 222 via wire connector 46*b*. The half-bridge module 1400 of FIG. 14A can be advantageous over the half-bridge module 1100 of FIG. 11A by configuring the drain of high-side switch 600*a* to the high-voltage terminal 230 without the use of an external wire and configuring the gate of D-mode transistor 320*b* of low-side switch 620*b* to the ground terminal 234 without the use of an external wire connector.

Figure 14B:
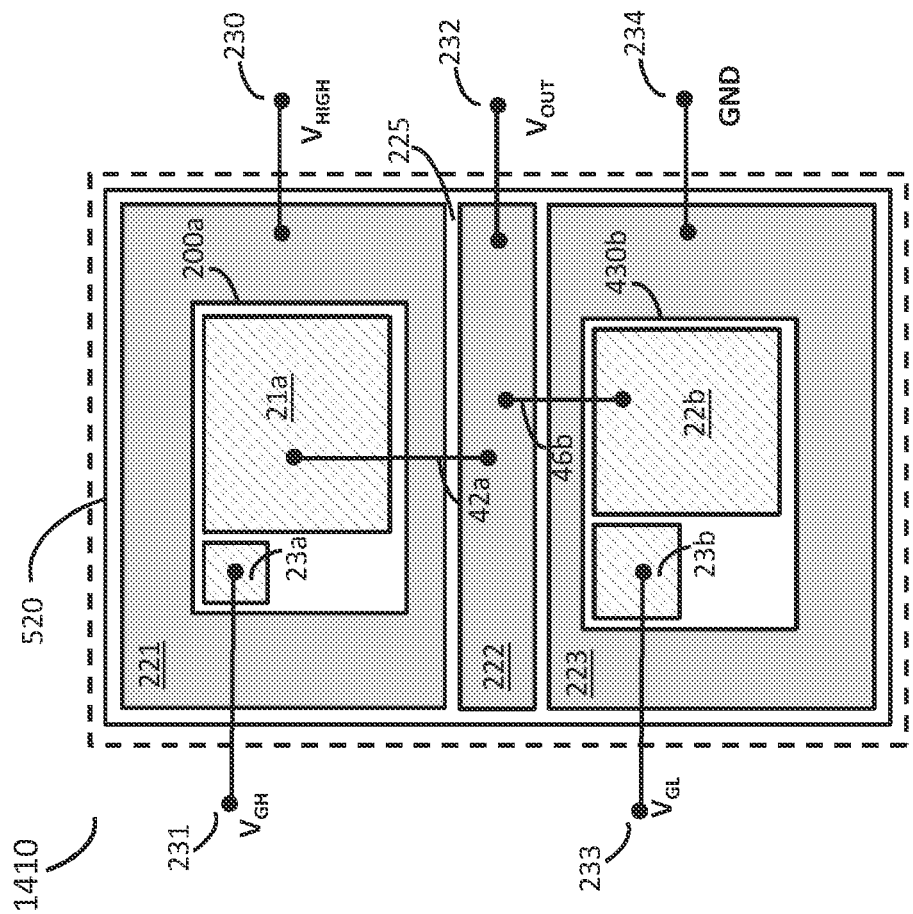

A top view and cross-sectional view of an integrated electronic module 1410 is shown in FIG. 14B, which is similar to electronic module 1400 of FIG. 14A. However, in module 1410 the high-side switch 200*a* and the low-side switch 430*b* are enhancement-mode III-N transistors, such that a cascode switch (such as switches 600*a* and 620*b*) is not required for normally-off operation. The plan view and the cross-sectional view of the transistor 200 or 210 that can be used for the high-side switch 200*a* is previously described and shown with respect to FIGS. 2A-2D. The plan view and the cross-sectional view of transistor 430 (or transistor 440) that can be used for the low-side switch 430*b* is previously described and shown with respect to FIGS. 4E and 4F. When high-side switch 200*a* is an enhancement-mode III-N transistor, the drain contact 22 of the transistor 200*a* is electrically connected to high-voltage plate 221 by the drain via 15 connected to the drain backmetal 25*a*. The source contact 21*a* of the transistor 200*a* is electrically connected to via wire connector 42*a*. The gate contact 23*a* of the transistor 200*a* is connected to the high-side gate input lead 231. When low-side switch 430*b* is an enhancement-mode III-N transistor, the source contact 21 of the transistor 430*b* is electrically connected to ground plate 223 by the source via 17 connected to the source backmetal 28. The drain contact 22*b* of the transistor 430*b* is electrically connected to output plate 223 via wire connector 46*b*. The gate contact 23*b* of transistor 430*b* is connected to the low-side gate input lead 233. As seen in FIG. 14B, when high-side switch 200*aa* and low-side switch 430*b* are enhancement-mode III-N transistors, the drain of the high-side switch can be connected to the high-voltage terminal 230 an the source of the low-side switch can be connected to the ground terminal 234 without the use of an external wire connector. This can reduce the module on-resistance, switching inductance and packaging complexity leading to improved performance with reduced packaging costs.

Figure 15A:
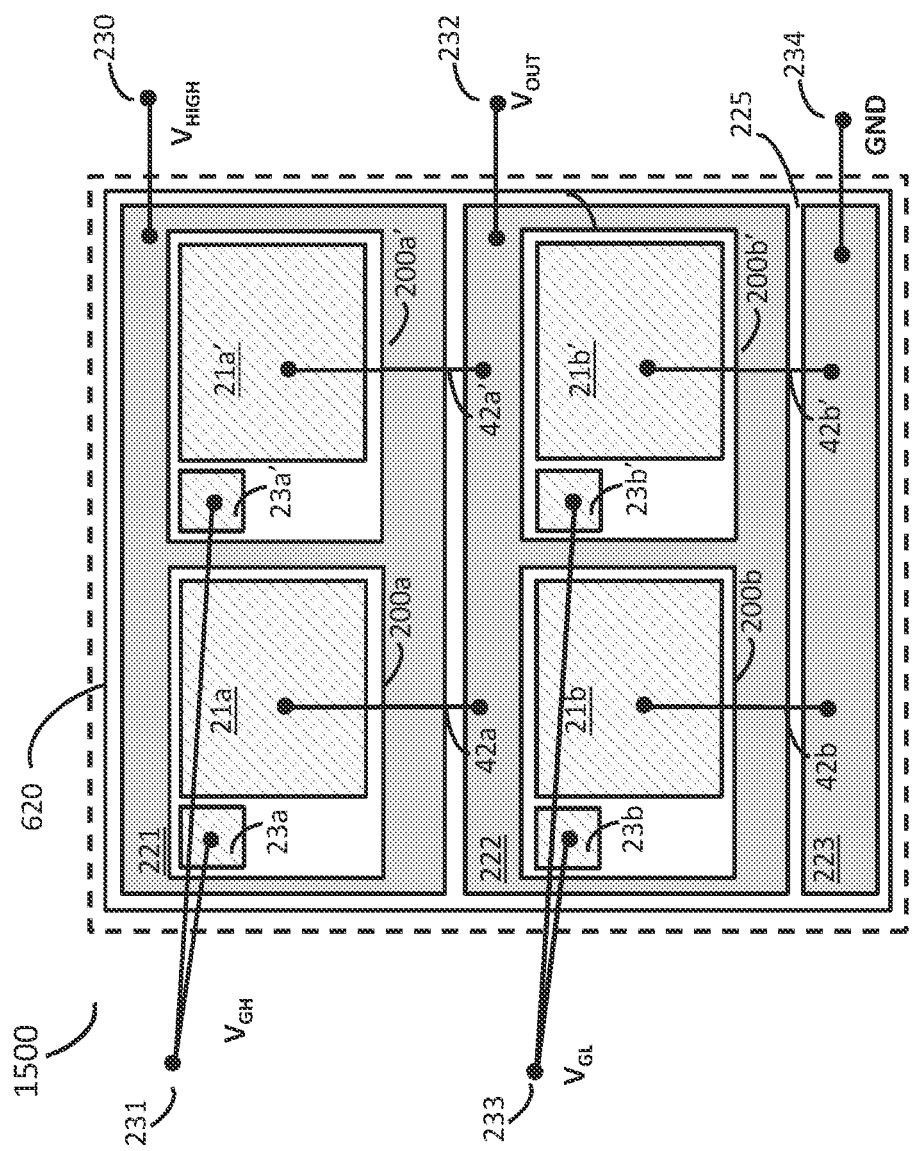
FIG. 15A is a plan view of an electronic module featuring a half bridge with multiple III-N devices connected in parallel.

Although electronic modules 1100-1410 show half-bridge circuit with a single high-side switch and a single low-switch, alternatively any of the electronic modules 1100-1410 can be configured to include two or more half-bridge circuits connected in parallel within the same electronic module. For example, FIG. 15A shows electronic module 1500 (which is similar to module 1110 of FIG. 11C) which includes high-side enhancement-mode III-N device 200*a* and high-side enhancement-mode III-N device 200*a*' (which can be the same III-N device 200 of FIG. 2A) connected in parallel, and low-side enhancement-mode III-N device 200b and low-side enhancement-mode III-N device 200b' (which can be the same III-N device 200 of FIG. 2A) connected in parallel. Alternately, other devices described previously herein can be connected in parallel. High-side gate input terminal 231 is connected to the gate contact 23a of device 200a and to the gate contact 23a' of device 200a'. Low-side gate input terminal 233 is connected to the gate contact 23b of device 200b and to the gate contact 23b' of device 200b'. The high-side and low-side switches are configured in parallel on to DBC 620. The source contact 21a' of device 200a' is connected to the output plate 222 via connector 42a, and the source contact 21b' of device 200b' is connected to the ground plate 223 via connector 42b'. Connecting the two half-bridge circuits in parallel can reduce the on-resistance of the module and provide larger maximum operating power not possible with just a single half-bridge circuit. When the parallel half-bridge circuits are configured into the same electronic module, such as module 1500, the inductance is reduced and the switching synchronization can be ideally matched. Although module 1500 shows two high-side switches and two low-side switches connected in parallel, three or more switches can be connected in parallel to further reduce the on-resistance.

Figure 15B:
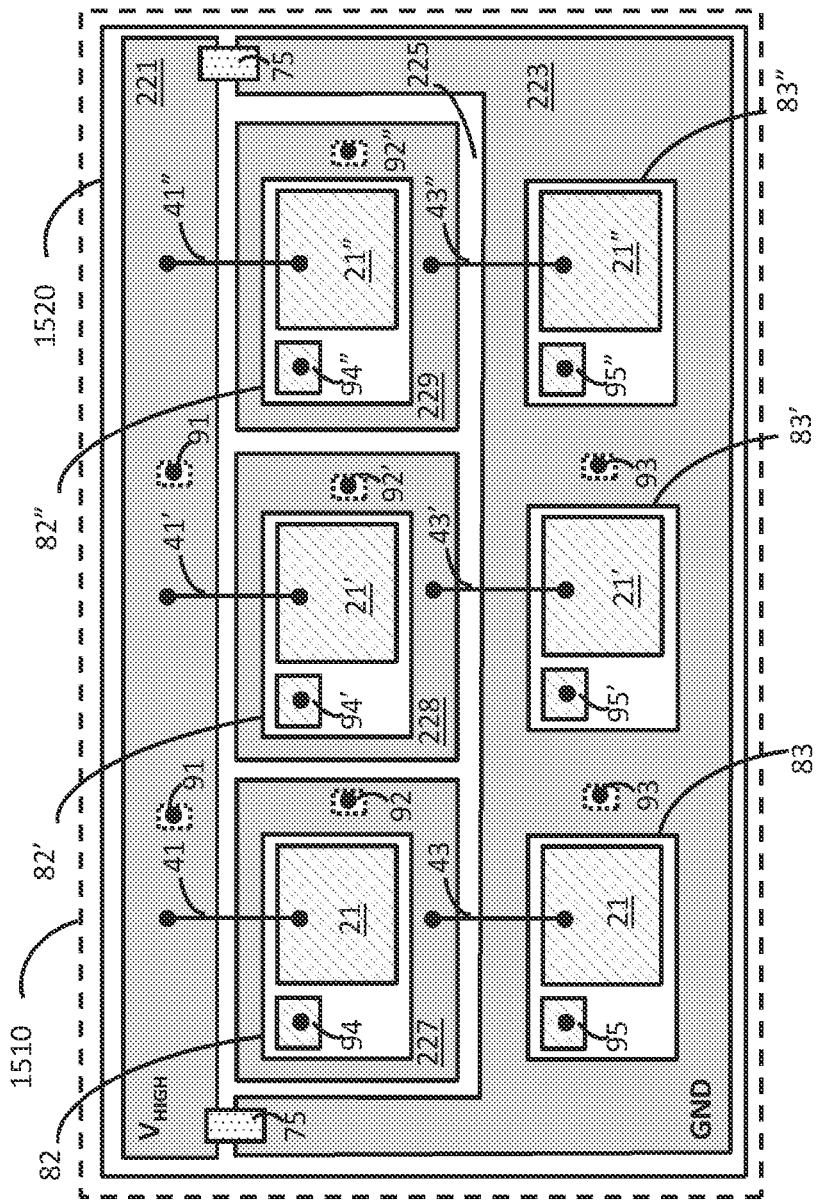
FIG. 15B is a plan view of an electronic module featuring a 3-phase bridge circuit.

Alternatively, any of the electronic modules 1100-1410 which show a half-bridge circuit, can be configured to include a 3-phase full bridge circuit. For an example, FIG. 15B is top view of an electronic module 1510 which includes an integrated 3-phase full bridge in a single package. The first phase half bridge circuit includes high-side switch 82 and low-side switch 83. The second phase half bridge circuit includes high-side switch 82' and low-side switch 83'. The third phase half bridge circuit includes high-side switch 82" and low-side switch 83". All high-side and low side switches of module 1510 can be implemented with, for example, the E-mode switches 430 or 440 of FIG. 4F and FIG. 4G, respectively. Module 1510 includes DBC layer 1520 where the top metal layer of DBC 1510 is patterned into at least five portions separated by a trench 225 which is formed through the top metal layer of DBC 1510. The first portion functions as the high-voltage plate 221 which is configured to be connected to a DC high voltage input through high-voltage lead 91. The second portion functions as output plate 227 which is connected to the output node of the first phase 92. The third portion functions as output plate 228 which is connected to the output node of the second phase 92'. The fourth portion functions as output plate 229 which is connected to the output node of the third phase 92". The fifth portion functions as the ground plate 223 which is configured to be connected to DC ground through ground lead 93.

When the high-side and low-side switches are configured similar to device 440 of FIG. 4G, the substrates of high-side switches 82, 82' and 82" are contacting and electrically connected to output plate 227, 228, and 229 respectively. The substrates of low-side switches 83, 83' and 83" are contacting and electrically connected to ground plate 223 such that all low-side switches are contacting and electrically connected to the same metal portion of the DBC 1520. The substrates of high-side switches 82, 82' and 82" are each electrically isolated from one another. The drain contact 21 of the high-side switch 82 is connected to the high voltage plate 221 with connector 41, the drain contact 21' of high-side switch 82' is connected to the high voltage plate 221 with connector 41', and the drain contact 21" of high-side switch 82" is connected to the high voltage plate 221 with connector 41". The drain contact 21 of low-side switch 83 is connected to first phase output plate 227 with connector 43, the drain contact 21' of low-side switch 83' is connected to second phase output plate 228 with connector 43', and the drain contact 21" of low-side switch 83" is connected to the third phase output plate 229 with connector 43". Optionally, a first terminal of a capacitor 75 can connected to the DC high-voltage plate 221 and a second terminal of the capacitor 75 can be connected to the ground plate 223 such that the DC high-voltage plate 221 is connected to an AC ground.

The gate driver operates module 1500 using three independent gate signals to operate the high-side switches and three independent gate signals to operate the low-side switches. Each independent high-side gate signal from the gate driver can be connected to gate input nodes 94, 94' and 94", while each independent low-side gate signal from the gate driver can be connected to gate input nodes 95, 95' and 95". Integrating the 3-phase full bridge circuit into a single integrated electronic device module 1520 can greatly improve switching efficiency while simultaneously reducing circuit complexity.

Method of Manufacturing

Figure 16:
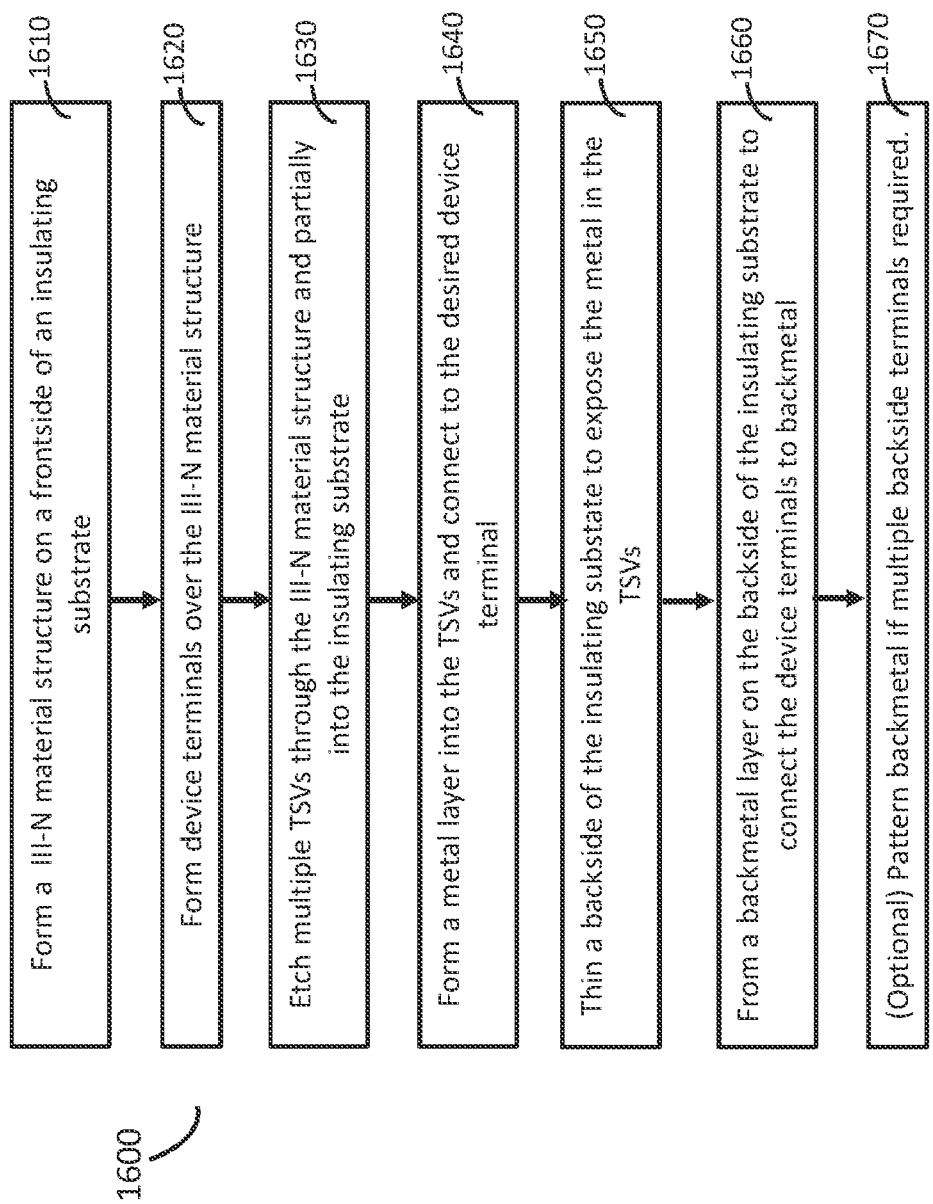
FIG. 16 is a flow diagram of a method of manufacturing a III-N device with through-substrate vias.

FIG. 16 is a flow diagram of an example method 1600 of fabricating the III-N devices of FIGS. 2-4. For purpose of illustration, the method will be described with reference to the example device 300 of FIGS. 3A and 3B. A III-N material structure is formed on a frontside of an insulating substrate (1610). The insulating substrate can, for example, be a sapphire substrate with an initial thickness between 500 um and 1 mm. The sapphire substrate can be placed into a reactor, such as an MOCVD reactor, and the III-N material structure can be deposited within the reactor. The III-N material structure can include a III-N buffer layer, a III-N channel layer, and a III-N barrier layer. The bandgap of the III-N barrier layer is greater than the bandgap of the III-N channel layer, such that a lateral two-dimensional electron gas (2DEG) channel is formed in the III-N material structure and serves as the device channel. The III-N material structure can be formed in a Ga-Polar orientation or the III-N material structure can be formed in a N-Polar orientation, or the III-N material structure can be A-plane GaN which grows on r-plane.

After forming the III-N material structure, device terminals (i.e., source contact, gate contact, and drain contact) are formed over a side of the III-N material structure opposite the substrate (1620). The source contact and/or the drain contact can be electrically connected to the 2DEG channel. In some embodiments, the drain is electrically connected to the 2DEG channel and the source contact is electrically isolated from the 2DEG channel. The gate contact can be used to modulate the current in the device channel. The source contact, the drain contact, and the gate contact can be formed of metal layers consisting of Ti, Al, Ni, Au or other suitable materials.

Multiple vias (i.e., TSVs) are etched through the III-N material structure and partially into the insulating substrate (1630). A protective layer, such as photoresist layer or a hardmask layer, can be selectively patterned across the wafer to expose the desired via locations. The TSVs can be etched by a dry-etching process or a wet-etching process or a combination of both, forming a trench (or recess). For example, the portion of the TSV which extends through the III-N material structure can be dry-etched, and the portion of the TSV which extends into the substrate can be wet-etched. Alternatively to or in-combination with, the TSVs can be achieved using other techniques such as laser ablation. Typically, sapphires substrates have an initial thickness which is greater than the desired final thickness. The initial thickness can be, for example greater than 500 um to minimize wafer breakage when running in a traditional CMOS type facility. However, due to thermal and electrical requirements of the III-N devices, the final desired thickness of the sapphire substrate can be less than 500 um, for example, less than 200 um. The TSVs should be etched into the substrate to a depth which is greater than the desired final thickness of the substrate and less than the initial substrate thickness. For example, if the initial substrate thickness is 700 µm and the desired final thickness of the substrate is 200 µm, the TSVs can be etched into the substrate to a depth which is between 200 µm and 700 µm. The trench depth formed by the TSV etching process can be greater than 10% of the initial substrate thickness. The trench depth formed by the TSV etching process can be 10% greater than the final desired substrate thickness.

In the case of a conductive substrate, such as the device 440 of FIG. 4F, a through-Epi-Via (or TEV) can be used by forming the via-hole through the entire thickness of the III-N material structure, and terminating the via-hole at a top surface of the conductive substrate.

A metal layer is formed in the TSVs and connected to the desired device terminal (1640). In the case of multiple terminal connections, for example the device 300 of FIG. 3A, a continuous metal layer (metal 24,26) can be formed over the frontside of the wafer, for example by metal sputtering, and then patterned and etched to connect the gate contact 23 to metal 16 in the gate via 16, and the drain contact 22 to metal 24 in the drain via 15. The metal layer (24,26) formed into the TSVs can be titanium, nickel, aluminum, gold, copper or any other suitable material.

Next, a backside of the insulating substrate (a side of the substrate opposite the III-N material structure) is thinned, typically by physical grinding, to expose the metal layers (24,26) in the TSVs (1650). The substrate is thinned to the desired final substrate thickness of the device. A backmetal layer is formed on the backside of the insulating substrate to connected to device terminals to the backmetal (1660). The backmetal layer formed into the backside of the insulating substrate can be titanium, nickel, aluminum, gold, copper or any other suitable material. If multiple backside terminals required, the backmetal is patterned (1670). The backside metallization can be deposited by sputter, evaporation, PVD, or any other suitable method. In the example of device 300 or FIG. 3A, the backmetal can be patterned to form gate backmetal 27 which is electrically connected to the gate contact 23, and drain backmetal 25 which is electrically connected to the drain contact 22. Gate backmetal 27 and drain backmetal 25 are separated by trench 32, as shown in FIG. 3B.

Integrated Circuits

Although the electronic modules of FIGS. 12A-14B show two discrete III-N devices configured to form half-bridge circuits, the implementation of an insulating substrate, such as a sapphire substrate, allows for Integrated Circuits (i.e., ICs) formed of multiple devices on a common insulating substrate.

Figure 17A:
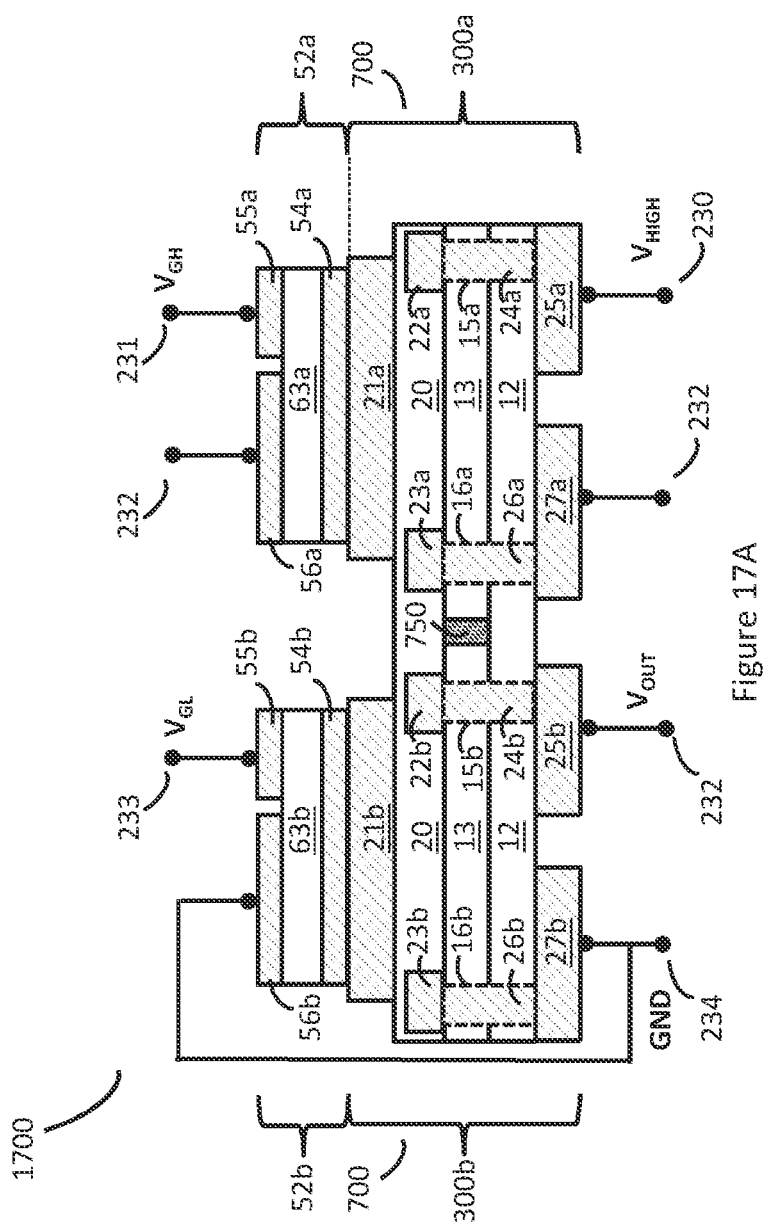

FIG. 17A shows a cross-sectional view of device 1700 which includes a cascode high-side switch (such as switch 700) and a cascode low-side switch (such as switch 700) configured to form a half bridge circuit (such as circuit 1000 of FIG. 10) which is integrated with a single common insulating substrate 12. An isolation region 750 is formed in the III-N material structure 13 between the high-side switch and the low-side switch by ion implantation. Alternatively, the III-N material in region 750 could be physically removed, for example, by dry-etching. The III-N material used to form the high-side switch can be at very different voltage potential compared to the III-N material used to form the low side switch. In a traditional module (such as module 1100 of FIG. 11A), the high-side switch and the low-side switch are physically separated into two separate chips (i.e., devices). This physical separation is used to eliminate any electrically interactions between the high-side and low-side switches. The isolation region 750 ensures that, for an integrated IC, any electrical interactions between the high-side and low-side switches that could affect device performance and switching characteristics, such as leakage currents or electric fields, is eliminated. Although isolation region 750 is shown extending through the entire thickness of the III-N material structure 13, the actual depth of the ion-implantation required for sufficient electrical isolation may vary, for example, the depth of the ion-implantation can extend beyond the 2DEG channel in the III-N material structure but not necessarily through the entire thickness of the III-N buffer layer.

Figure 17B:
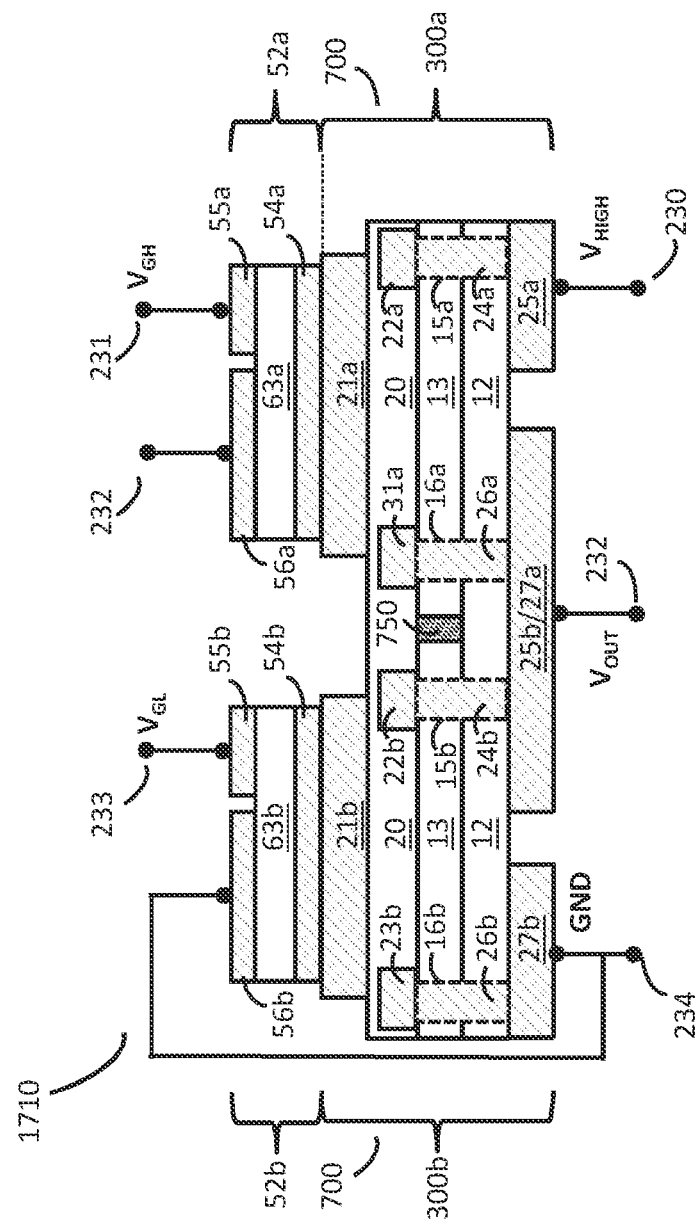

FIG. 17B shows a cross-sectional view of device 1710 which is similar to device 1700 of FIG. 17A, except with a simplified layout. Here, the gate backmetal 27*a* of the high-side switch can be integrated with the drain backmetal 25*b* of the low-side switch into a single backmetal layer (25*b*/27*a*). This single backmetal layer 25*b*/27*a* can be configured to be connected to the output terminal 232 of the half-bridge.

Figure 17C:
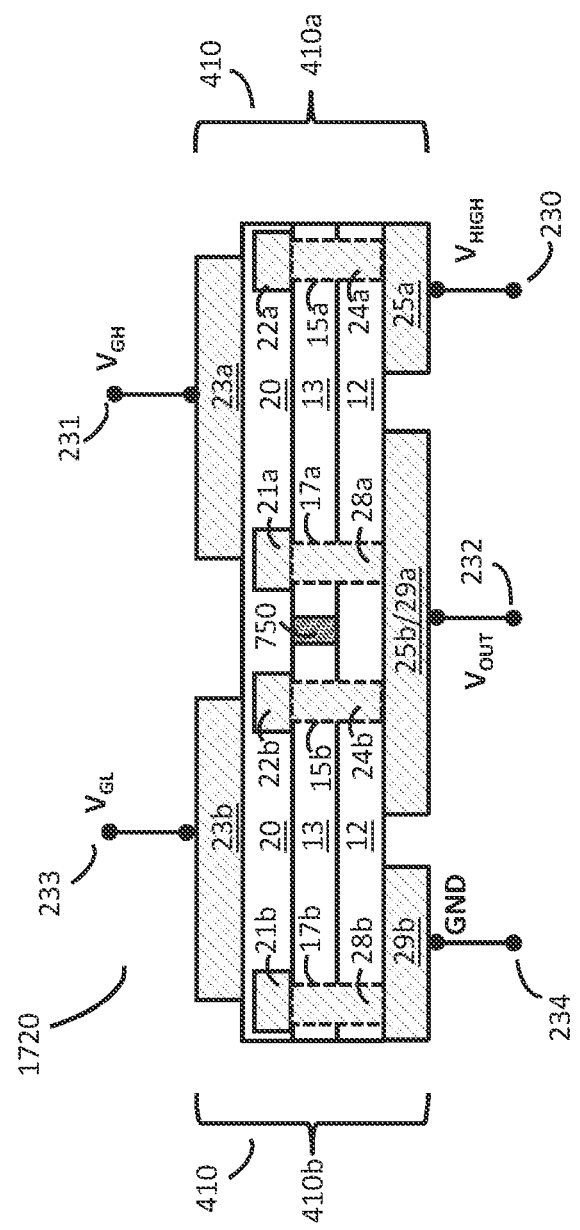

FIG. 17C shows a cross-sectional view of device 1720 which includes an enhancement-mode high-side switch (such as switch 410) and an enhancement-mode low-side switch (such as switch 410) configured to form a half-bridge circuit (such as circuit 1000 of FIG. 10) which is integrated with a single common insulating substrate 12, similar to device 1700 of FIG. 7A. Here, the source backmetal 29*a* of the high-side switch can be integrated with the drain backmetal 25*b* of the low-side switch into a single backmetal layer (29*b*/27*a*). This single backmetal layer 29*b*/27*a* can be configured to be connected to the output terminal 232 of the half-bridge.

Figure 17D:
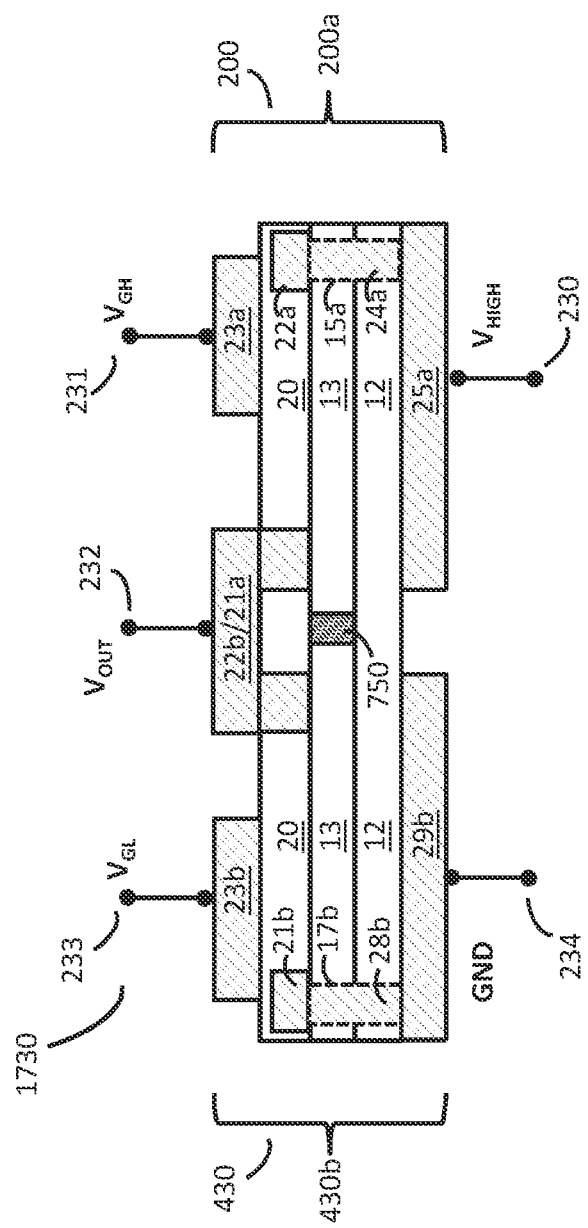

FIG. 17D shows a cross-sectional view of device 1730 which includes an enhancement-mode high-side switch (such as switch 200) and an enhancement-mode low-side switch (such as switch 430) configured to form a half-bridge circuit (such as circuit 1000 of FIG. 10) which is integrated with a single common insulating substrate 12, similar to device 1700 of FIG. 7A. Here, the source contact 21*a* of the high-side switch can be integrated with the drain contact 22*b* of the low-side switch into a single contact layer (22*b*/21*a*) on a side of device 1730 which is opposite the substrate. This single contact layer 22*b*/21*a* can be configured to be connected to the output terminal 232 of the half-bridge.

Figure 17E:
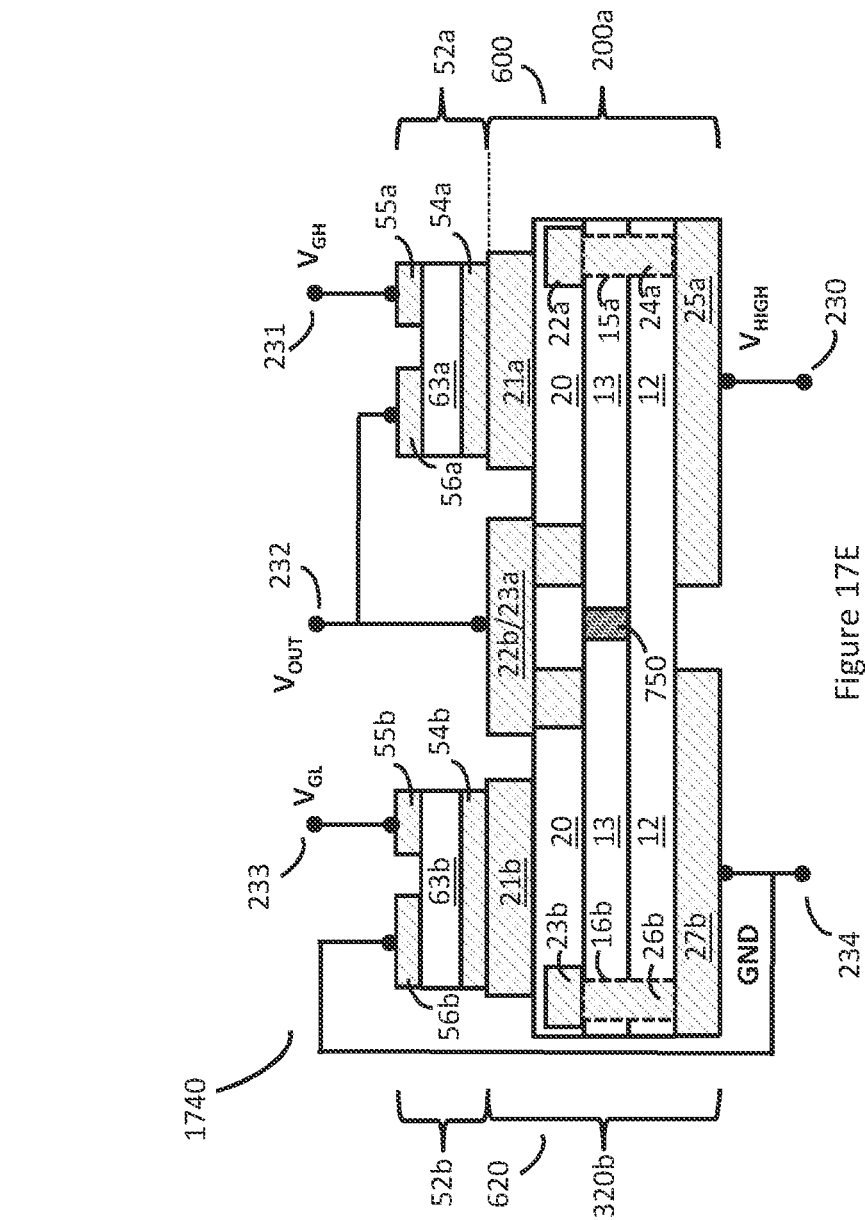

FIG. 17E shows a cross-sectional view of device 1740 which includes a cascode high-side switch (such as switch 600) and a cascode low-side switch (such as switch 620) configured to form a half bridge circuit (such as circuit 1000 of FIG. 10) which is integrated with a single common insulating substrate 12, similar to device 1700 of FIG. 7A. Here, the gate contact 23*a* of the high-side switch can be integrated with the drain contact 22*b* of the low-side switch into a single contact layer (22*b*/23*a*) on a side of device 1740 which is opposite the substrate. This single contact layer 22*b*/23*a* can be configured to be connected to the output terminal 232 of the half-bridge.

Figure 17F:
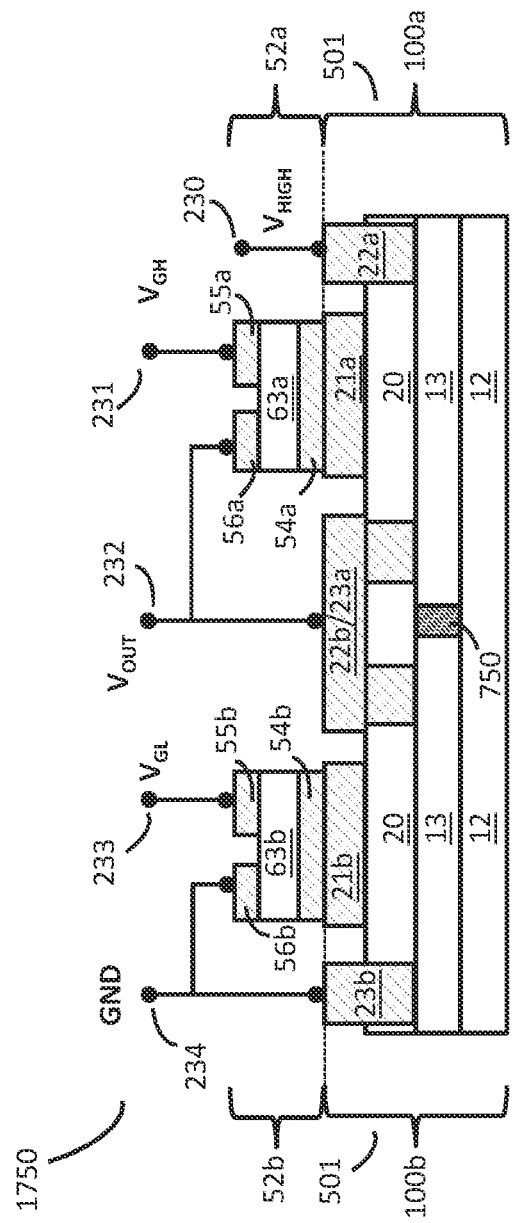

FIG. 17F shows a cross-sectional view of device 1750 which includes a cascode high-side switch (such as switch 502) and a cascode low-side switch (such as switch 502) configured to form a half bridge circuit (such as circuit 1000 of FIG. 10) which is integrated with a single common insulating substrate 12, similar to device 1700 of FIG. 17A. Here, the gate contact 23a of the high-side switch can be integrated with the drain contact 22b of the low-side switch into a single contact layer (22b/23a) on a side of device 1750 which is opposite the substrate. This single contact layer 22b/23a can be configured to be connected to the output terminal 232 of the half-bridge. As seen in FIG. 17F, the integrated circuit of device 1750 is formed without the use of a TV, such that all of the device terminals are formed on the same side III-N material structure 13 opposite the substrate.

FIG. 17G shows a cross-sectional view of device 1760 which includes an E-mode high-side switch (such as switch 100 of the prior-art) and an E-mode low-side switch (such as switch 100 of the prior-art) configured to form a half bridge circuit (such as circuit 1000 of FIG. 10) which is integrated with a single common insulating substrate 12, similar to device 1700 of FIG. 17A. Here, the source contact 21a of the high-side switch can be integrated with the drain contact 22b of the low-side switch into a single contact layer (22b/21a) on a side of device 1760 which is opposite the substrate. This single contact layer 22b/21a can be configured to be connected to the output terminal 232 of the half-bridge. As seen in FIG. 17G, the integrated circuit of device 1760 is formed without the use of a TSV, such that all of the device terminals are formed on a side III-N material structure 13 opposite the substrate.

Figure 18A:
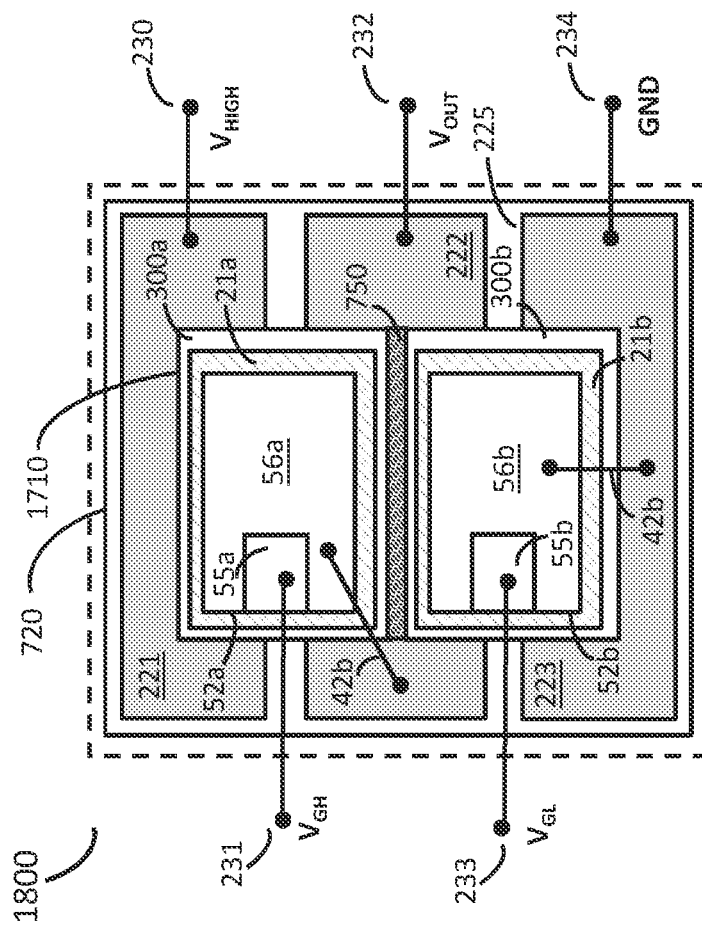
FIGS. 18A-18E are plan views of electronic modules featuring a half bridge with integrated III-N devices on a common substrate.

The IC device 1700-1760 shown in FIGS. 17A-17F can be integrated into electronic component packaging, such as an electronic module. FIG. 18A shows a plan view of an electronic module 1800 which includes device 1710 of FIG. 17B integrated on DBC 720. The configuration of device 1710 in module 1800 can be similar to those described in module 1200 of FIG. 12A. However, due to the integrated configuration of the high-side switch and the low-side switch of device 1710 on a single common substrate, the overall size of module 1800 can be greatly reduced compared to module 1200. This can reduce switching inductance and improve circuit performance.

Figure 18B:
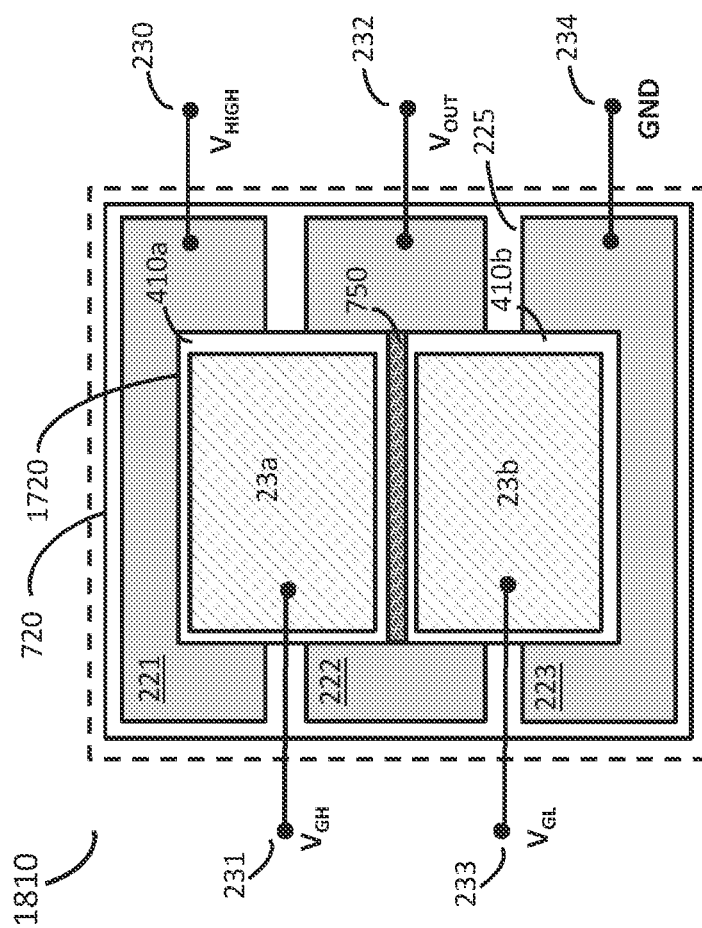

FIG. 18B shows a plan view of an electronic module 1810 which includes device 1720 of FIG. 17C integrated on DBC 720. The configuration of device 1720 in module 1810 can be similar to those described in module 1210 of FIG. 12B. However, due to the integrated configuration of the high-side switch and the low-side switch of device 1720 on a single common substrate, the overall size of module 1810 can be greatly reduced compared to module 1210. This can reduce switching inductance and improve circuit performance.

Figure 18C:
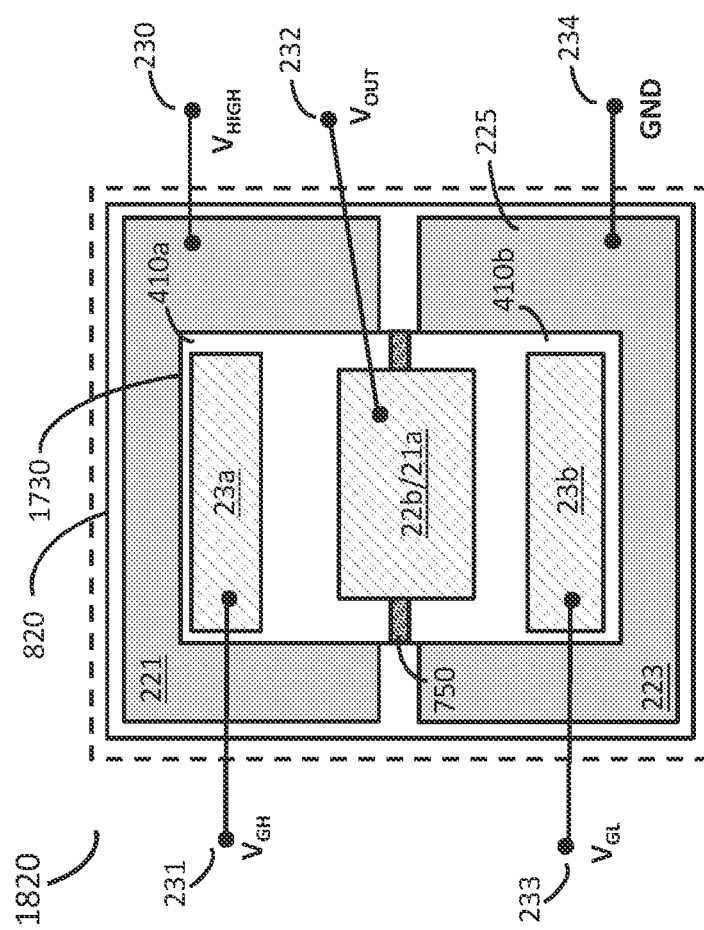

FIG. 18C shows a plan view of an electronic module 1820 which includes device 1730 of FIG. 17D integrated on DBC 820. The configuration of device 1730 in module 1820 can be similar to those described in module 1410 of FIG. 14B, except that the output plate 222 of module 140 can be omitted in module 1820. Instead the single contact layer 22b/21a of device 1730 can be configured to connect to the output terminal 232 with a wire-bond, copper clip, or other suitable method. Due to the integrated configuration of the high-side switch and the low-side switch of device 1730 on a single common substrate, the overall size of module 1820 can be greatly reduced compared to module 1410. This can reduce switching inductance and improve circuit performance.

Figure 18D:
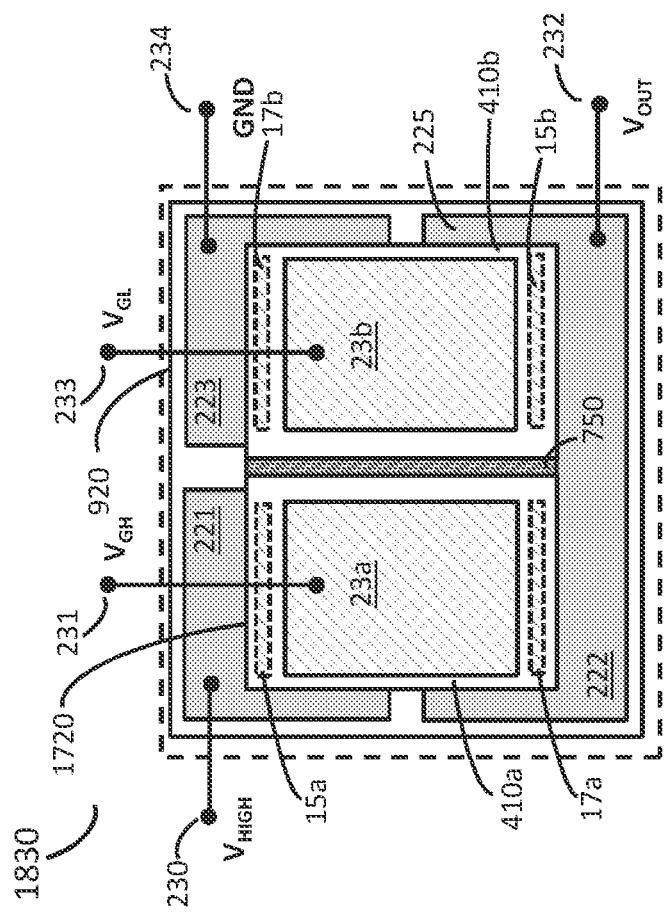

FIG. 18D shows a plan view of an electronic module 1830 which includes the enhancement-mode device 1720 of FIG. 17C integrated on DBC 920. The configuration of device 1720 in module 1830 is similar to device 1720 integrated into module 1810 of FIG. 18B, except that the DBC 920 of module 1830 is configured for a more compact layout compared to module 1810. As seen in FIG. 18D, the high-voltage plate 221 and the ground plate 223 are configured to be on a first side of the module 1830, and the output plate 222 is configured to be on a second side of the module. Connections and like numbered features can be configured in a similar manner as those previously described. The DBC 920 layout of module 1830 can results in an overall module size which is greatly reduced compared to the module 1810 of FIG. 18B. This can reduce switching inductance and improve circuit performance.

Figure 18E:
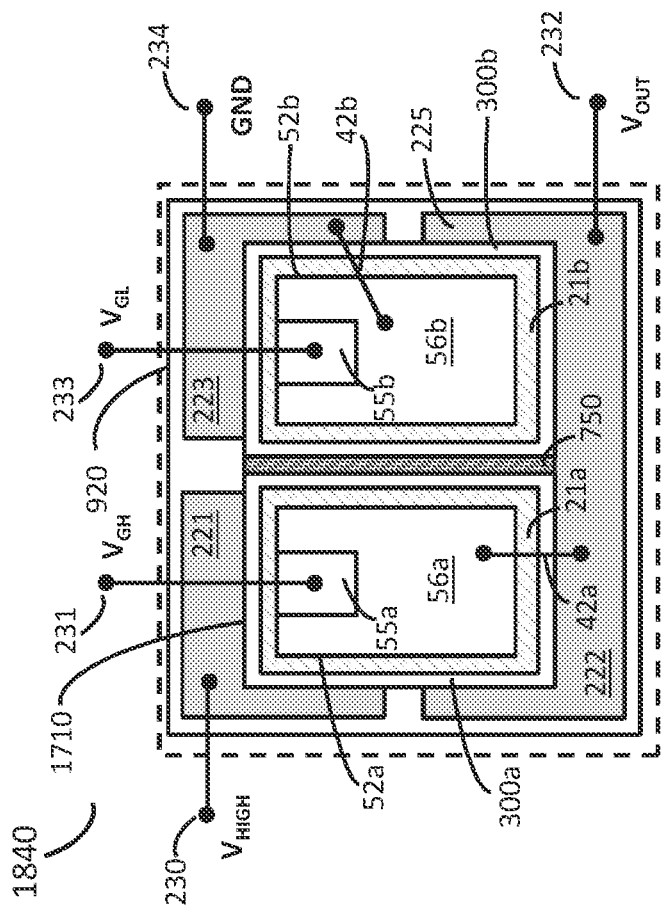

FIG. 18E shows a plan view of an electronic module 1840 which includes the cascode device 1710 of FIG. 17B integrated on DBC 920. The configuration of device 1710 in module 1840 is similar to device 171 integrated into module 1800 of FIG. 18A, except that the DBC 920 of module 1840 is configured for a more compact layout compared to module 1800. As seen in FIG. 18E, the high-voltage plate 221 and the ground plate 223 are configured to be on a first side of the module 1830, and the output plate 222 is configured to be on a second side of the module. Connections and like numbered features can be configured in a similar manner as those previously described. The DBC 920 layout of module 1830 can results in an overall module size which is greatly reduced compared to the module 1800 of FIG. 18A. This can reduce switching inductance and improve circuit performance.

Figure 19:
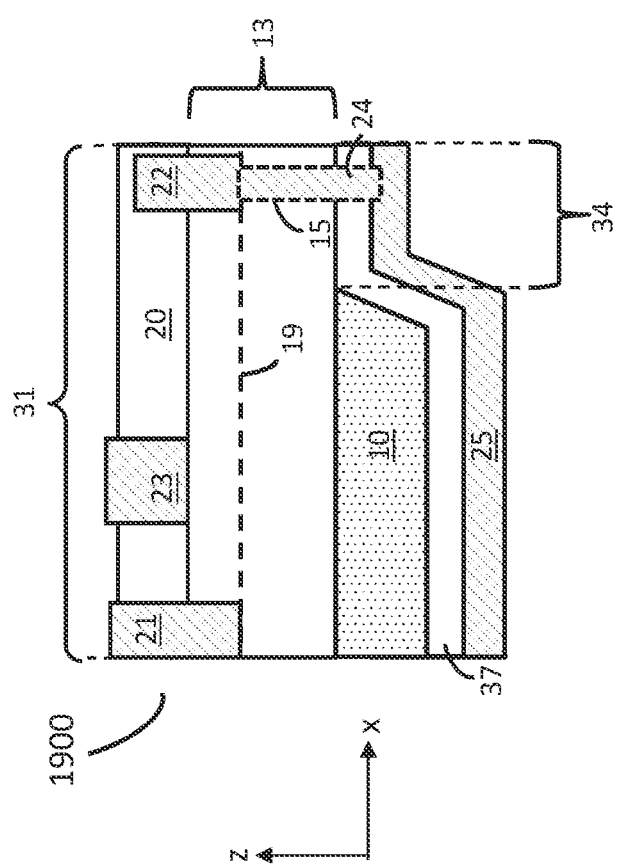
FIG. 19 is a cross-sectional view of a III-N device with a drain connected through-epi via on a conductive substrate.

Many of the devices and configurations previously described herein have been fabricated on insulating substrates, such as sapphire, in order to allow the fabrication of backside device terminals (e.g. a drain terminal on a side of the substrate which is opposite from the III-N material structure) on lateral III-N devices where all of the device electrodes (i.e. source contact, drain contact, and gate contact) are formed on the same side of the III-N material structure (opposite the substrate). However, if the substrate is physically removed or etched away in a portion of the device where the backside device terminal is formed, a conducting or semi-conducting substrate such as silicon or silicon carbide can be used. FIG. 19 shows a device 1900 which is similar to device 200 of FIG. 2, except that device 1900 is fabricated on a silicon substrate 10. The device 1900 could be used in place of device 200 in any of the modules or integrated circuits discussed above. The substrate 10 is removed in region 34 which is at least below the drain contact 22 and optionally into the active region 31. Backside insulator 37 is conformally formed over the back side of the substrate and the etched sidewall and well as over the backside of the III-N material structure 13 where the substrate 10 has been removed in region 34. Drain backmetal 25 is then deposited conformally over the backside insulator 37. Metal 24 which is formed inside the drain via 15 and electrically connected to drain contact 22 is connected to the drain backmetal 25, as seen in FIG. 19. Backside insulator 37 passivates the silicon substrate 10 and electrically isolates drain backmetal 25 from the substrate. Backside insulator 37 can be, for example, SiN or insulator 37 can be a combination of materials, such as SiN, SiON or polyimide. Although FIG. 19 shows the region 34 where the substrate 10 is removed to be within the active region 31, region 34 can also be formed outside the active region 31. Although FIG. 19 shows the drain contact 22 connected to the backmetal 25, other device electrodes (such as source contact 21 or gate contact 23) could be configured to be connected to the backside metallization in a similar manner as shown in FIG. 19.

A number of implementations have been described. Nevertheless, it will be understood that various modifications may be made without departing from the spirit and scope of the techniques and devices described herein. Accordingly, other implementations are within the scope of the following claims.

What is claimed is:

1. A semiconductor device, comprising:
   a III-N device comprising an insulating substrate, the insulating substrate comprising a first side and a second side;
   a III-N material structure on a first side of the insulating substrate, and a gate electrode, a source electrode, and a drain electrode on a side of the III-N material structure opposite the substrate;
   a backmetal layer on the second side of the insulating substrate; and
   a via-hole formed through the III-N material structure and the insulating substrate, wherein a metal formed in the via-hole is electrically connected to the drain electrode on the first side of the substrate and electrically connected to the backmetal layer on the second side of the substrate;
   wherein the device has a breakdown voltage greater than 600V and an on-resistance less than 15 mΩ.

2. The device of claim 1, wherein the substrate is a sapphire substrate.

3. The device of claim 1, wherein the III-N material structure comprises a III-N barrier layer, and a III-N channel layer; and a compositional difference between the III-N barrier layer and the III-N channel layer causes a lateral 2DEG channel to be induced in the III-N channel layer, and the drain electrode is electrically connected to the 2DEG.

4. The device of claim 3, wherein the device further comprises an active region between the source electrode and the drain electrode, and the via-hole is formed outside the active region.

5. The device of claim 1, wherein the backmetal layer is configured to be electrically coupled to a circuit high-voltage node.

6. A semiconductor device, comprising
   a III-N device comprising an insulating substrate, the insulating substrate comprising a first side and a second side;
   a III-N material structure on a first side of the insulating substrate, and a gate electrode, a source electrode, and a drain electrode on a side of the III-N material structure opposite the substrate;
   a backmetal layer on the second side of the insulating substrate;
   a via-hole formed through the III-N material structure and the insulating substrate, wherein a metal formed in the via-hole is electrically connected to the drain electrode on the first side of the substrate and electrically connected to the backmetal layer on the second side of the substrate; and
   a second via-hole formed through the III-N material structure and the insulating substrate, and a metal formed in the second via-hole is electrically connected to the gate electrode on the first side of the substrate and electrically connected to a second backmetal layer on the second side of the substrate.

7. The device of claim 6, wherein a separation between the backmetal layer and the second backmetal layer is greater than 10 μm.

8. A semiconductor device, comprising
   a III-N device comprising an insulating substrate, the insulating substrate comprising a first side and a second side;
   a III-N material structure on a first side of the insulating substrate, and a gate electrode, a source electrode, and a drain electrode on a side of the III-N material structure opposite the substrate;
   a backmetal layer on the second side of the insulating substrate;
   a via-hole formed through the III-N material structure and the insulating substrate, wherein a metal formed in the via-hole is electrically connected to the drain electrode on the first side of the substrate and electrically connected to the backmetal layer on the second side of the substrate; and
   a second via-hole formed through the III-N material structure and the insulating substrate, and a metal formed in the second via-hole is electrically connected to the source electrode on the first side of the substrate and electrically connected to a second backmetal layer on the second side of the substrate.

9. The device of claim 8, wherein the device has a breakdown voltage greater than 600V and an on-resistance less than 15 mΩ.

10. The device of claim 8, wherein the substrate is a sapphire substrate.

11. The device of claim 8, wherein the III-N material structure comprises a III-N barrier layer, and a III-N channel layer; and a compositional difference between the III-N barrier layer and the III-N channel layer causes a lateral 2DEG channel to be induced in the III-N channel layer, and the drain electroide is electrically connected to the 2DEG.

12. An electronic component, comprising:
    an enhancement-mode transistor;
    a depletion-mode transistor comprising an insulating substrate and a backmetal layer; and
    a package comprising a conductive structural package base, the package enclosing both the enhancement-mode transistor and the depletion-mode transistor;
    wherein a gate electrode of the enhancement-mode transistor is electrically connected to a gate terminal of the package, a source electrode of the enhancement-mode transistor is electrically connected to a source terminal of the package, and the gate electrode of the depletion-mode transistor is electrically connected to the source terminal of the package;
    wherein a drain electrode of the depletion-mode transistor directly contacts and is electrically connected to the backmetal layer, the backmetal layer is directly contacting and electrically connected to the conductive structural package base, and the conductive structural package base is electrically connected to a drain terminal of the package.

13. The electronic component of claim 12, wherein the drain electrode of the depletion-mode transistor is electrically connected to the drain terminal of the package without an external drain wire connector.

14. The electronic component of claim 13, wherein the depletion-mode transistor comprises a III-N material structure over the insulating substrate.

15. The electronic component of claim 14, wherein the drain electrode of the depletion-mode transistor is on an opposite side of the III-N material structure from the insulating substrate, the III-N material structure includes a via that extends through the insulating substrate, and the drain electrode of the depletion-mode transistor is electrically connected to the conductive structural package base through the via.

16. The electronic component of claim 15, wherein the via is outside of an active region of the depletion-mode transistor.

17. The electronic component of claim 16, wherein a drain electrode of the enhancement-mode transistor is directly contacting and electrically connected to a source electrode of the depletion-mode transistor, and the enhancement-mode transistor is at least partially over the active region of the depletion-mode transistor.

18. A semiconductor device, comprising:
 a III-N device comprising an insulating substrate, the insulating substrate comprising a first side and a second side;
 a III-N material structure on a first side of the insulating substrate, and a gate electrode, a source electrode, and a drain electrode on a side of the III-N material structure opposite the substrate, and a dielectric layer over the III-N material structure, wherein the III-N material structure comprises a III-N barrier layer, and a III-N channel layer, and a compositional difference between the III-N barrier layer and the III-N channel layer causes a lateral 2DEG channel to be induced in the III-N channel layer, and the drain electrode is electrically connected to the 2DEG;
 a backmetal layer on the second side of the insulating substrate, wherein the backmetal layer is configured to be electrically coupled to a ground; and
 a via-hole formed through the III-N material structure and the insulating substrate, wherein a metal formed in the via-hole is electrically connected to the source electrode on the first side of the substrate and electrically connected to the backmetal layer on the second side of the substrate and the source electrode is fully encapsulated in the dielectric layer on the first side of the substrate.

19. An electronic module, comprising:
 a base substrate comprising an insulating layer between a first metal layer and a second metal layer, the first metal layer including a first portion, a second portion, and a third portion, wherein a trench formed through the first metal layer electrically isolates the first, second and third portions of the first metal layer from one another;
 a high-side switch comprising an enhancement-mode transistor and a depletion-mode transistor, wherein the depletion-mode transistor comprises a III-N material structure on a first side of an insulating substrate and a backmetal layer on a second side opposite the first side;
 a via-hole is formed through the III-N material structure and the insulating substrate; and
 a low-side switch;
 wherein a source electrode of the enhancement-mode transistor is electrically connected to the second portion of the first metal layer, a drain electrode of the enhancement-mode transistor is electrically connected to a source electrode of the depletion-mode transistor, a gate electrode of the depletion-mode transistor is electrically connected to the second portion of the first metal layer, and a metal formed in the via-hole is electrically connected to the drain electrode of the depletion-mode transistor and electrically connected to the backmetal layer, and the backmetal layer is electrically connected and physically mounted to the first portion of the first metal layer.

20. The electronic module of claim 19, wherein the low-side switch comprises a second enhancement-mode transistor and a second depletion-mode transistor, the second depletion mode transistor comprising a second III-N material structure on a first side of a second insulating substrate and a second backmetal layer on a second side opposite the first side;
 a second via-hole is formed through the second III-N material structure and the second insulating substrate; wherein
 a drain electrode of the second depletion-mode transistor is electrically connected to the second portion of the first metal layer;
 a source electrode of the second enhancement-mode transistor is connected to a third portion of the first metal layer;
 a drain electrode of the second enhancement-mode transistor is electrically connected to a source electrode of the second depletion-mode transistor;
 a gate electrode of the second depletion-mode transistor is electrically connected to the third portion of the first metal layer; and
 a metal formed in the second via-hole is electrically connected to the drain electrode of the second depletion-mode transistor and electrically connected to the second backmetal layer, and the second backmetal layer is electrically connected and physically mounted to the second portion of the first metal layer.

21. The electronic module of claim 19, wherein the high-side switch and the low-side switch form a half bridge circuit.

22. The electronic module of claim 19, wherein the depletion-mode transistor is configured to be able to block at least 600V while the high-side switch is biased off and conduct current greater than 30 A while the high-side switch is biased on.

23. The electronic module of claim 19, further comprising a capacitor, wherein a first terminal of the capacitor is electrically connected to the first portion of the first metal layer and a second terminal of the capacitor is electrically connected to the third portion of the first metal layer.

24. The electronic module of claim 19, further comprising a package, wherein the base substrate, the high-side switch, and the low-side switch are encased within the package.

25. The electronic module of claim 19, wherein further comprising a second high-side switch connected in parallel to the high-side switch and a second low-side switch connected in parallel to the low-side switch.

26. The electronic module of claim 19, wherein the second portion of the first metal layer is connected to an output node of the electronic module.

27. The electronic module of claim 26, wherein the module is configured such that during operation, the first portion of the first metal layer is connected to a DC voltage supply and the third portion of the first metal layer is connected to a DC ground.

* * * * *